US012641770B2

(12) United States Patent
Lin et al.

(10) Patent No.: US 12,641,770 B2
(45) Date of Patent: May 26, 2026

(54) MEMORY DEVICE WITH BACK-GATE TRANSISTOR AND METHOD OF FORMING THE SAME

(71) Applicant: TAIWAN SEMICONDUCTOR MANUFACTURING COMPANY LTD., Hsinchu (TW)

(72) Inventors: Meng-Han Lin, Hsinchu (TW); Chia-En Huang, Hsinchu County (TW); Ya-Yun Cheng, Taichung (TW); Peng-Chun Liou, Tainan (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 744 days.

(21) Appl. No.: 17/829,324

(22) Filed: May 31, 2022

(65) Prior Publication Data

US 2023/0389283 A1    Nov. 30, 2023

(51) Int. Cl.
H10B 12/00    (2023.01)

(52) U.S. Cl.
CPC ......... H10B 12/312 (2023.02); H10B 12/033 (2023.02); H10B 12/05 (2023.02)

(58) Field of Classification Search
CPC ........... H10D 30/6757; H10D 30/6729; H10D 30/6732
See application file for complete search history.

(56) References Cited

U.S. PATENT DOCUMENTS

| 2012/0195104 A1* | 8/2012 | Takemura | ........... | G11C 11/4097 |
| | | | | 365/149 |
| 2014/0339549 A1* | 11/2014 | Yamazaki | .......... | H10D 30/6755 |
| | | | | 257/43 |

(Continued)

FOREIGN PATENT DOCUMENTS

| TW | 201904054 A | 1/2019 |
| TW | 202040821 A | 11/2020 |
| TW | 202217924 A | 5/2022 |

OTHER PUBLICATIONS

Office Action, Cited References and Search Report dated Nov. 22, 2023 issued by the Taiwan Intellectual Property Office for the Taiwan Counterpart Application No. 111149304.

(Continued)

*Primary Examiner* — Samuel A Gebremariam
*Assistant Examiner* — Jonas T Beardsley
(74) *Attorney, Agent, or Firm* — WPAT LAW; Anthony King

(57)    ABSTRACT

A method includes: forming an interconnect structure over a substrate, the forming of the interconnect structure includes forming a memory device including a transistor. The forming of the interconnect structure includes: forming a first metallization layer and a second metallization layer over the first metallization layer; forming a gate region of the transistor in at least one of the first and second metallization layers; etching a trench disposed in the second metallization layer and exposing the gate region; depositing a gate dielectric layer in the trench over the gate region; depositing a (Continued)

channel layer in the trench over the gate dielectric layer; and forming two source/drain regions of the transistor over the channel layer on opposite sides of the trench. At least one of the gate region and the channel layer includes two first segments extending in the trench, wherein the first segments are parallel with each other.

19 Claims, 59 Drawing Sheets

(56)                    References Cited

U.S. PATENT DOCUMENTS

| | | | |
|---|---|---|---|
| 2015/0028342 A1* | 1/2015 | Kim ..................... | H10D 86/441 |
| | | | 438/158 |
| 2016/0343746 A1* | 11/2016 | Xue .......................... | G03F 1/50 |
| 2019/0229182 A1 | 7/2019 | Wang et al. | |
| 2020/0098887 A1* | 3/2020 | Dewey ................... | H10D 84/83 |
| 2020/0227568 A1* | 7/2020 | Le .......................... | H10D 86/60 |

OTHER PUBLICATIONS

US 2022/0013356 A1 is the US counterpart of TW 202217924.
U.S. Pat. No. 11,094,811 B2 is the US counterpart of TW 202040821.
U.S. Pat. No. 10,629,748 B2 is the US counterpart of TW 201904054.

* cited by examiner 136, 134, 132, 106, 102

136A

142

144

104

104S

200

200

104

104

142

104

144

102

106

A

A

200T

200M 146
244
242
136
134
132
106
102

142

144

104

200

104

104

104

A

A

146

142

104

144

102

106

200

102

104

500

102

B

B 104

104

104

122
136
134/184
132
116
112
106
102

500T

142

104

500

122
112
102

B 132 134 136

B 104

104

104

116
106

500

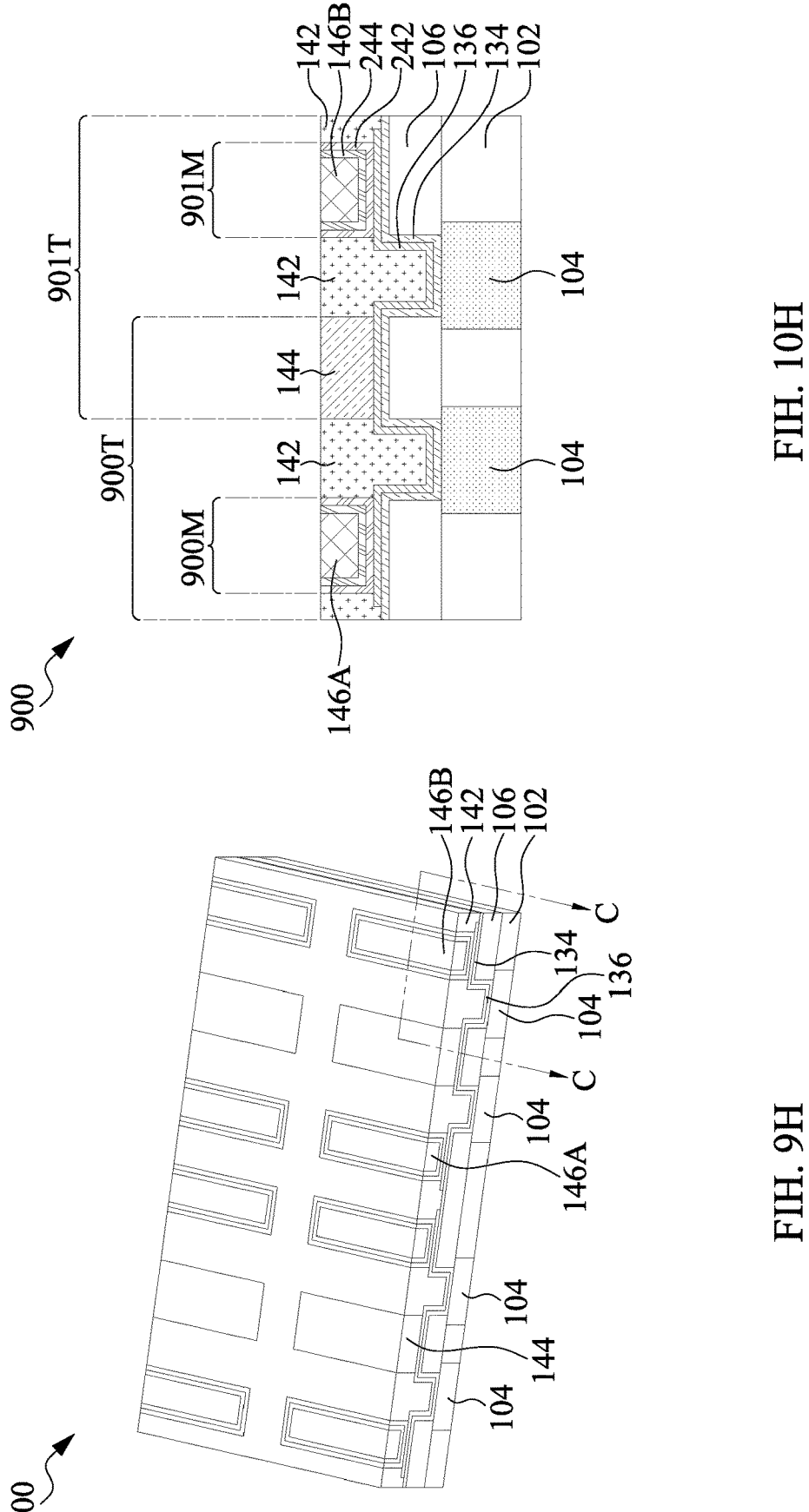
FIH. 10H
FIH. 9H

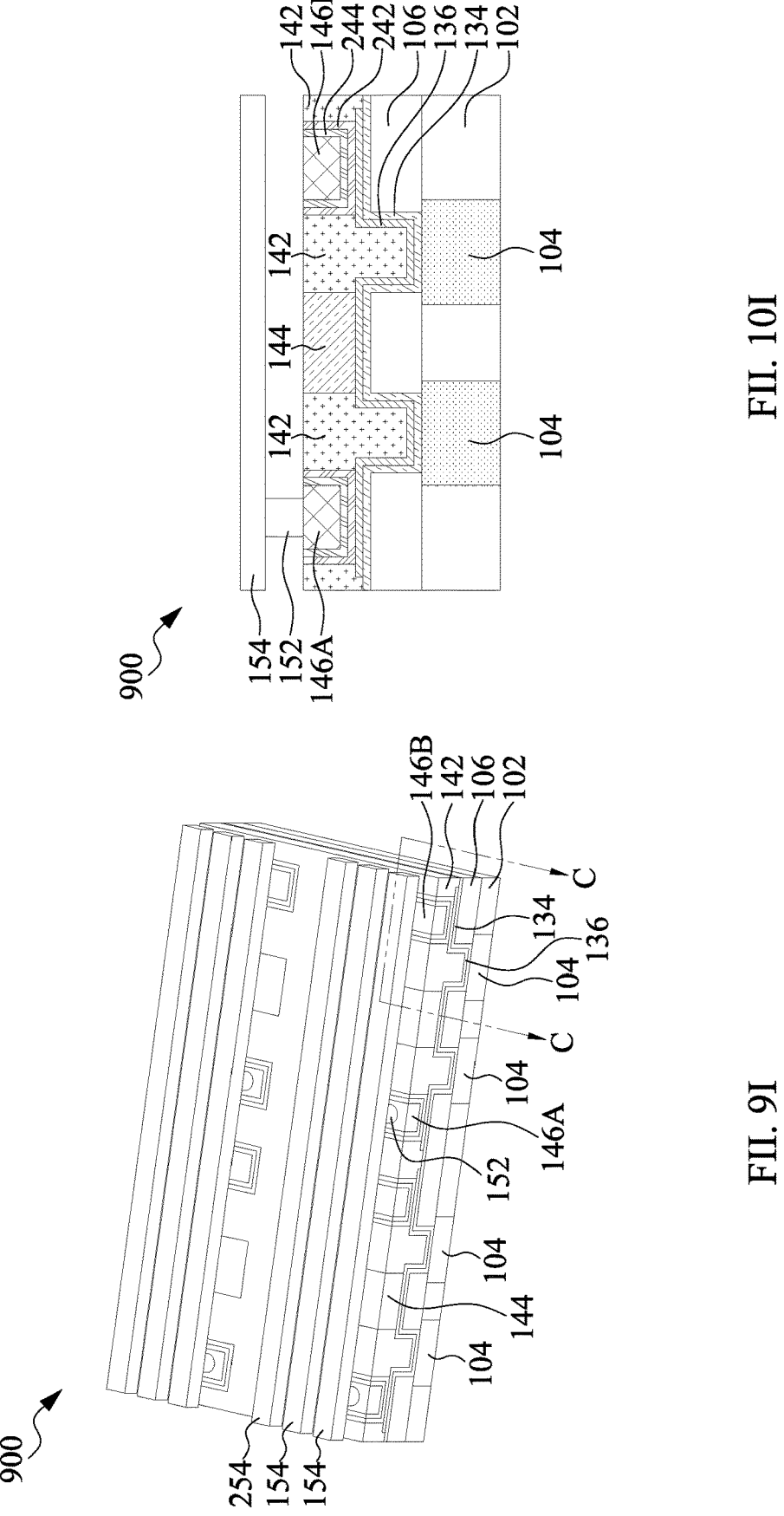
FII. 10I
FII. 9I 116
112
104-8
106
1202

1200

1200T

1204

116
112
106

1200

104 1202

D

D

112

336

236
134
106
102

104

1500

T5

112

134
106
102

104

1500

106

102

302

1700

1700

122A 122B 122A 122B 122A 146 242 136 184 144

146 242 136 184 144

106 102 302

104A 104B 104A 104A 104B 104A

1700

104A
184
136
236
123
122
236
136
184
104B

123

1700

104A
184
136
T10
123
122
T10
136
184
104B

123

MEMORY DEVICE WITH BACK-GATE TRANSISTOR AND METHOD OF FORMING THE SAME

BACKGROUND

Semiconductor memories are used in integrated Circuits for electronic applications, including radios, televisions, cell phones, and personal computing devices, as examples. Semiconductor memories include two major categories. One is volatile memories; the other is non-volatile memories. Volatile memories include random access memory (RAM), which can be further divided into two sub-categories, static random access memory (SRAM) and dynamic random access memory (DRAM). Both SRAM and DRAM are volatile because they will lose the information they store when they are not powered.

On the other hand, non-volatile memories can keep data stored on them after power is off. Examples of non-volatile memory may include magnetic random-access memory (MRAM), ferroelectric random-access memory (FeRAM) and resistive random-access memory (RRAM). Advantages of the non-volatile memory may include its fast write/read speed and small size.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion. Throughout the present disclosure, like numerals represent like features across different figures.

FIGS. 9A to 9I are perspective views of intermediate stages of a method of forming a memory device, in accordance with some embodiments of the present disclosure.

FIGS. 10A to 10I are cross-sectional views taken from the section line CC of the corresponding FIGS. 9A to 9I, in accordance with some embodiments of the present disclosure.

DETAILED DESCRIPTION

Figure 1:
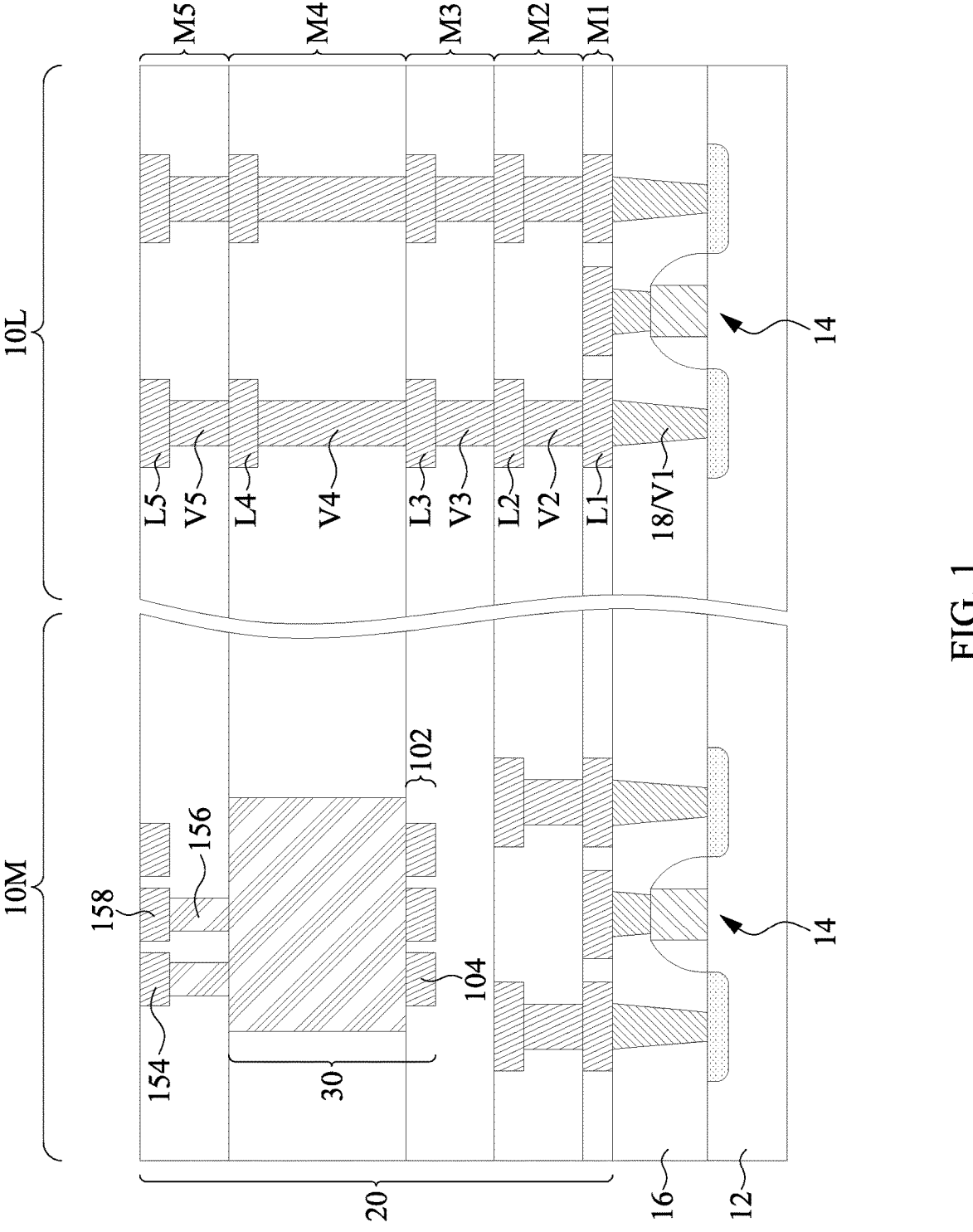
FIG. 1 is a cross-sectional view of a semiconductor device, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the deviation normally found in the respective testing measurements. Also, as used herein, the terms "about," "substantial" or "substantially" generally mean within 10%, 5%, 1% or 0.5% of a given value or range. Alternatively, the terms "about," "substantial" or "substantially" mean within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "about," "substantial" or "substantially." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

Embodiments of the present disclosure a memory device with a back-gate thin-film transistor and a method of forming the memory device. Modern semiconductor devices, for example, memory devices, are manufactured with higher density and more functionalities. The thin-film transistors of the memory may be formed in an interconnect structure using a back-end-of-line (BEOL) process to further reduce the device footprint. However, the ever-decreased device size may cause the device performance to deteriorate. For example, the short channel effect (SCE) may occur in a relatively short channel region given a reduced active region of the transistors. As a result, the advantages of the reduced device size may be compromised by the adverse effect resulting from the SCE. To address the abovementioned issue, the present disclosure proposes a memory device in which the effective channel length can be increased in the vertical direction. By help of the effective channel length, the overall performance of the transistor in the memory device can be improved while the device area can be kept within the desirable size to achieve higher device density.

FIG. 1 is a cross-sectional view of a semiconductor structure 10, in accordance with some embodiments of the present disclosure. The semiconductor structure 10 includes a logic region 10L and a memory region 10M. Memory devices (e.g., flash memories) are formed in the memory region 10M and logic devices (e.g., logic circuits) are formed in the logic region 10L. For example, a memory array 30 can be formed in the memory region 10M, and a row decoder (not separately shown) and a column decoder (not separately shown) can be formed in the logic region 10L. The memory region 10M can be disposed at an edge of the logic region 10L, or the logic region 10L can surround the memory region 10M.

The logic region 10L and the memory region 10M are formed over a same semiconductor substrate 12. The semiconductor substrate 12 may be silicon, doped or undoped, or an active layer of a semiconductor-on-insulator (SOI) substrate. The semiconductor substrate 12 may include other semiconductor materials, such as germanium; a compound semiconductor including silicon carbide, gallium arsenic, gallium phosphide, gallium nitride, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multilayered or gradient substrates, may also be used.

Semiconductor devices 14 are formed on the active surface of the semiconductor substrate 12 in the logic region 10L and/or the memory region 10M. The semiconductor devices 14 may be active devices or passive devices. For example, the electrical components may be transistors, diodes, capacitors, resistors, or the like, formed by any suitable formation method. The semiconductor devices 14 are interconnected to form the memory devices and logic devices of the semiconductor structure 10.

One or more inter-layer dielectric (ILD) layers 16 are formed on the semiconductor substrate 12, and electrically conductive features, such as contact plugs 18, are formed electrically connected to the semiconductor devices 14. The ILD layer 16 may be formed of any suitable dielectric material, for example, oxide, such as silicon oxide, phosphosilicate glass (PSG), borosilicate glass (BSG), boron-doped phosphosilicate glass (BPSG), or the like; nitride such as silicon nitride; or the like. The ILD layer 16 may be formed by any acceptable deposition process, such as spin coating, physical vapor deposition (PVD), chemical vapor deposition (CVD), the like, or a combination thereof. The electrically conductive features in the ILD layers 16 may be formed through any suitable process, such as deposition, damascene (e.g., single damascene, dual damascene, etc.), the like, or combinations thereof.

An interconnect structure 20 is formed over the semiconductor substrate 12. The interconnect structure 20 interconnects the semiconductor devices 14 to form integrated circuits in each of the logic region 10L and memory region 10M. The interconnect structure 20 includes multiple metallization layers M1-M5. Although five metallization layers are illustrated, it should be appreciated that more or less metallization layers may be included. Each of the metallization layers M1-M5 includes metallization patterns in dielectric layers. The metallization patterns are connected to the semiconductor devices 14 of the semiconductor substrate 12, and include, respectively, conductive lines L1-L5 and conductive vias V1-V5 formed in one or more inter-metal dielectric (IMD) layers. The interconnect structure 20 may formed by a damascene process, such as a single damascene process, a dual damascene process, or the like. In some embodiments, the contact plugs 18 are also part of the metallization patterns, such as part of the lowest layer of conductive vias V1.

In the depicted embodiment, a memory array 30 is formed in the interconnect structure 20. The memory array 30 can be formed in any of the metallization layers M1-M5, and is illustrated as being formed in an intermediate metallization layers M3-M4, although it could also be formed in lower metallization layers M1-M3 or upper metallization layers (e.g., metallization layer M5). The memory array 30 is electrically connected to the semiconductor devices 14. For example, a metallization layer overlying the memory array 30 may contain routing structures to exemplary conductive lines 154 and 158 in the metallization layer M5 of the memory array 30. Similarly, a metallization layer underlying the memory array 30 (e.g., the metallization layer M2) may contain interconnects to the word lines 104 of the memory array 30.

In some embodiments, the interconnect structure 20 may be formed by first forming the layers underlying the memory array 30, e.g., the metallization layers M1-M2. The memory array 30 can then be formed on the metallization layer M3, with a substrate 102 being an etch stop layer on the IMD layers of the metallization layer M3. After formation of the memory array 30, the remainder of the metallization layer M4 can be formed, such as by depositing and planarizing the IMD layers for the metallization layer M4, and then forming metal lines L4 and metal vias V4. The formation process for conductive vias 152, 156 and conductive lines 154, 158 can be repeated in the metallization layer M5. The layers overlying the memory array 30 can then be formed. In some embodiments, the memory array 30 is configured as ferroelectric random-access memory (FeRAM) array, ferroelectric field-effect transistor (FeFET) array, ferroelectric tunnel junction (FTJ) array, magnetic RAM (MRAM) array or resistive RAM (RAM) array in the metallization layer M4 and the substrate 102 of the metallization layer M3.

The memory array 30 may include multiple memory units arranged in an array, in which each memory unit is configured as a basic data storage unit for a write or read operation. The write or read operation of a typical memory unit may be controlled through three terminals, e.g., a word line, a source line and a bit line, as discussed above. In some embodiments, the memory unit of the memory array 30 is constructed as a thin film transistor structure, in which the word line 104, the source line 144 and the bit line 146 are electrically coupled to the gate terminal, a source terminal, and a drain terminal (the source terminal and drain terminal are collectively referred to herein as the source/drain regions), respectively. In some embodiments, the gate terminal, the source terminal and the drain terminal of the memory array are also referred to herein as (local) word line, (local) source line, and (local) bit line, respectively. As will be discussed in greater detail later, the gate terminal is formed in the lower metallization layer while the source terminal or the drain terminal is formed in the upper metallization layer of the semiconductor structure 10. As such, the gate terminal of the memory unit, which may be formed with a gate region, may also be referred to herein as a back gate. Accordingly, the thin-film transistor including the back gate as the gate terminal is referred to herein as a back-gate transistor, in which the word line 104 serves as the gate region of the transistor.

FIGS. 2A to 2E are perspective views of intermediate stages of a method of forming a memory device 200, in accordance with some embodiments of the present disclosure. FIGS. 3A to 3E are cross-sectional views of the memory device 200 taken from the section line AA of the corresponding FIGS. 2A to 2E, in accordance with some embodiments of the present disclosure. In some embodiments, the memory device 200 is representative of one of more memory units of the memory array 30 shown in FIG. 1. The cross-sectional views 3A to 3E illustrate an exemplary memory unit of the memory array 30. In some embodiments, the memory device 200 is RRAM, FeRAM, FeFET, FTJ, one-transistor one-capacitor (1T1C) dynamic RAM (DRAM), MRAM, or other suitable memory devices. As will be illustrated later, each memory unit is constructed by a control transistor and a data storage unit, in which the control transistor is used to control the read or write operation of the memory unit through appropriate biasing voltages on the gate region and source/drain regions. Alternatively, each memory unit is constructed by a combined transistor-type data storage unit, in which the gate dielectric layer of the control transistor is replaced with a data storage layer.

Figure 3A:
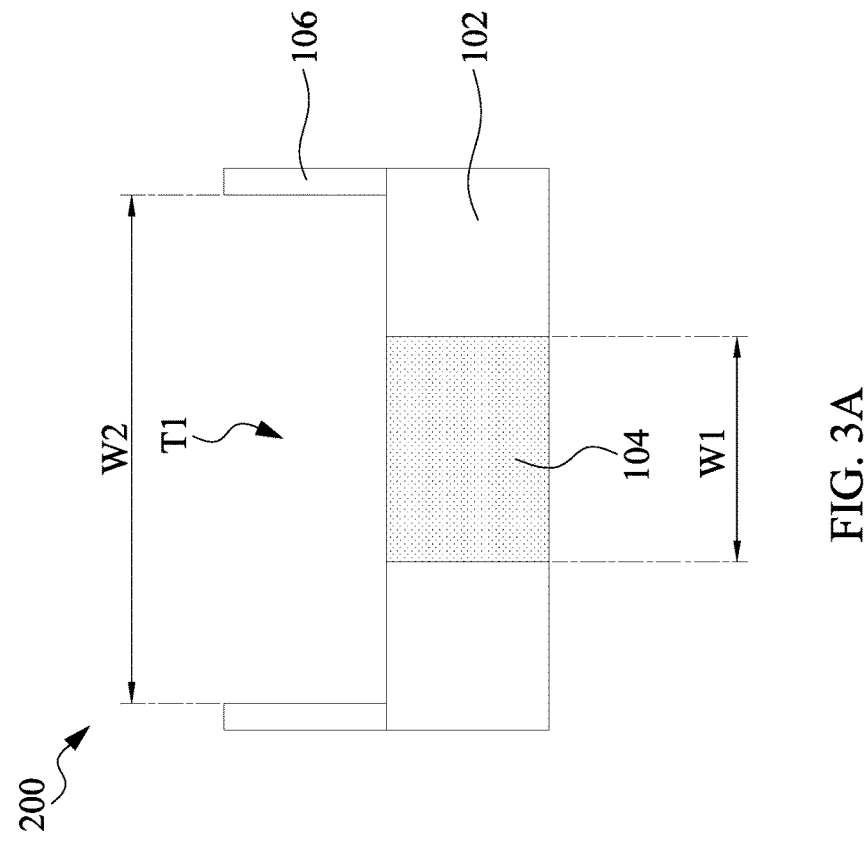
FIGS. 3A to 3E are cross-sectional views taken from the section line AA of the corresponding FIGS. 2A to 2E, in accordance with some embodiments of the present disclosure.
Figure 2A:
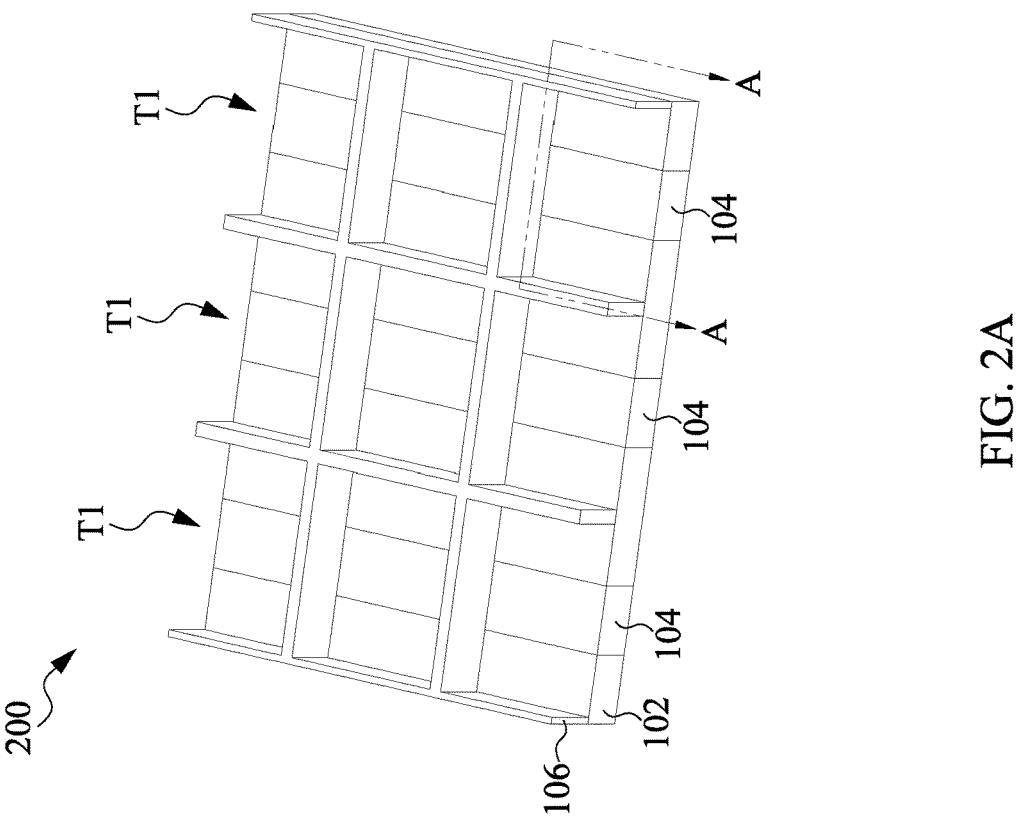
FIGS. 2A to 2E are perspective views of intermediate stages of a method of forming a memory device, in accordance with some embodiments of the present disclosure.

Referring to FIGS. 2A and 3A, a substrate 102 is formed in a bottom metallization layer, e.g., the metallization layer M3 shown in FIG. 1. The substrate 102 may be formed of a dielectric material, e.g., silicon nitride, silicon oxide, silicon oxynitride, or other suitable dielectric materials, formed as an IMD material of the bottom metallization layer. The substrate 102 may be formed using chemical vapor deposition (CVD), physical vapor deposition (PVD), atomic layer deposition (ALD), spin coating, or other suitable deposition methods. The substrate 102 is patterned to form trenches (not separately shown) using, e.g., lithography and etching operations. The etching operation may be performed using a dry etch, a wet etch, a reactive ion etch (RIE), or the like. The trenches are filled with a conductive material to form word lines 104. The conductive material of the word lines 104 may include doped polysilicon, tantalum, tantalum nitride, titanium, titanium nitride, tungsten, aluminum, or other suitable materials. Each of the word lines 104 is also referred to as the gate region of a control transistor 200T of each memory unit in the memory device 200.

A middle metallization layer is formed over the bottom metallization layer where the substrate 102 resides. In some embodiments, an isolation layer 106 is formed over the substrate 102 and the word lines 104. The isolation layer 106 is formed as a dielectric layer, and may include a dielectric material such as silicon nitride, silicon oxide, silicon oxynitride, or other suitable dielectric materials. In some embodiments, the substrate 102 and the isolation layer 106 include different materials, and are selective to each other with respect to an etchant. The isolation layer 106 is patterned to form trenches T1. Portions of the word lines 104 are exposed accordingly. The trenches T1 may have a width W2 greater than a width W1 of the word line 104. The patterning of the isolation layer 106 includes lithography and etching operations. The etching operation may be performed using a dry etch, a wet etch, an RIE, or the like.

Figure 3B:
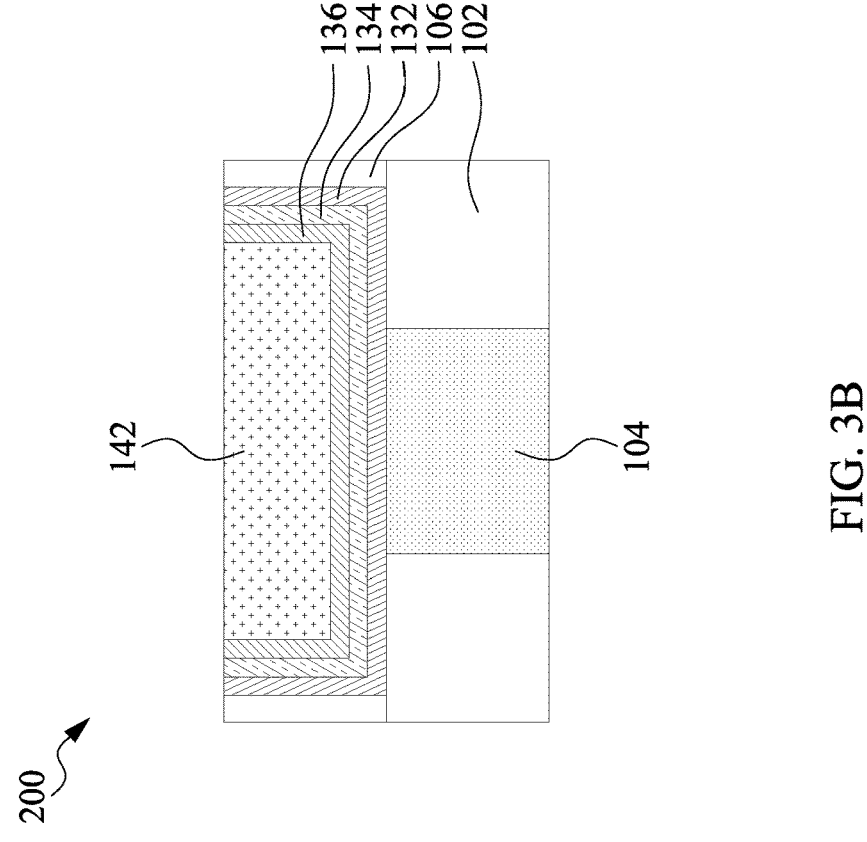
Figure 2B:
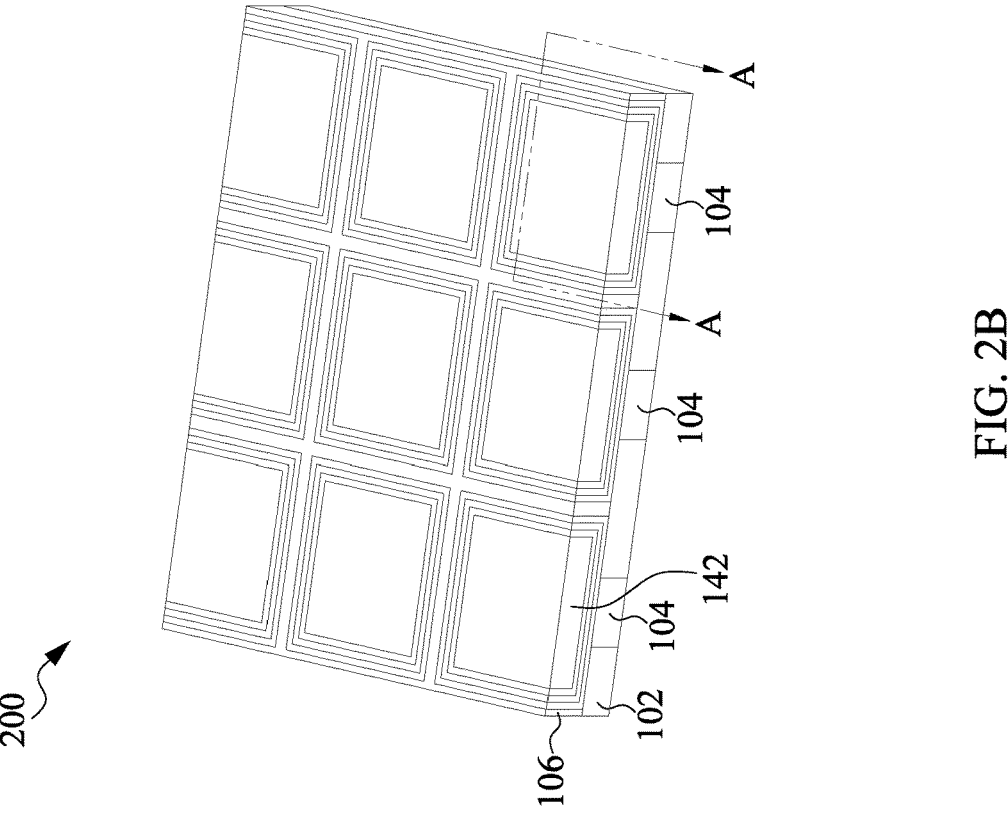

Referring to FIGS. 2B and 3B, a conductive layer 132 is deposited in the trenches T1. The conductive layer 132 may be deposited on the bottom surface and sidewall of each of the trenches T1. The material of the conductive layer 132 may be similar to the word line 104, e.g., doped polysilicon, tantalum, tantalum nitride, titanium, titanium nitride, tungsten, aluminum, or may be different from the word line 104, e.g., including work function adjustment metal. In some embodiments, the work function adjustment metal includes Ti, Ag, Al, TiAl, TiAlN, TiAlC, TaC, TaCN, TaSiN, TaAlC, Mn, Zr, TiN, WN, TaN, Ru, Co, a combination thereof, or the like. In some embodiments, the conductive layer 132 is referred to as a portion of the word line 104 or the gate region.

A gate dielectric layer 134 is deposited in the trench T1 over the conductive layer 132. The gate dielectric layer 134 may include silicon nitride, silicon oxide, silicon oxynitride, aluminum oxide, or a high-k dielectric material, e.g., zirconium dioxide ($ZrO_2$), aluminum oxide ($Al_2O_3$), hafnium oxide (HfOx), hafnium silicate (HfSiOx), zirconium titanate (ZrTiOx), tantalum oxide (TaOx), or the like.

A channel layer 136 is formed in the trenches T1 over the gate dielectric layer 134. The channel layer 136 is configured as a channel of a control transistor of the memory device 200 and may include an oxide semiconductor material, e.g., IGZO, ZnO, $In_2O_3$, $SnO_2$, NiO, $Cu_2O$, $CuAlO_2$, $CuGaO_2$, $CuInO_2$, $SrCu_2O_2$, SnO, or other suitable material.

In some embodiments, the channel layer 136 is doped with N-type dopants, e.g., arsenic and phosphor, or P-type dopants, e.g., boron.

The conductive layer 132, the gate dielectric layer 134 and the channel layer 136 may be formed in a conformal manner with substantially equal thicknesses on the bottom surface and sidewalk of the trenches T1 using CVD, ALD, or other suitable deposition methods. In some embodiments, the gate dielectric layer 134 and the channel layer 136 are referred to as the gate dielectric layer and the channel, respectively, of a control transistor 200T of each memory unit in the memory device 200.

Another isolation region 142 is deposited in the trenches T1 to fill the trenches T1. The material and forming method of the isolation region 142 may be similar to those of the isolation layer 106 or the substrate 102. In some embodiments, a planarization operation, e.g., chemical mechanical polishing (CMP), is performed to remove the excess material of the isolation region 142 and level the surface of the isolation layer 106 with the isolation region 142, the conductive layer 132, the gate dielectric layer 134 and the channel layer 136. Portions of the conductive layer 132, the gate dielectric layer 134 and the channel layer 136 are exposed accordingly.

Figure 3C:
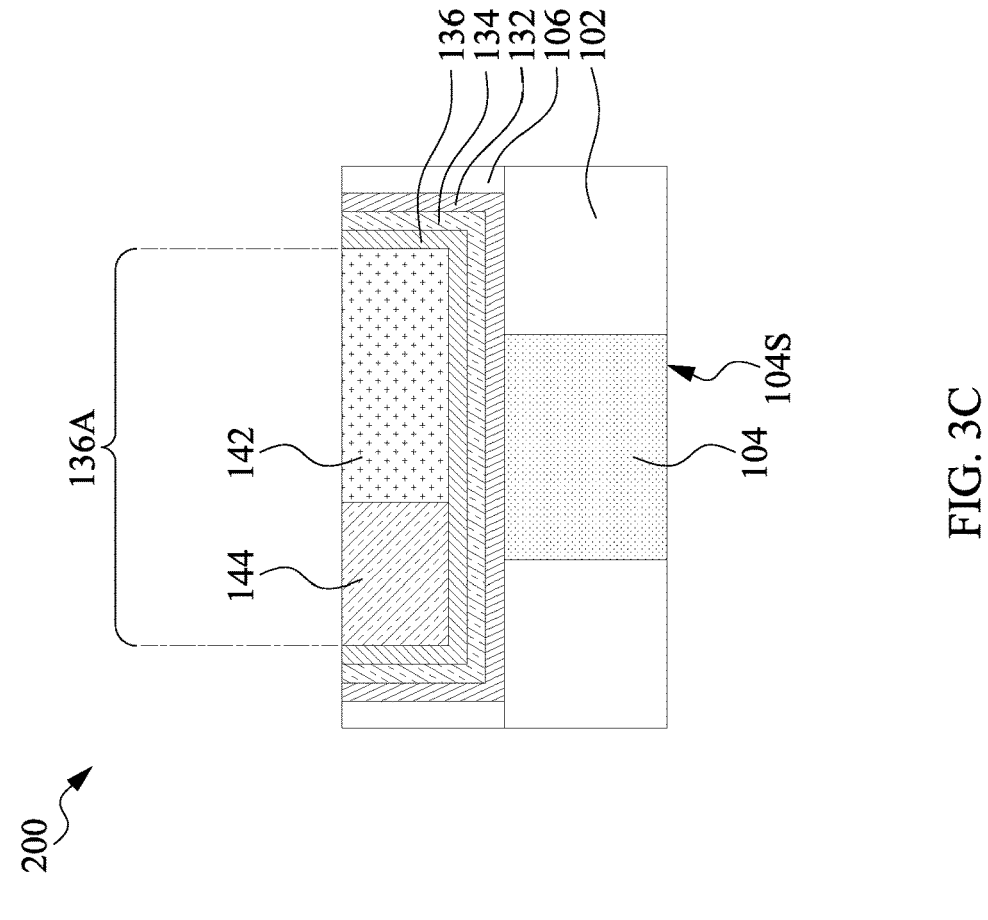
Figure 2C:
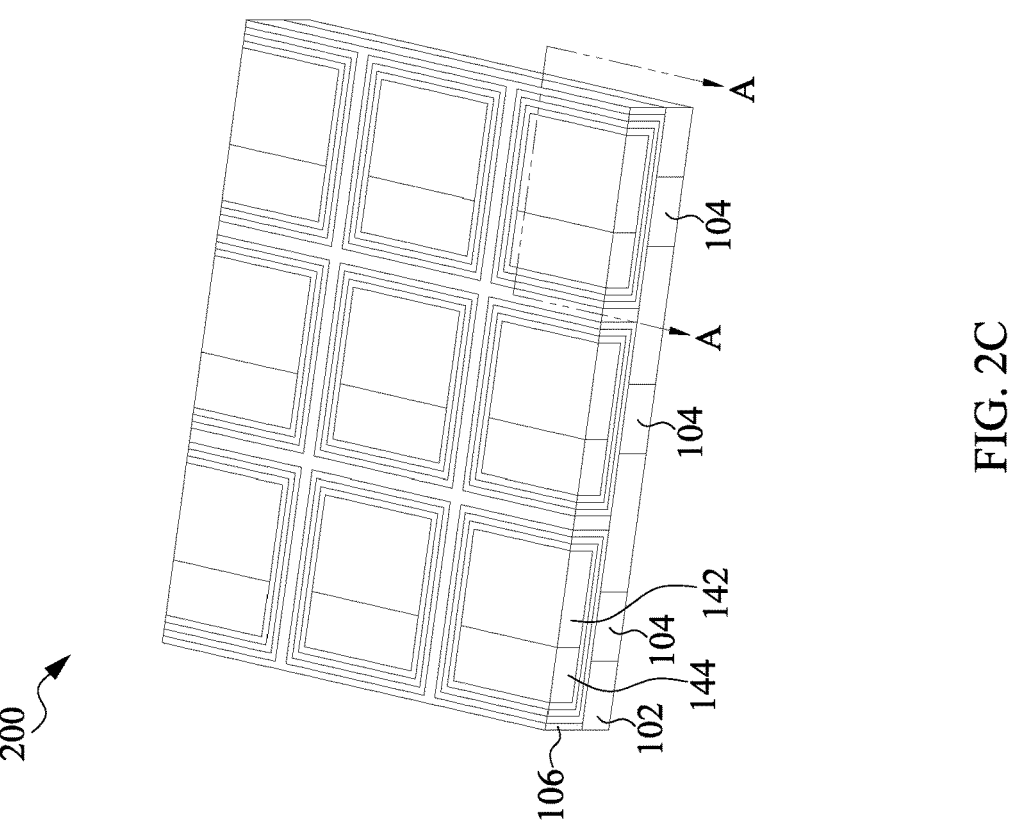

Referring to FIGS. 2C and 3C, the isolation region 142 is patterned to form trenches (not separately shown) using, e.g., lithography and etching operations. The etching operation may be performed using a dry etch, a wet etch, an (RIE), or the like. The trenches are filled with a conductive material to form source lines 144. The conductive material of the source lines 144 may include doped polysilicon, tantalum, tantalum nitride, titanium, titanium nitride, tungsten, aluminum, cobalt, copper, ruthenium, or other suitable materials. In some embodiments, a planarization operation, e.g., CMP, is performed to remove the excess material of the source lines 144 and level the surface of the isolation region 142 with the source lines 144. Each of the source lines 144 is also referred to as one of the source/drain regions of the control transistor 200T.

Figure 3D:
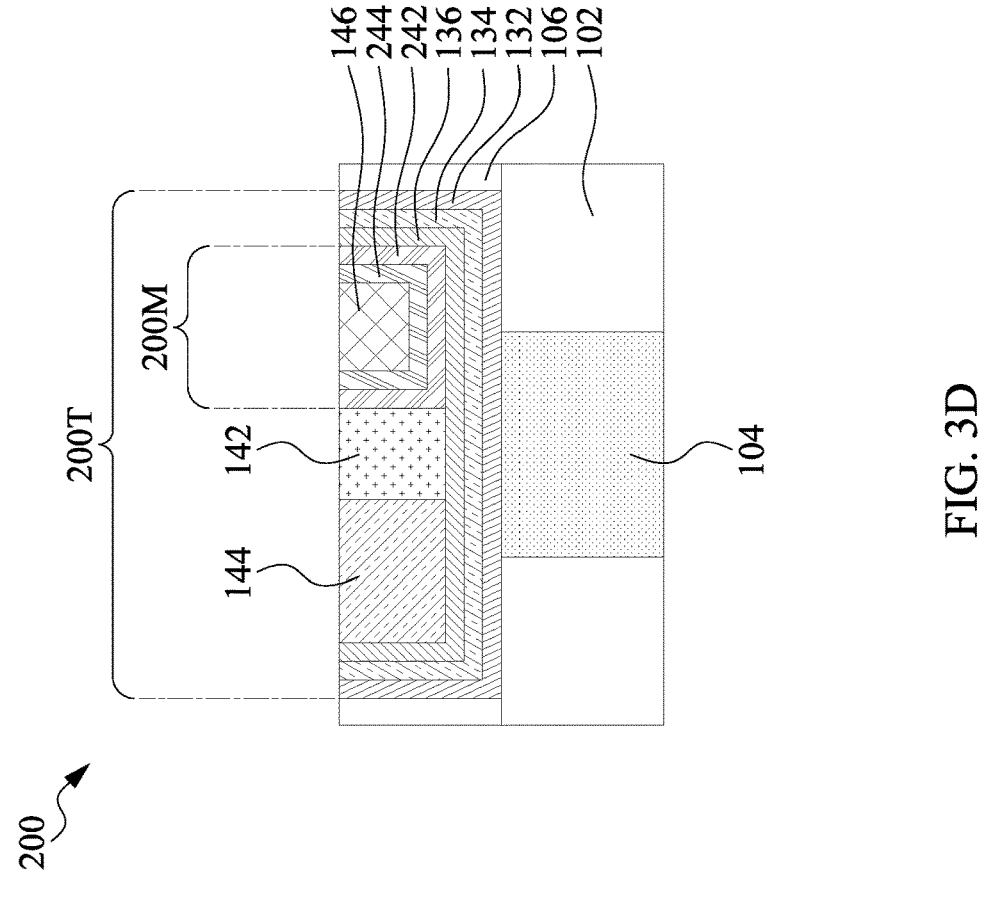
Figure 2D:
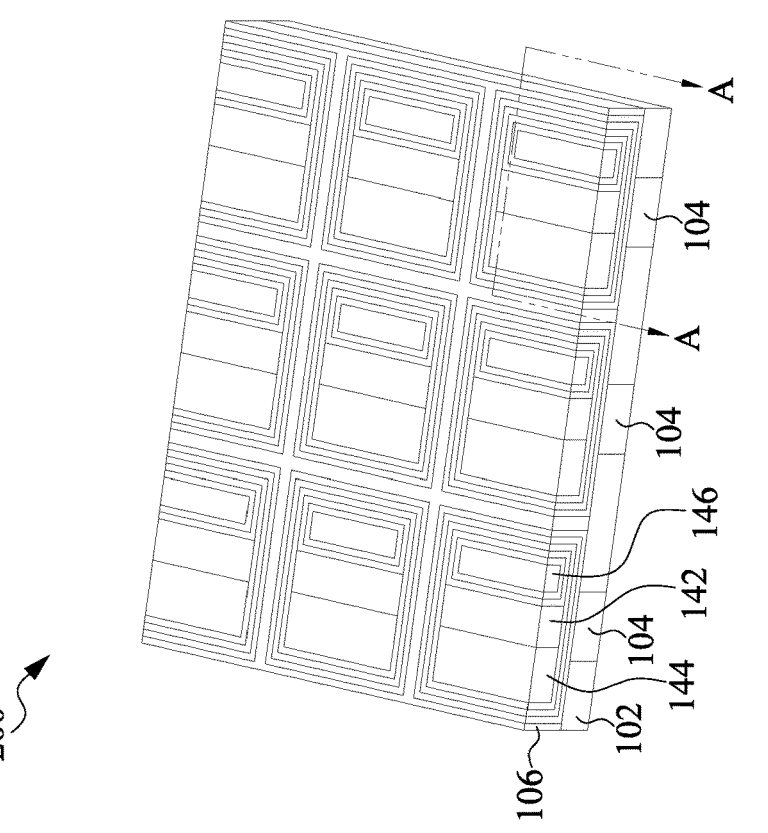

Referring to FIGS. 2D and 3D, the isolation region 142 is further patterned to form trenches (not separately shown) using, e.g., lithography and etching operations. The etching operation may be performed using a dry etch, a wet etch, an (RIE), or the like. The trenches are filled with a data storage unit 200M, e.g., RRAM, FeRAM, or FTJ, of the memory unit. The data storage unit 200M may include a conductive layer 242, a data storage layer 244 and a bit line 146. The conductive layer 242 may include platinum, aluminum copper, titanium, titanium nitride, gold, tantalum, tantalum nitride, tungsten, tungsten nitride, copper or combinations thereof. The material of the bit line 146 may be similar to the source line 133, e.g., doped polysilicon, tantalum, tantalum nitride, titanium, titanium nitride, tungsten, aluminum, cobalt, copper, ruthenium, or other suitable materials. The conductive layer 242 and the bit line 146 may be referred to as a bottom electrode and a top electrode of the data storage unit 200M, respectively.

The data storage layer 244 is configured to store data of the memory device 200. In some embodiments, the data storage layer 244 is a resistance variable layer in an RRAM. The resistance variable layer has a resistivity capable of switching between a high resistance state and a low resistance state (or conductive), by application of an electrical voltage. In various embodiments, the resistance variable layer includes at least one of dielectric materials comprising a high-k dielectric material, a binary metal oxide and a transition metal oxide. In some embodiments, the resistance variable layer includes nickel oxide, titanium oxide, hafnium oxide, zirconium oxide, zinc oxide, tungsten oxide, aluminum oxide, tantalum oxide, molybdenum oxide or copper oxide. Possible formation methods of the resistance variable layer include pulse laser deposition (PLD) or ALD, such as ALD with a precursor containing zirconium and oxygen.

In some embodiments, the data storage layer 244 is a ferroelectric layer for a FeFET, FeRAM or FTJ. The ferroelectric layer may include ferroelectric materials such as hafnium (Hf) oxide with dopants of varying percentages. The dopants may include semiconductor materials, such as silicon (Si), or metallic materials, such as zirconium (Zr), gadolinium (Gd), aluminum (Al), yttrium (Y), strontium (Sr), lanthanum (La), or the like.

In some embodiments, the data storage layer 244 is a composite magnetic tunnel junction (MTJ) structure for an MRAM memory device. The MTJ may include ferromagnetic layers, MTJ spacers, and a capping layer. The capping layer is formed on the ferromagnetic layer. Each of the ferromagnetic layers may include ferromagnetic material, which may be metal or metal alloy, for example, Fe, Co, Ni, CoFeB, FeB, CoFe, FePt, FePd, CoPt, CoPd, CoNi, TbFeCo, CrNi or the like. The MTJ spacer may include non-ferromagnetic metal, for example, Ag, Au, Cu, Ta, W, Mn, Pt, Pd, V, Cr, Nb, Mo, Tc, Ru or the like. In some embodiments, the MTJ structure includes a multilayer structure, e.g., ferromagnetic layers serving as a fixed layer and a free layer, a barrier layer between the fixed layer and the free layer, and a seed layer.

In some embodiments, a planarization operation, e.g., CMP, is performed to remove the excess materials of the conductive layer 242, the data storage layer 244 and the bit lines 146, and level the surface of the isolation region 142 with the conductive layer 242, the data storage layer 244 and the bit line 146. Each of the bit lines 146 is also referred to as one of the source/drain regions of the control transistor 200T.

In the depicted embodiment, the data storage unit 200M is arranged on the side of the bit line 146. However, the present disclosure is not limited to this embodiment, and the data storage unit 200M can be alternatively arranged on the side of the source line 144.

Figures 2E, 3E:
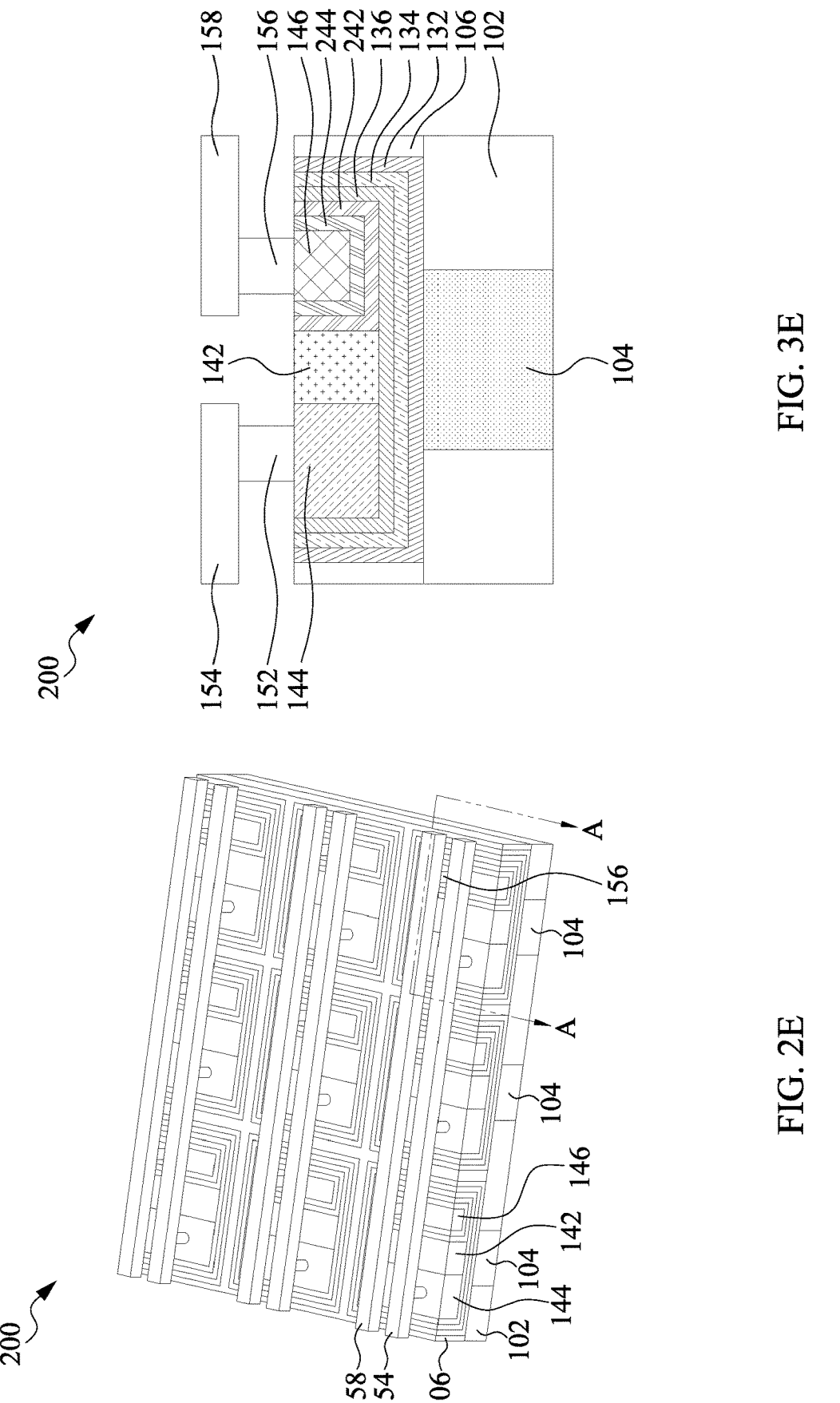

Referring to FIGS. 2E and 3E, conductive vias 152, 156 and conductive lines 154, 158 are formed to electrically connect to the source lines 144 and bit lines 146. The conductive vias 152, 156, and conductive lines 154, 158 are formed of conductive materials, such as tantalum, tantalum nitride, titanium, titanium nitride, tungsten, aluminum, cobalt, copper, or other suitable materials. In some embodiments, the conductive vias 152, 156 may be formed at the same level of the upper portion of the conductive via V5 of the logic region 10L, while the conductive lines 154, 158 may be formed at the same level of the conductive line L4 of the logic region 10L. The conductive vias 152, 156 and V5 may be formed using a single forming operation, and the conductive lines 154, 158 and L5 may be formed using a single forming operation.

Referring to FIG. 3C, the channel layer 136 is formed in the trench T1 in a conformal manner in the isolation layer 106. In some embodiments, the channel layer 136 has a U-shape or is formed of multiple segments connected to each other and extending in different directions. For example, the channel layer 136 may include a first segment 136A horizontally extending over the gate dielectric layer 134, and two second segments 136B connected to the first segment 136A and vertically extending in the isolation layer 106. In some embodiments, the vertically extending segments, e.g., the second segments 136B are parallel to each other. In some embodiments, the vertically extending second segments 136B are perpendicular to the horizontally extending first segment 136A, or is perpendicular to a bottom surface 104S of the word line 104.

Since the conductive layer 132 and the gate dielectric layer 134 are formed in a conformal manner similar to the channel layer 136, the conductive layer 132 and the gate dielectric layer 134 also have U-shapes and are formed of connected segments in a configuration similar to that of the channel layer 136. In some embodiments, referring to FIGS. 3C and 3D, the vertical segments of the conductive layer 132 laterally surround the vertical segments of the gate dielectric layer 134, the vertical segments 136B of the channel layer 136 and outer sidewalls of the source line 144 and bit line 146 from a top-view perspective (not separately shown). In some embodiments, the vertical segments of the gate dielectric layer 134 laterally surround and the vertical segments 136B of the channel layer 136 and outer sidewalls of the source line 144 and bit line 146 from a top-view perspective. In some embodiments, the vertical segments of the channel layer 136 laterally surround the outer sidewalk of the source line 144 and bit line 146 from a top-view perspective.

Based on the foregoing, the embodiments shown in FIGS. 2A to 2E and 3A to 3E provide advantages. The word lines 104 serving as the gate regions are configured to receive biased voltages to control the current in the channel layer 136 together with the biased voltages applied to the source lines 144 and bit lines 146 serving as the source/drain regions. Since the effective channel length of the channel layer 136 between the source line 144 and the bit line 146 is relatively short due to device size reduction, the short channel effect may occur. Furthermore, increasing the width of the word line 104 alone for enhancing the control on the channel layer 136 may also increase the capacitance between the word line 104 and the source line 144 or the bit line 146, thereby reducing the device speed. In contrast, the proposed conductive layer 132 includes vertical segments that from the outer sidewalk of the vertical segments of the channel layer 136 along the sidewalk of the trenches T1. As a result, the conductive layer 132 and the word line 104 can help better control the surface potential of the channel layer 136 across the entire length of the channel layer 136 via the first segment 136A and the second segments 136B between the source line 144 and the bit line 146. The effective channel length of the memory device 200 can be increased without sacrificing much device area. The device density and performance of the memory array 30 may thus be improved.

Figures 4A, 4B:
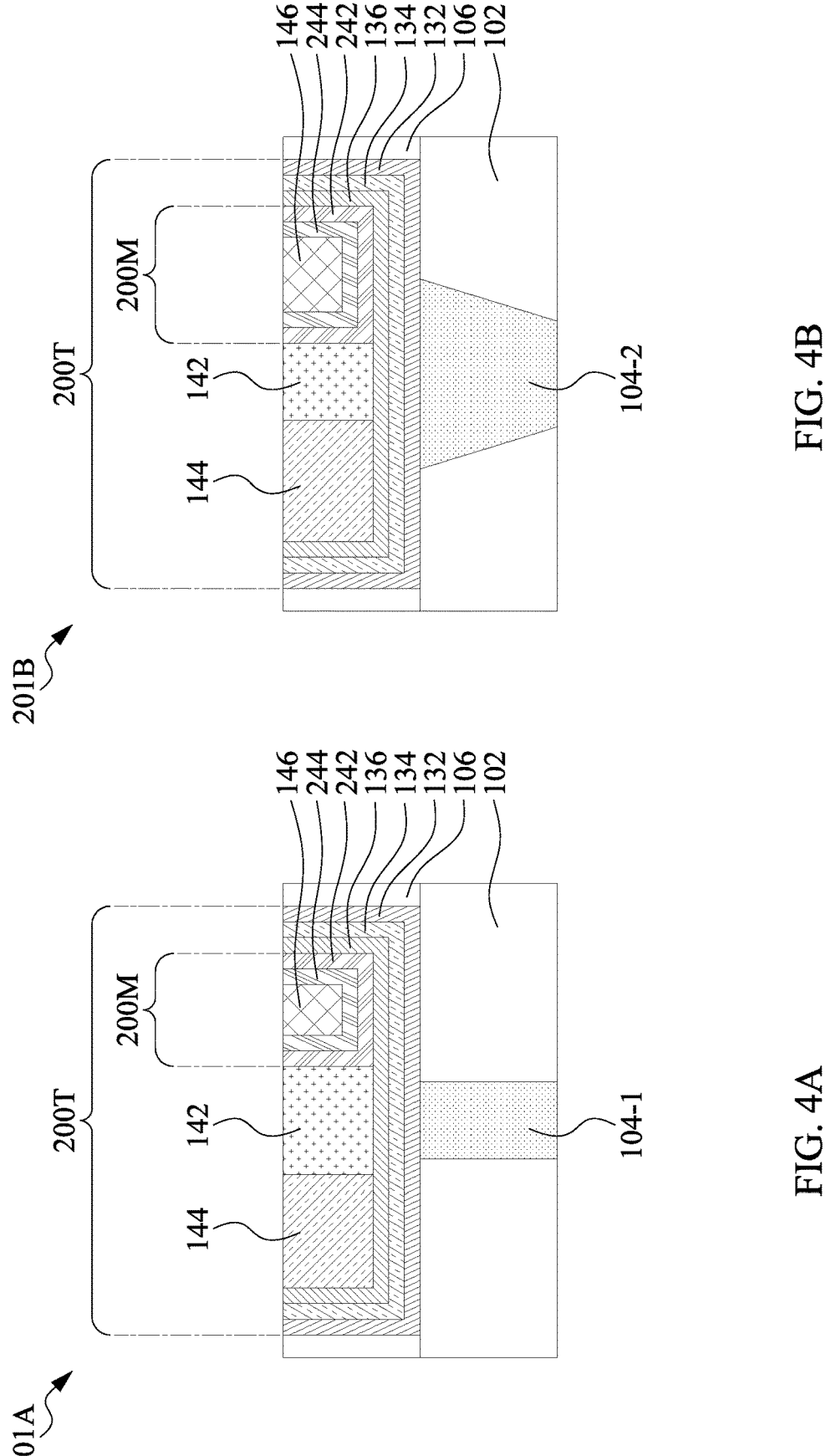
FIGS. 4A to 4F are cross-sectional views of various memory devices, in accordance with some embodiments of the present disclosure.
Figures 4C, 4D:
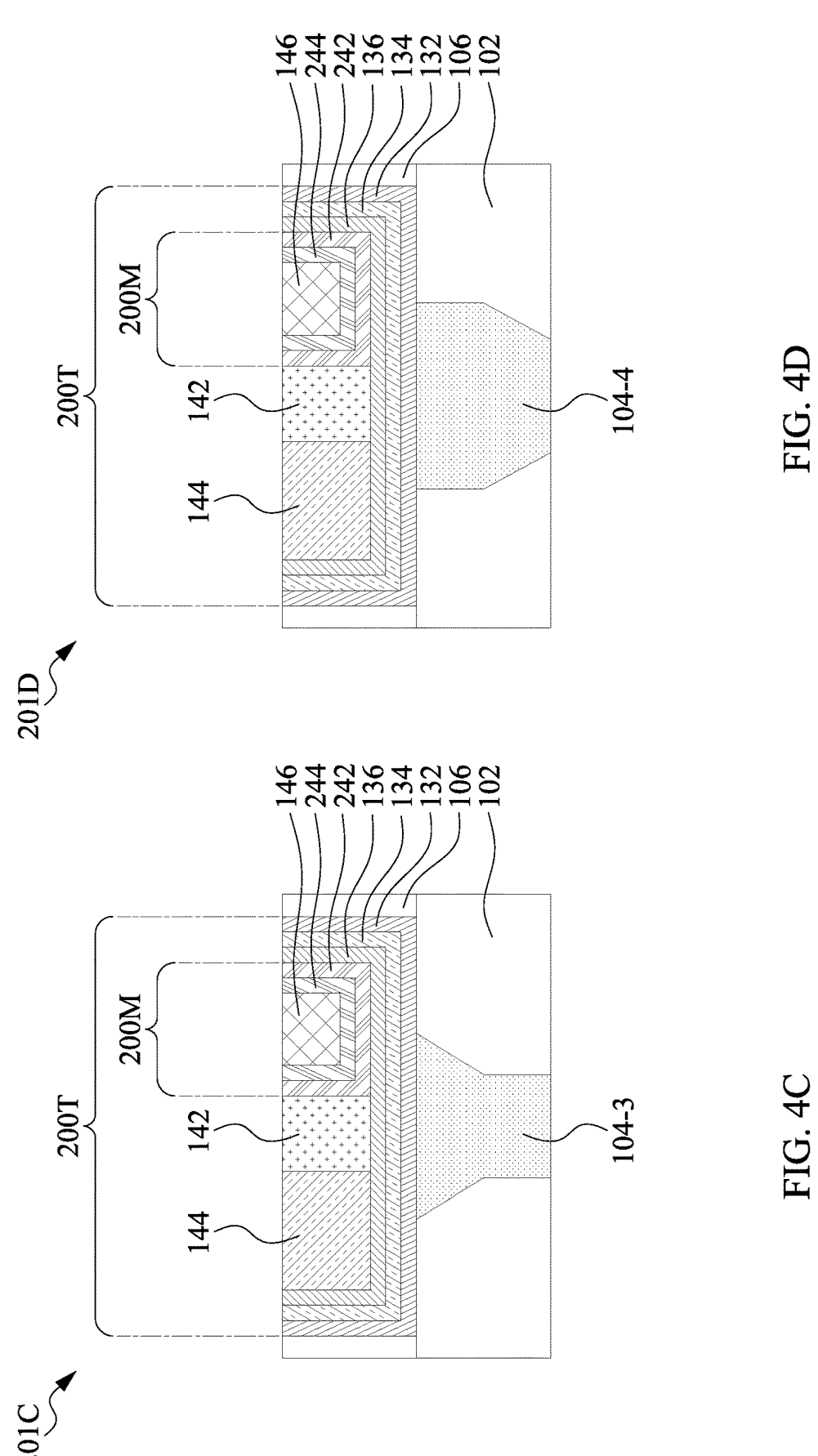

FIGS. 4A to 4D are cross-sectional views of various memory devices 201A to 201E, in accordance with some embodiments of the present disclosure. The memory devise 201A to 201E are similar to the memory device 200, and these similar features are omitted herein for brevity. The memory devices 201A to 201E differ from the memory device 200 mainly in the structure of the word line 104 from a cross-sectional view. The word line 104 of the memory device 200 has at least a portion overlapping the source line 144 and the bit line 146 in a vertical direction, and sidewalk of the word line 104 are substantially vertical and parallel. In contrast, referring to FIG. 4A, the word line 104-1 has vertical sidewalls and a line width from a cross-sectional view less than that of the word lines 104. This may further reduce the coupling capacitance between the word line 104-1 and the source line 144 or the bit line 146, and improve the device speed further. The control capability of the word line 104 can be maintained through the help of the conductive layer 132. Referring to FIGS. 4B to 4D, the corresponding word lines 104-1 to 104-4 includes different sidewall configurations. For example, the word lines 104-2 to 104-3 may have substantially equal widths at their upper surface as compared to the word line 104, but have reduced line widths in their middle portions or lower portions. For example, the word line 104-2 is tapered from the upper surface to the bottom surface of the word line 104-2, the word line 104-3 is tapered from the upper surface to the middle portion of the word line 104-3 and has parallel side-walls from the middle portion down to the bottom surface of the word line 104-3, while the word line 104-4 is tapered from the middle portion to the bottom surface of the word line 104-4 and has parallel sidewalls from the middle portion up to the upper surface of the word line 104-4. The variants of the word lines 104-2 to 104-4 may maintain the control capability on the channel layer 136 with the same covering area while decreasing the coupling capacitance by reducing the volume of the word line 104-2 to 104-4. The performance of the memory device 200 may be improved.

Figures 4E, 4F:
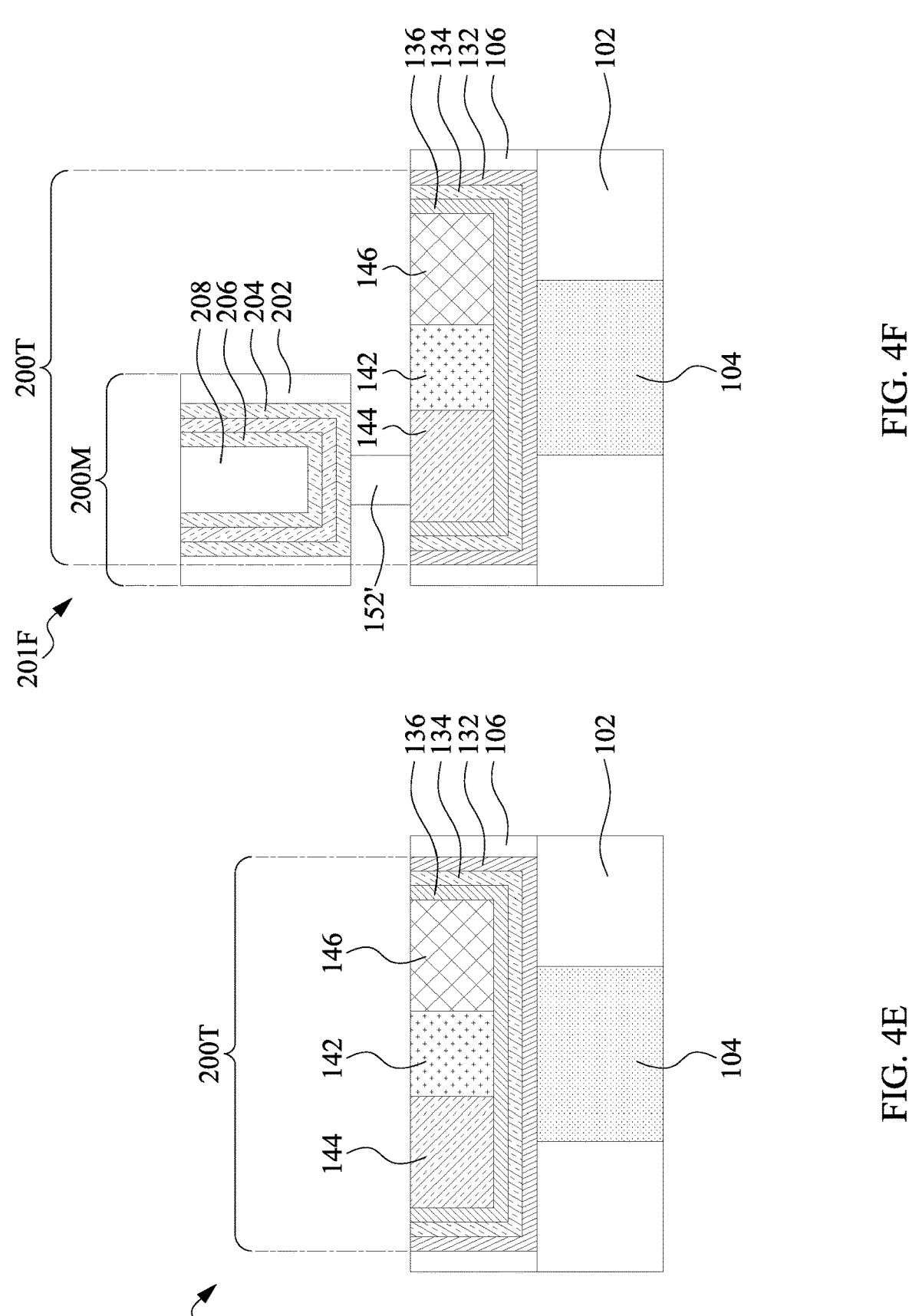

FIG. 4E is a cross-sectional view of a memory device 201E, in accordance with some embodiments of the present disclosure. In some embodiments, the memory device 201E is a FeFET memory device, and the data storage unit formed of the conductive layer 242, data storage layer 244 are absent from the memory device 201E. When the memory device 201E is configured as a FeFET, the non-ferroelectric gate dielectric layer 134 is replaced with a data storage layer 184 of the FeFET. The data storage layer 184 may include a ferroelectric material similar to the ferroelectric material used in the data storage layer 244.

FIG. 4F is a cross-sectional view of a memory device 201F, in accordance with some embodiments of the present disclosure. In some embodiments, the memory device 201F is a dynamic RAM (DRAM) memory device constructed by the control transistor 200R and a data storage unit 201M. In some embodiments, the data storage unit 201M includes a capacitor formed over the control transistor 200T in an IMD layer 202 of an overlying metallization layer, e.g., M5 to construct a 1T1C DRAM. In some embodiments, the data storage unit 201M includes a first conductive layer 204, a second conductive layer 206 and an insulating layer 208 between the conductive layers 204 and 206 to electrically insulate the first conductive layer 204 from the second conductive layer 206.

Through the present disclosure, the gate dielectric layer 134 or the data storage layer 184, which is arranged between the word line 104 and the channel layer 136, is collectively referred to herein as a control layer 134/184, and the material of the control layer 134/184 is determined depending on whether it is a gate dielectric layer 134 or a data storage layer 184.

FIGS. 5A to 5F are perspective views of intermediate stages of a method of forming a memory device 500, in accordance with some embodiments of the present disclosure. FIGS. 6A to 6F are cross-sectional views of the memory device 500 taken from the section line BB of the corresponding FIGS. 5A to 5E, in accordance with some embodiments of the present disclosure. The memory device 500 is similar to the memory devices 200 and 201A to 201E, and these similar features are not repeated herein for brevity.

Figure 6A:
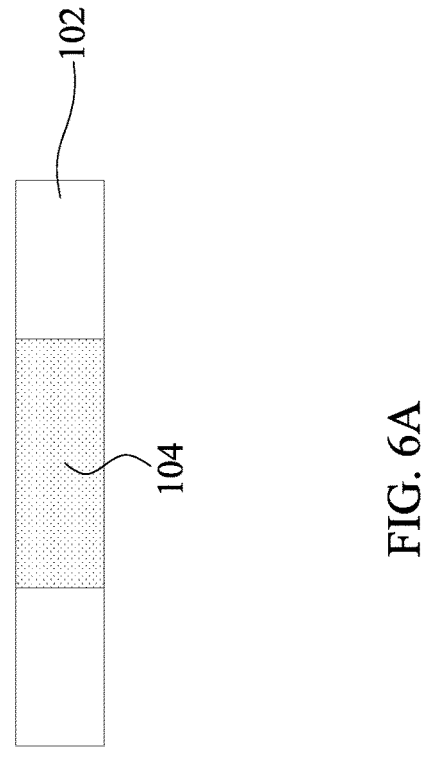
FIGS. 6A to 6F are cross-sectional views taken from the section line BB of the corresponding FIGS. 5A to 5E, in accordance with some embodiments of the present disclosure.
Figure 5A:
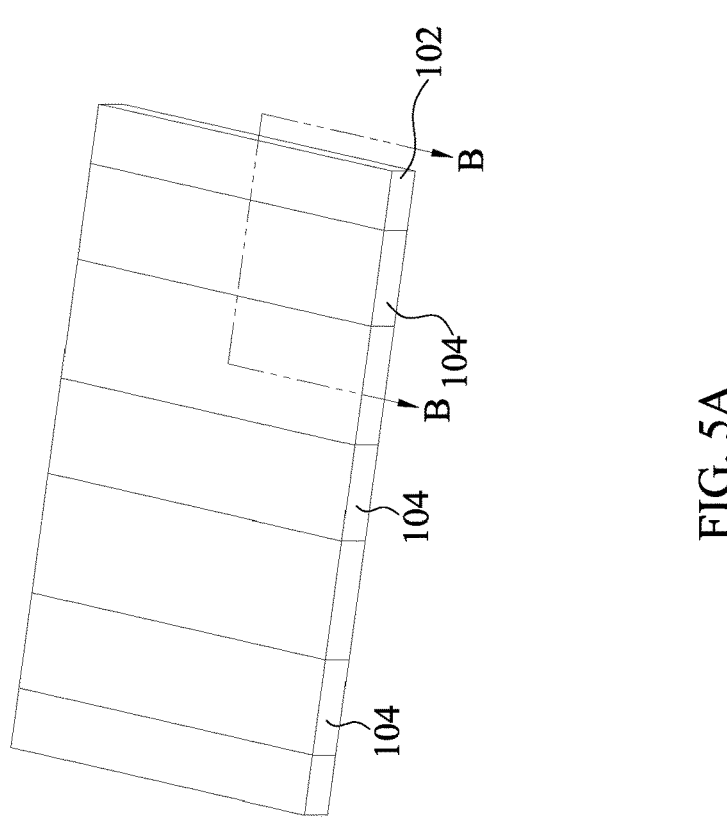
FIGS. 5A to 5F are perspective views of intermediate stages of a method of forming a memory device, in accordance with some embodiments of the present disclosure.

Referring to FIGS. 5A and 6A, a substrate 102 is formed in a bottom metallization layer, e.g., the metallization layer M3 shown in FIG. 1. The substrate 102 is patterned to form trenches (not separately shown) using, e.g., lithography and etching operations. The trenches are filled with a conductive material to form word lines 104.

Figure 6B:
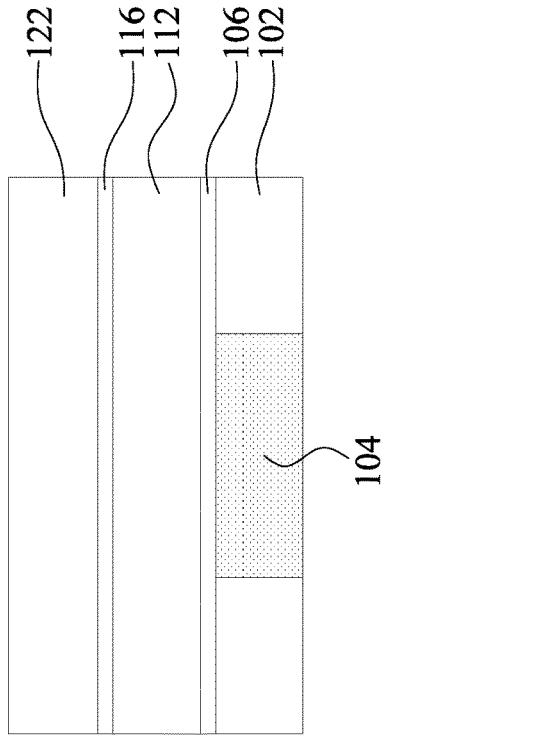
Figure 5B:
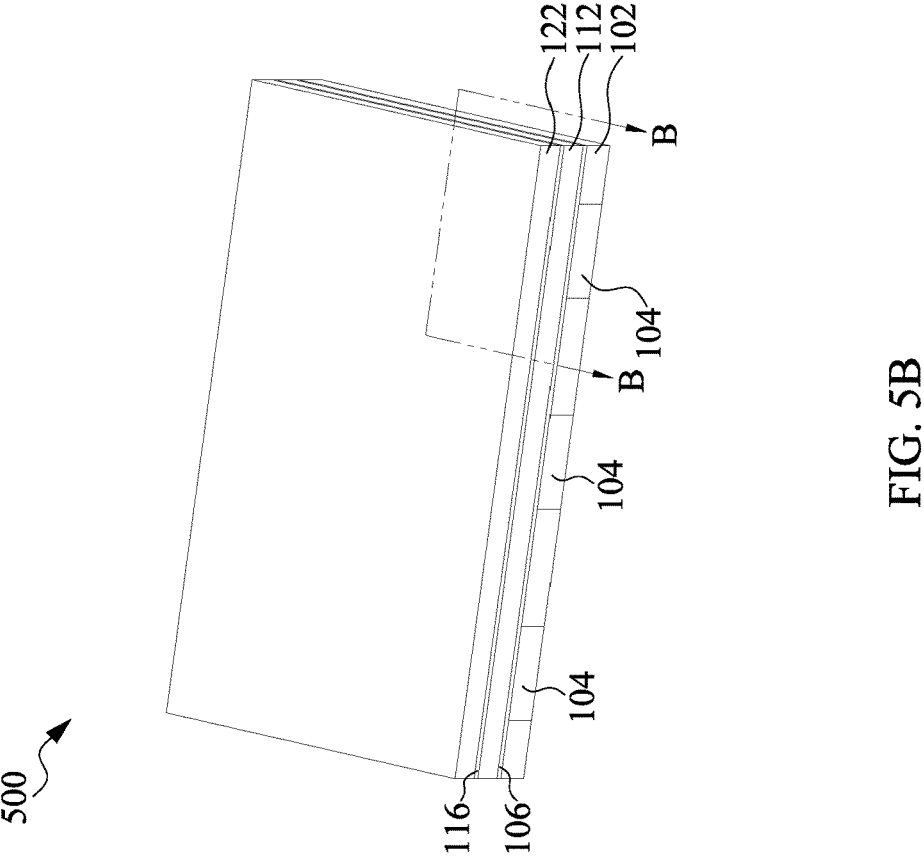

Referring to FIGS. 5B and 6B, a middle metallization layer is formed over the bottom metallization layer where the substrate 102 resides. In some embodiments, isolation layers 106, 112, 116 and 122 are formed over the substrate 102 and the word lines 104 in sequence. The isolation layers 106, 112, 116 and 122 are formed as dielectric layers, and may include a dielectric material such as silicon nitride, silicon oxide, silicon oxynitride, or other suitable dielectric materials. In some embodiments, the isolation layers 106 and 112 are referred to as etch stop layers, while the isolation layers 112, 122 are referred to as part of the IMD layer. Therefore, the isolation layers 106 and 116 are generally formed with materials different from those of the isolation layers 112, 122 and the substrate 102.

Figures 5C, 6C:
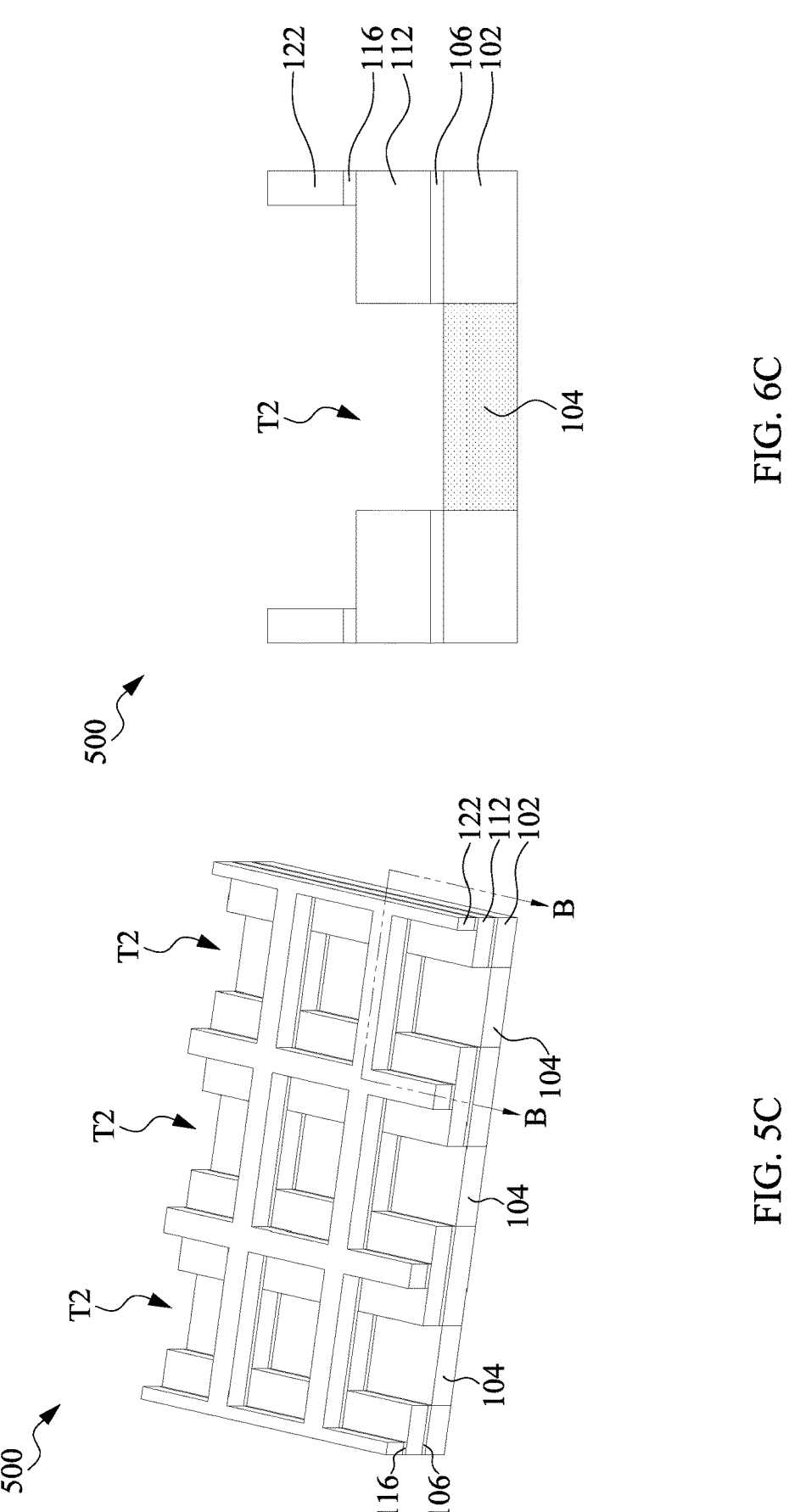

Referring to FIGS. 5C and 6C, a patterning operation including an etching operation is performed through the isolation layers 122, the etch stop layer 116, the isolation layer 112, and the etch stop layer 106 to form trenches T2. The word lines 104 are exposed during the patterning operation. The trenches T2 may have a width substantially equal to a width of the word line 104. FIGS. 7A to 7F are cross-sectional views of intermediate stages of forming the trenches T2 shown in FIGS. 5C and 6C, in accordance with some embodiments of the present disclosure.

Figure 7B:
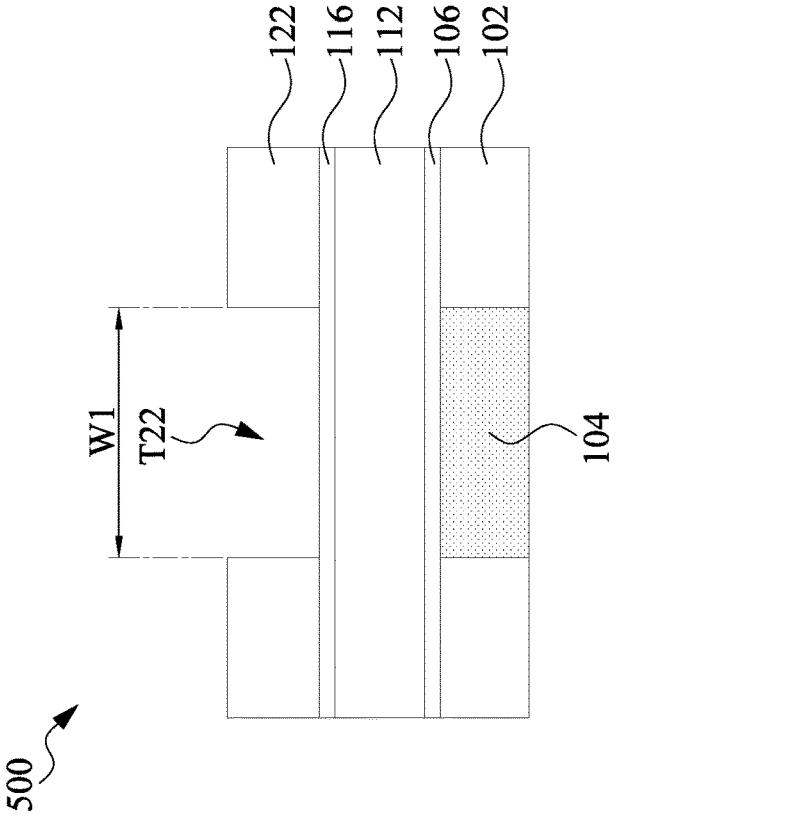
FIGS. 7A to 7F are cross-sectional views of intermediate stages of a method of forming the semiconductor structure shown in FIGS. 5C and 6C, in accordance with some embodiments of the present disclosure.
Figure 7A:
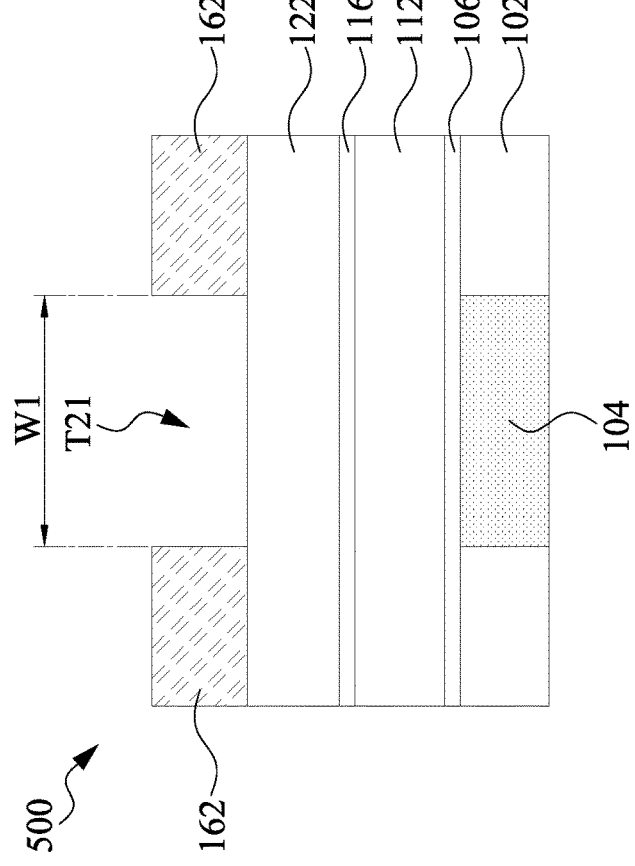

Referring to FIG. 7A, a first mask layer 162 is formed over the isolation layer 122. The first mask layer 162 may include a hard mark layer, e.g., silicon nitride or a photoresist. The first mask layer 162 is deposited using, e.g., CVD, ALD, spin on coating, other suitable methods. The first mask layer 162 is then patterned to include an opening T21 with a width W1 substantially equal to the width the underlying word line 104.

Referring to FIG. 7B, the isolation layer 122 is patterned using an etching operation with the first mask layer 162 serving as an etching mask. The etching operation may include a dry etch, a wet etch, an RIE, or the like. The etch runs through the isolation layer 122 and stops on the etch stop layer 116 to form a trench T22. After the isolation layer 122 is patterned, the first mask layer 162 is removed or stripped.

Figures 7C, 7D:
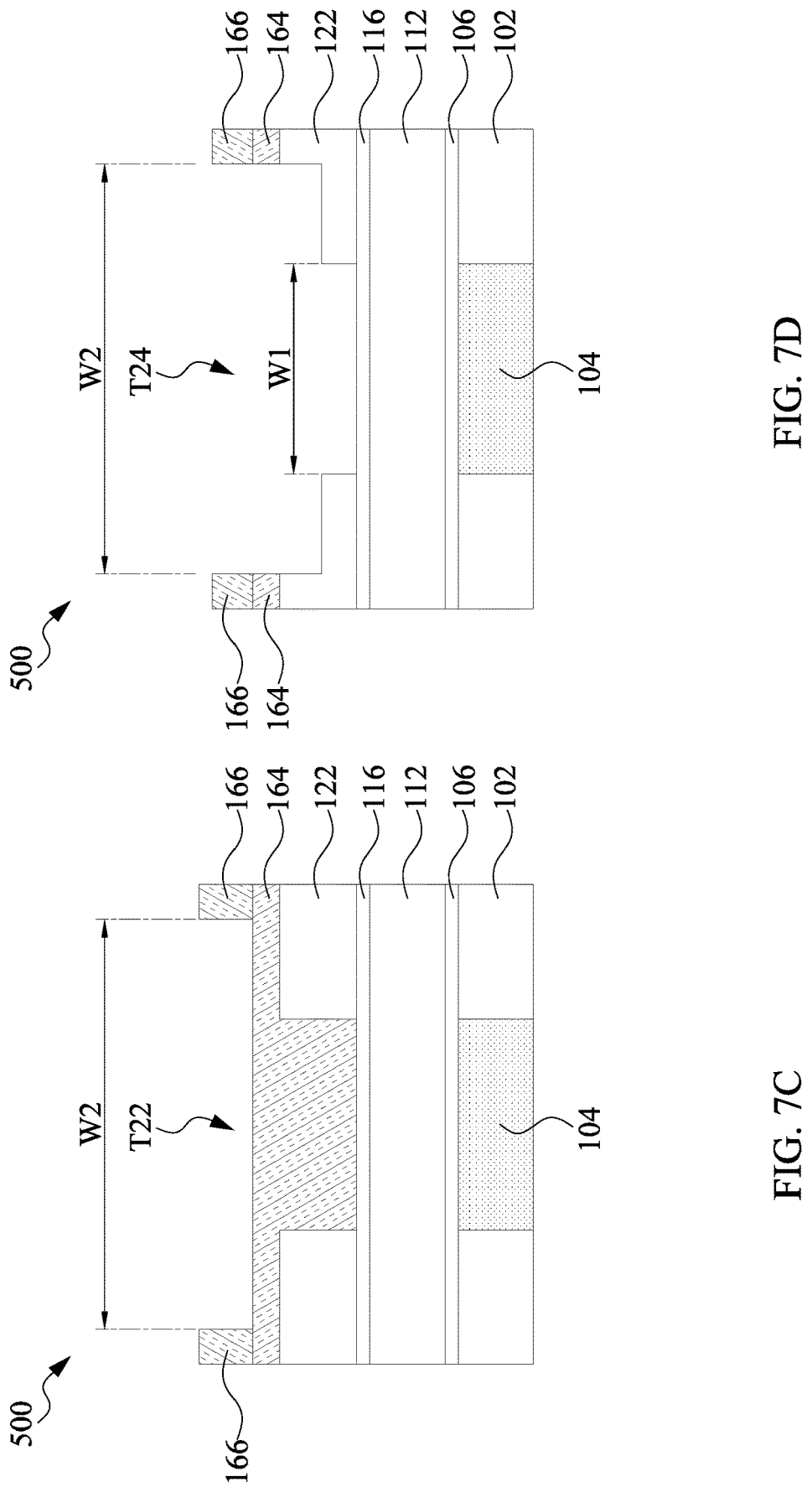

Referring to FIG. 7C, a second mask layer 164 is deposited over the isolation layer 122 and fills the trench T22. The second mask layer 164 may include a hard mark layer, e.g., silicon nitride or a photoresist. The second mask layer 164 is deposited using, e.g., CVD, ALD, spin on coating, other suitable methods. A third mask layer 166 is deposited over the second mask layer 164. The third mask layer 166 may include a hard mark layer, e.g., silicon nitride or a photoresist, and include different materials from the second mask layer 164. The third mask layer 166 is then patterned to include an opening T23 with a width W2 greater than the width W1.

Referring to FIG. 7D, the second mask layer 164 is patterned using an etching operation with the third mask layer 166 serving as an etching mask. The etching operation may include a dry etch, a wet etch, an RIE, or the like. Through the etching operation the materials of the second mask layer 164 not covered by the third mask layer 166 are etched. The original filled trench T22 is exposed accordingly. In some embodiments, the etching operation removes a thickness of the isolation layer 122. The etch runs through the isolation layer 122 and stops on the etch stop layer 116 to form a trench T24.

Figures 7E, 7F:
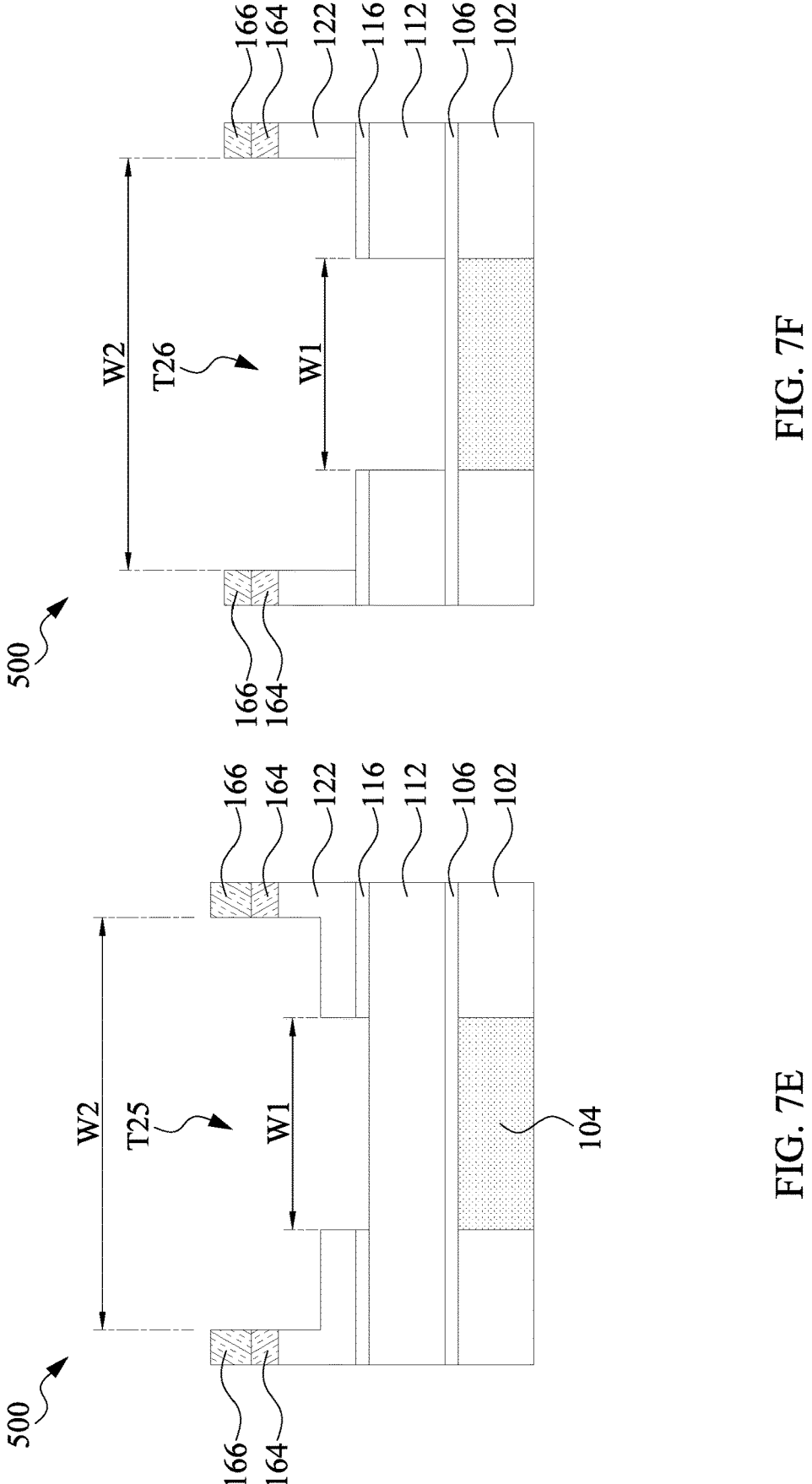

Referring to FIG. 7E, the trench T24 is further etched downward with the third mask layer 166 and the isolation layer 122 serving as the etching masks. The etching operation may include a dry etch, a wet etch, an RIE, or the like.

Through the etching more thicknesses of the isolation layer 122 are removed. In addition, portions of the etch stop layer 116 not covered by the isolation layer 122 are removed, thereby exposing the isolation layer 112. A trench T25 is thus formed.

Referring to FIG. 7F, the trench T25 is further etched downward with the third mask layer 166 and the etch stop layers 106, 116 serving as the etching masks. The etching operation may include a dry etch, a wet etch, an RIE, or the like. Through the etching the entire thickness of the isolation layer 122 not covered by the third mask layer 166 is removed. In addition, portions of the isolation layer 112 not covered by the etch stop layer 116 are removed, thereby exposing the etch stop layer 106. A trench T26 is thus formed.

Subsequently, referring to FIG. 7F and FIGS. 5C and 6C, the third mask layer 166, the second mask layer 164 and the etch stop layer 106 not covered by the isolation layer 112 are removed or etched to form the trench T1. At least portions of the upper surface of the word lines 104 are exposed through the trench T1.

Figures 5D, 6D:
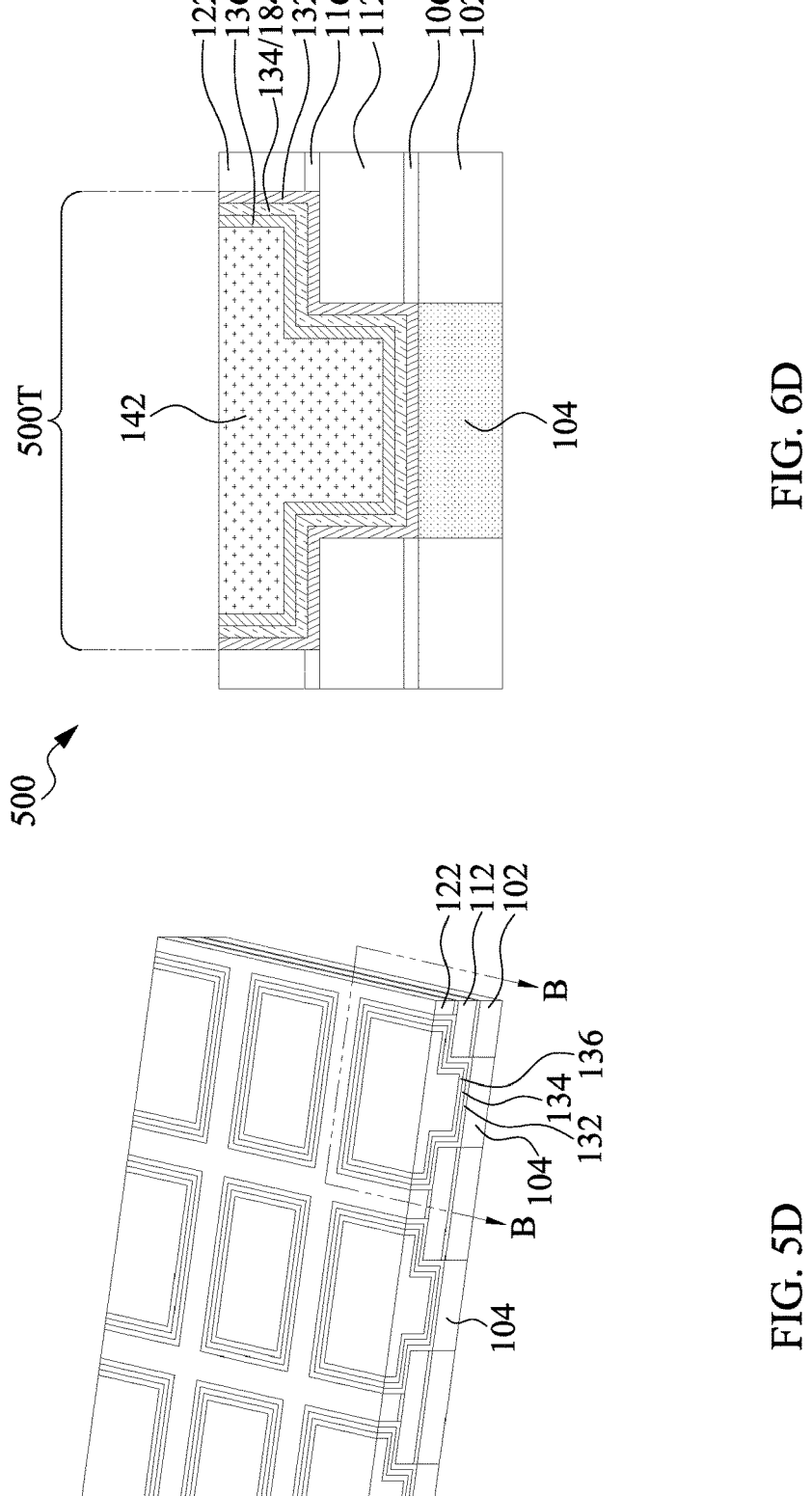

Referring to FIGS. 5D and 6D, a conductive layer 132, a gate dielectric layer 134, and an isolation region 142 are successively formed in the trench T1. The materials, configuration and method of forming of the conductive layer 132, the gate dielectric layer 134, and the isolation region 142 are similar to those described with reference to FIGS. 2B and 3B. The transistor 500T formed as shown in FIGS. 5D and 6D can be configured as a control transistor in a DRAM-type memory device, in which a data storage unit (not separately shown), e.g., a capacitor, is over and electrically coupled to the control transistor 500T. In some embodiments, the gate dielectric layer 134 is replaced by a data storage layer 184, e.g., a ferroelectric layer similar to that described in FIG. 4E, and thus the control transistor 500T is configured as a FeFET.

In some embodiments, the transistor 500T formed as shown in FIGS. 5D and 6D can be configured as a FeRAM-type memory device, in which the gate dielectric layer 134 is replaced with a data storage layer 184, in a way similar to the data storage layer 184 of the FeFET memory device 201E shown in FIG. 4E.

Figures 5E, 6E:
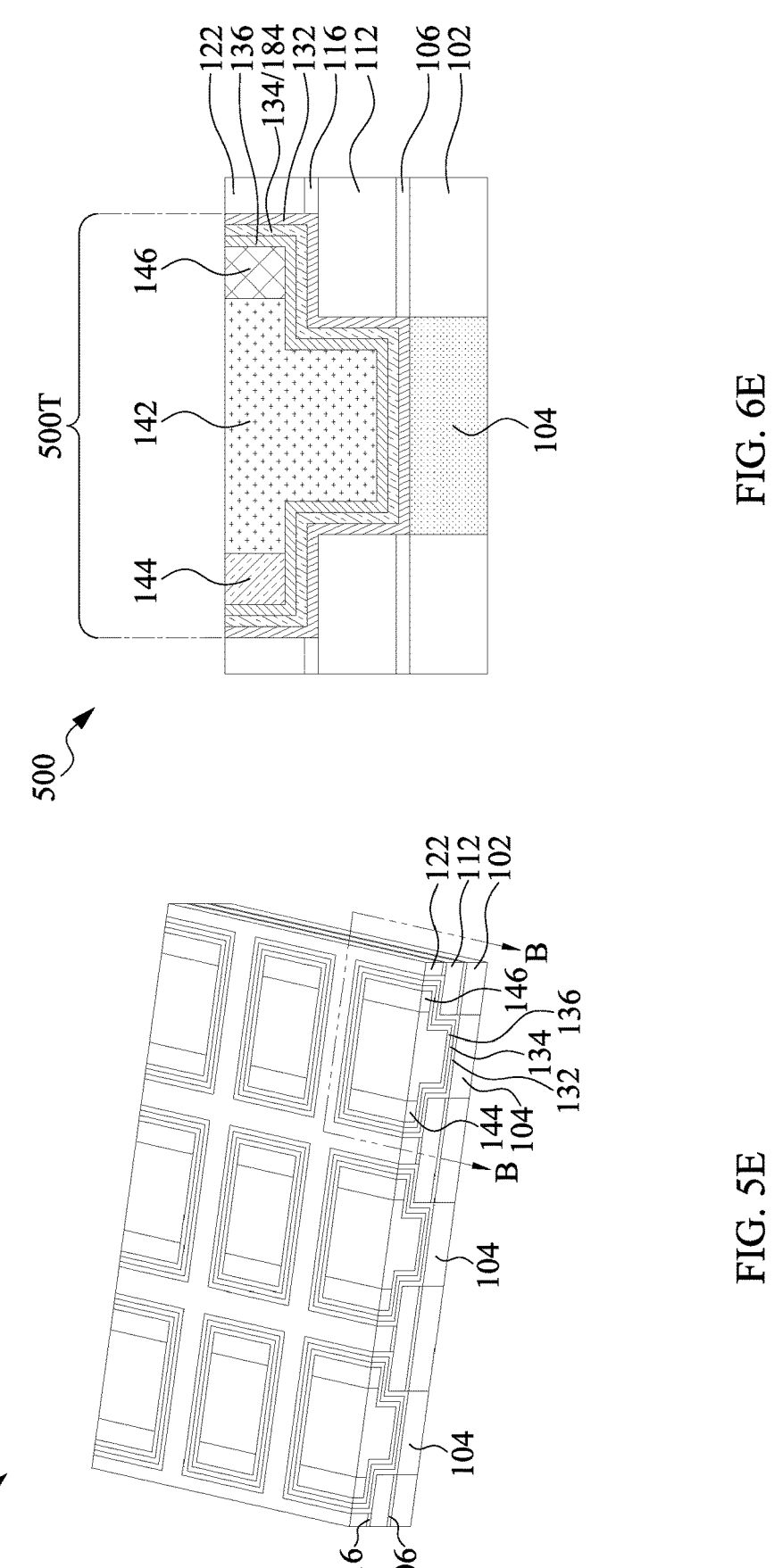
Figures 5F, 6F:
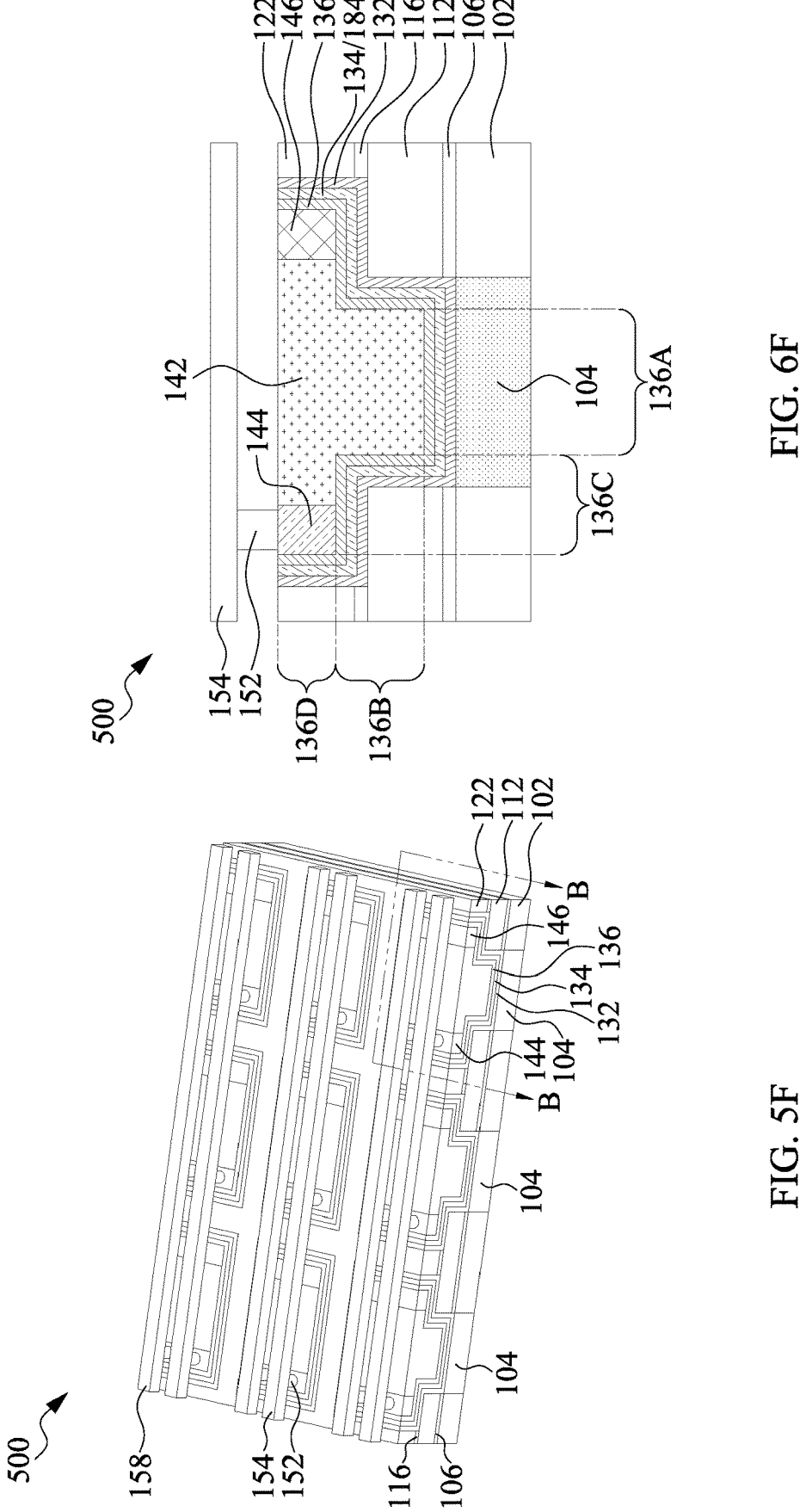

FIGS. 5E and 6E illustrate the formation of the source line 144 and the bit line 146 in the isolation region 142. Further, FIGS. 5F and 6F illustrate the formation of the conductive vias 152, 156 and conductive lines 154, 158 over the memory device 500. The materials, configurations, and method of forming of the aforesaid source line 144, bit line 146, conductive vias 152, 156 and conductive lines 154, 158 are similar to those described with reference to FIGS. 2D to 2E and 3D to 3E. The control transistor 500T formed in FIGS. 5E and 6E can be used in a FeRAM, FeFET, DRAM, RRAM, or other suitable memory device types.

Referring to FIG. 6F, the channel layer 136 is formed in the trench T2 in a conformal manner across the isolation layers 112, 116 and 122. In some embodiments, the channel layer 136 has a stepped shape or is formed of multiple segments connected to each other and extending in different directions. For example, the channel layer 136 may include a first segment 136A horizontally extending over the gate dielectric layer 134, two second segments 136B connected to the first segment 136A and vertically extending in the isolation layer 112, two third segments 136C connected to the corresponding second segments 136B and horizontally extending in the isolation layer 122, and two fourth segments 136D connected to the corresponding third segments 136C and vertically extending in the isolation layer 122.

In some embodiments, the horizontally extending segments, e.g., the first segment 136A and the third segments 136C are parallel to each other, while the vertically extending segments, e.g., the second segments 136B and the fourth segments 136D are parallel to each other.

Since the conductive layer 132 and the gate dielectric layer 134/data storage layer 184 are formed in a conformal manner similar to the channel layer 136, the conductive layer 132 and the gate dielectric layer 134/data storage layer 184 may also have stepped shapes and are formed of connected segments in a configuration similar to that of the channel layer 136.

As discussed previously, the channel layer 136 is increased in length in the vertical direction due to the design of extended segments 136B to 136D, and thus the short channel effect can be eliminated with only minor increase in the device area. Further, the conductive layer 132 has connected segments, which extend along the direction in which the channel layer 136 extends and laterally surround the outer sides of the vertical segments 136B, 136D of the channel layer 136. The channel control performance of the control transistor 500T can be improved without increasing the coupling capacitance between the word line 104 and the source line 144 or the bit line 146. The device speed can be enhanced accordingly.

Figures 8A, 8B:
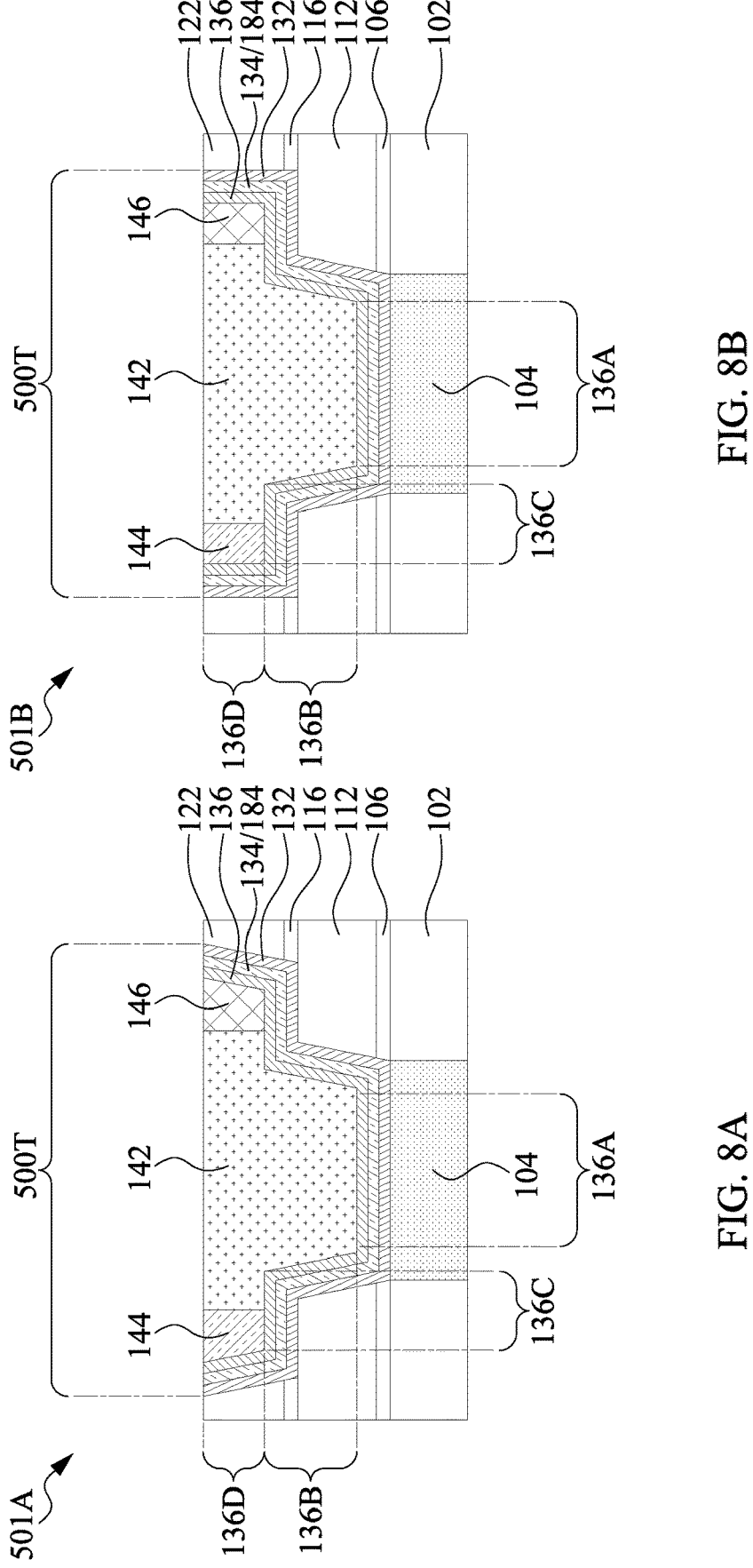
FIGS. 8A to 8D are cross-sectional views of various memory devices, in accordance with some embodiments of the present disclosure.

FIGS. 8A to 8D are cross-sectional views of various memory devices 501A to 501D, in accordance with some embodiments of the present disclosure. The memory devise 501A to 501D are similar to the memory device 500, and these similar features are omitted herein for brevity. The memory devices 501A and 501B differ from the memory device 500 mainly in the configuration and shape of the trench T2 from a cross-sectional view. As a result, the subsequently-formed conductive layer 132, the gate dielectric layer 134 and the channel layer 136 are formed with different shapes according to the trench T2. The tapered sidewalls of the trench T2 may aid in the deposition performance or the effective length of the subsequently deposited layers. Referring to FIG. 8A, in the memory device 501A, the segments 136B and 136D are slanted rather than vertical. In some embodiments, the sidewalls of the channel layer at the segments 136B and 136D tapered from a location near the top surface of the channel layer 136 to a location near the bottom surface of the channel layer 136. Referring to FIG. 8B, in the memory device 501B, only one pair of segments, e.g., the second segments 136B, is slanted, while the other pair of segments, e.g., the fourth segments 136D, is formed as being vertical.

Figures 8C, 8D:
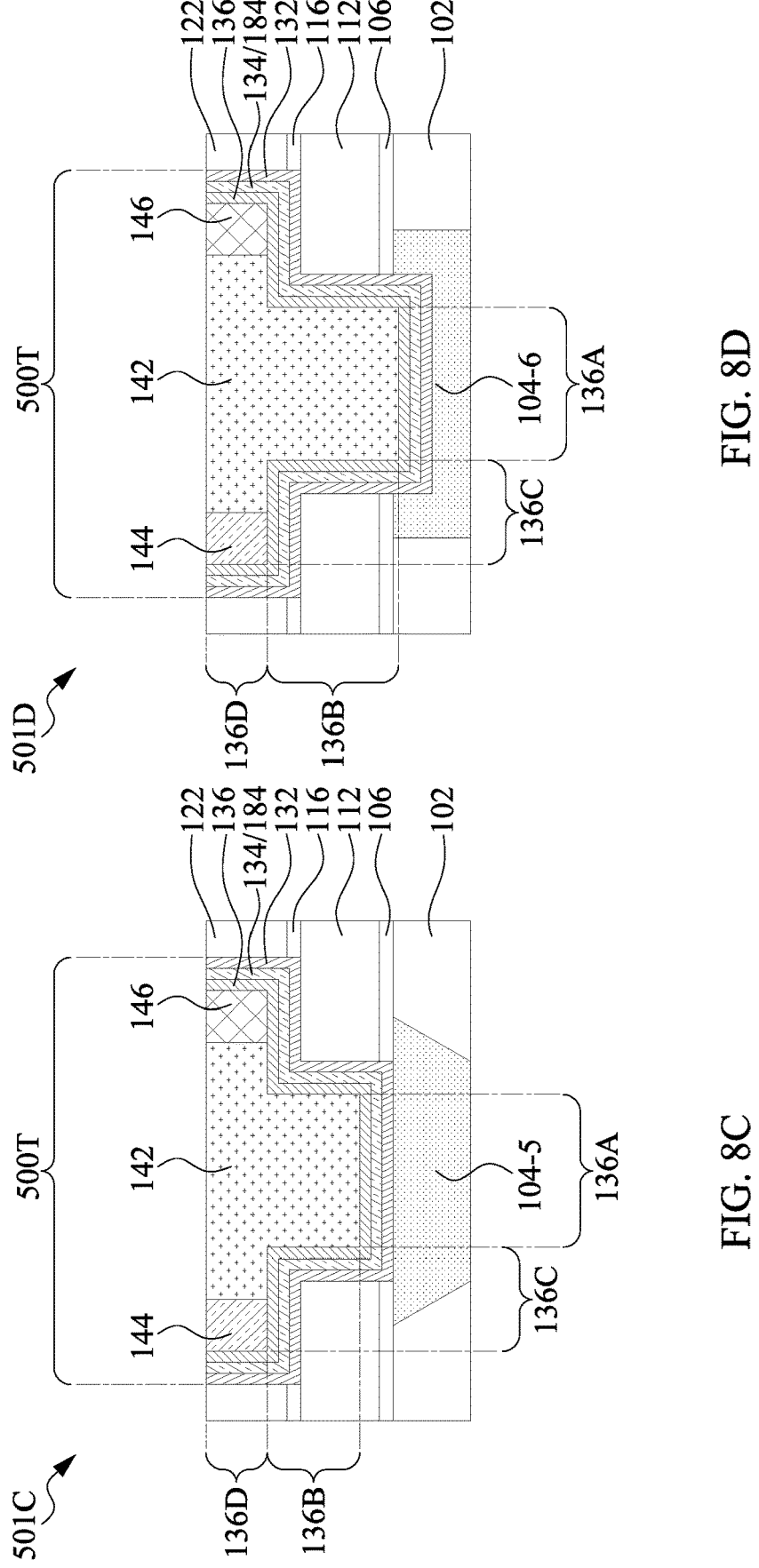

The memory devices 501C and 501D differ from the memory device 500 mainly in the configuration and shape of the word line 104 from a cross-sectional view. Referring to FIGS. 8C and 8D, the word line 104-5 of the memory device 501C or the word line 104-6 of the memory device 501D has at least a portion extending beyond the width of the bottom surface of the conductive layer 132 and overlapping the channel layer 136 in a vertical direction. In some embodiments, the word line 104-5 includes slanted sidewalls tapered from the top surface of the word line 104-5 to the bottom surface of the word line 104-5. In some embodiments, the sidewalls of the word line 104-6 are substantially vertical and parallel, and laterally surround the sidewalls of the bottom portion of the conductive layer 132, the gate dielectric layer 134 or the channel layer 136. The distance between the extension portion of the word line 104-5 and the source line 144 or the bit line 146 may further reduce the coupling capacitance between the word line 104-1 and the source line 144 or the bit line 146, and improve the device speed further. The control capability of the word line 104 can be maintained through the help of the conductive layer 132. The variants of the word lines 104-5 and 104-6 may seek better balance between the control capability on the channel layer 136 and low coupling capacitance induced by the word lines 104-5 or 104-6. The performance of the memory device 500 may be improved.

Figure 8E:
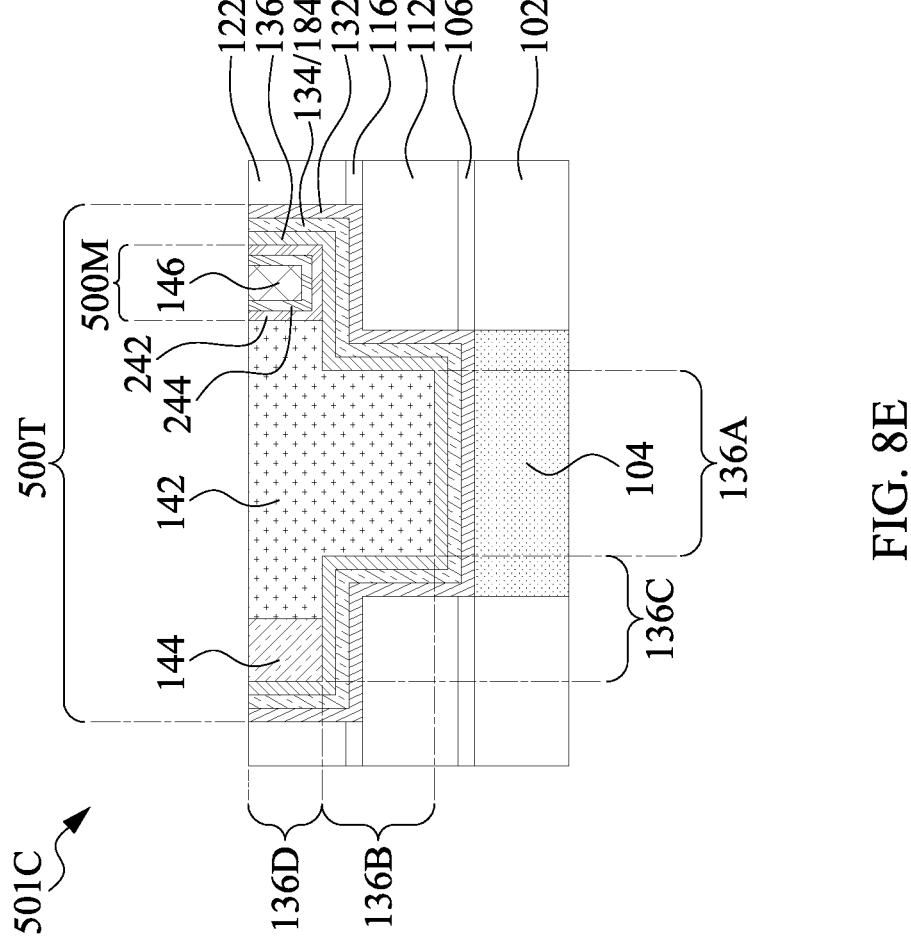
FIG. 8E is a cross-sectional view of a memory device, in accordance with some embodiments of the present disclosure.

FIG. 8E is a cross-sectional view of a memory device 801E, in accordance with some embodiments of the present disclosure. In some embodiments, the memory device 501E includes the control transistor 500T and a memory unit 500M, in which the memory unit 500M is similar to the data storage unit 200M, and includes a conductive layer 242 and a data storage layer 244. As a result, the memory unit 500M can be used in a FeFRAM, FTJ, RRAM, MRAM or other suitable memory device types.

FIGS. 9A to 9I are perspective views of intermediate stages of a method of forming a memory device 900, in accordance with some embodiments of the present disclosure. FIGS. 10A to 10I are cross-sectional views of the memory device 900 taken from the section line CC of the corresponding FIGS. 9A to 9I, in accordance with some embodiments of the present disclosure. The memory device 900 is similar to the memory device 200 or 500, and these similar features are not repeated herein for brevity.

Figures 9A, 10A:
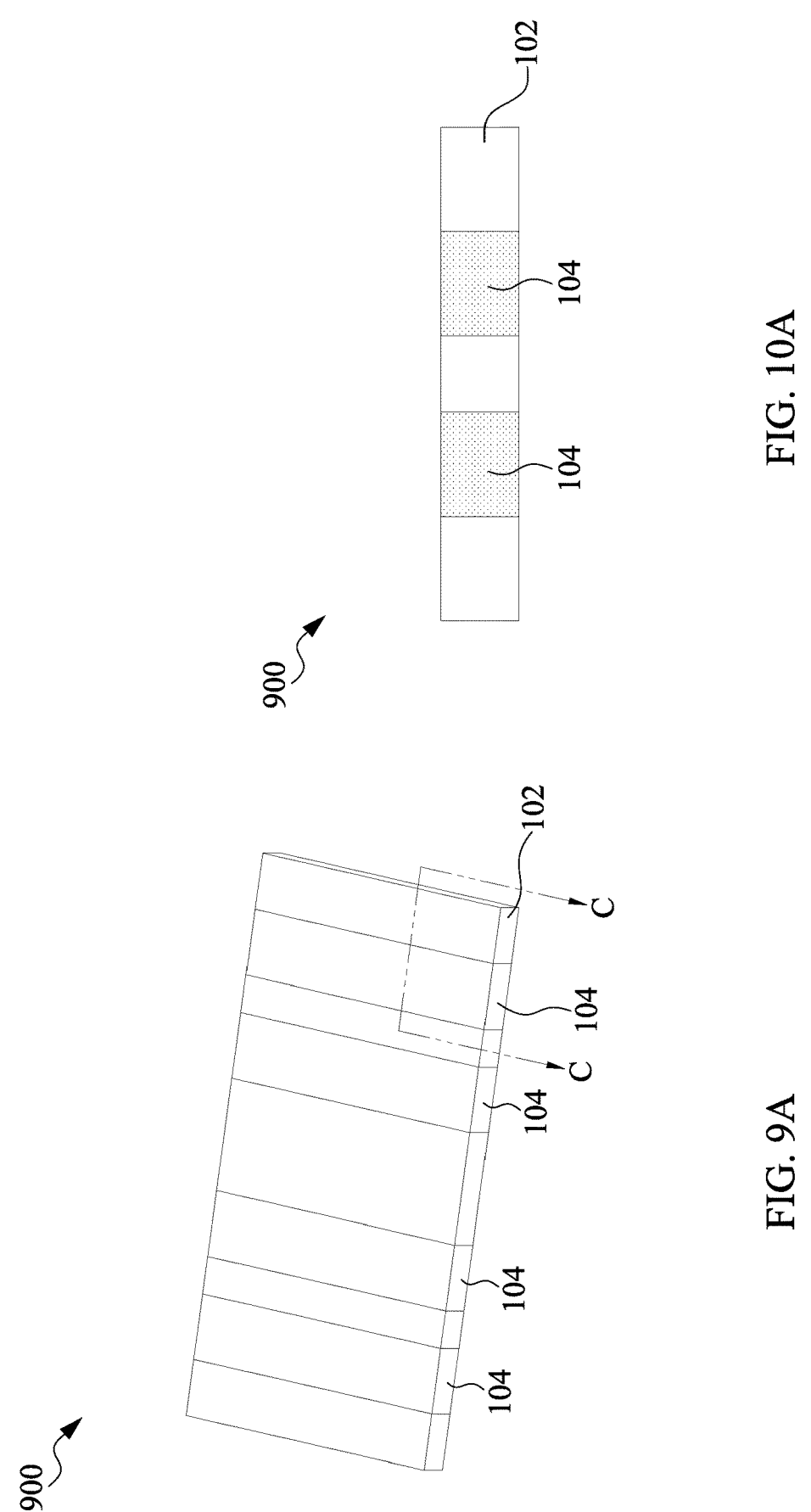

Referring to FIGS. 9A and 10A, a substrate 102 is formed in a bottom metallization layer, e.g., the metallization layer M3 shown in FIG. 1. The substrate 102 is patterned to form trenches (not separately shown) using, e.g., lithography and etching operations. The trenches are filled with a conductive material to form word lines 104.

Figure 10B:
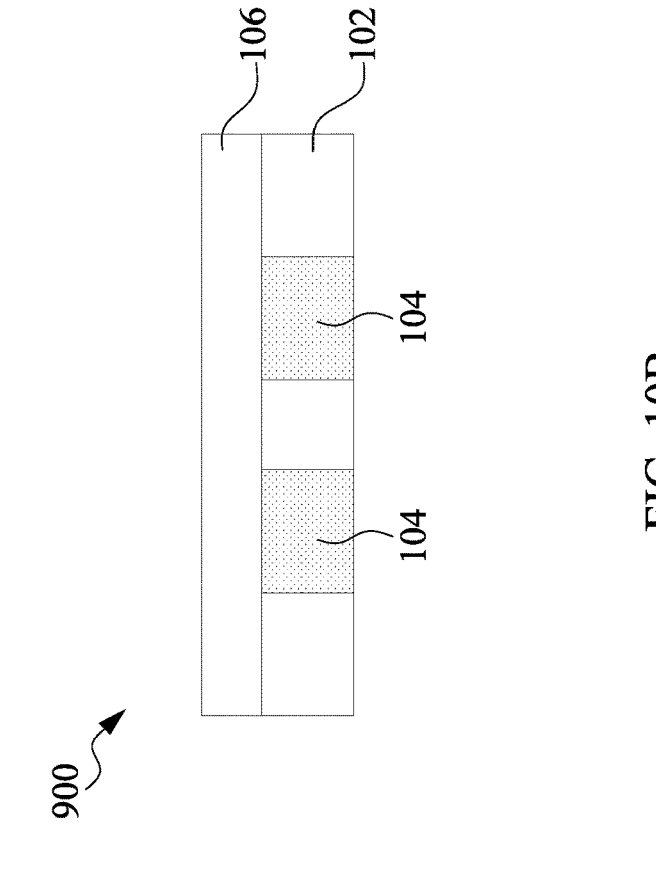
Figure 9B:
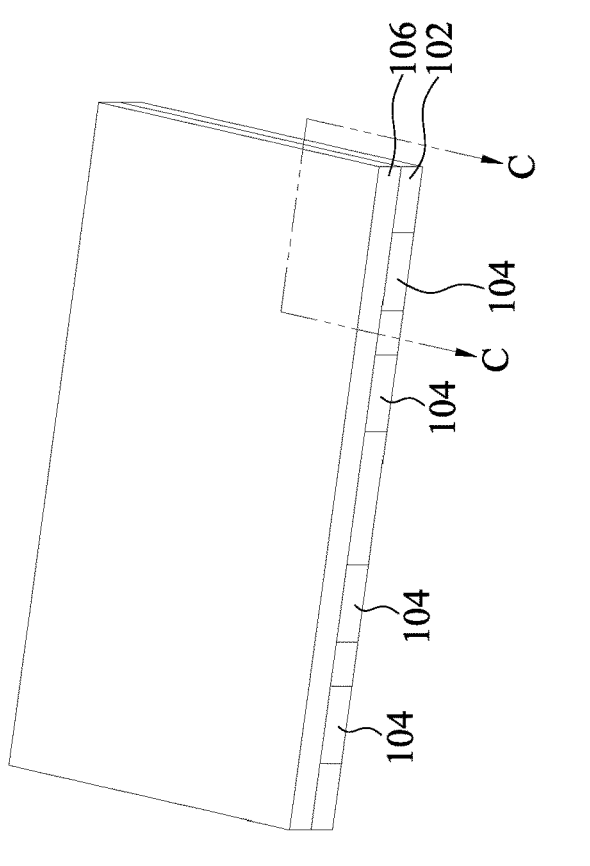
Figure 10C:
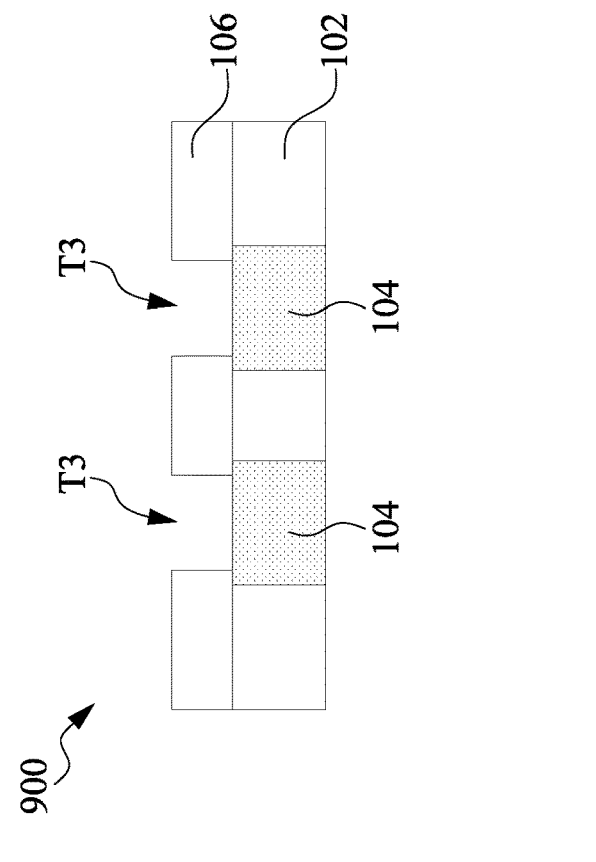
Figure 9C:
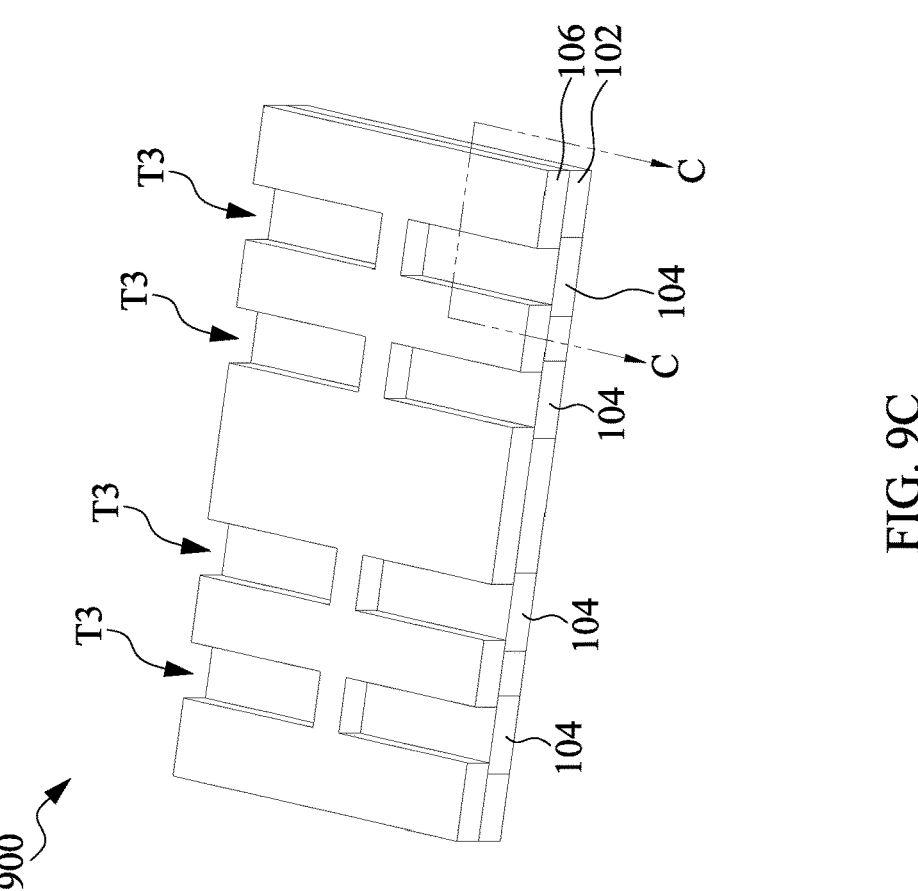

Referring to FIGS. 9B and 10B, a middle metallization layer is formed over the bottom metallization layer where the substrate 102 resides. In some embodiments, an isolation layer 106 is formed over the substrate 102 and the word lines 104. Referring to FIGS. 9C and 10C, a patterning operation including an etching operation is performed through the isolation layer 106 to form trenches T3. The word lines 104 are exposed during the patterning operation. The trenches T3 may have a width less than or substantially equal to a width of the word line 104.

Figures 9D, 10D:
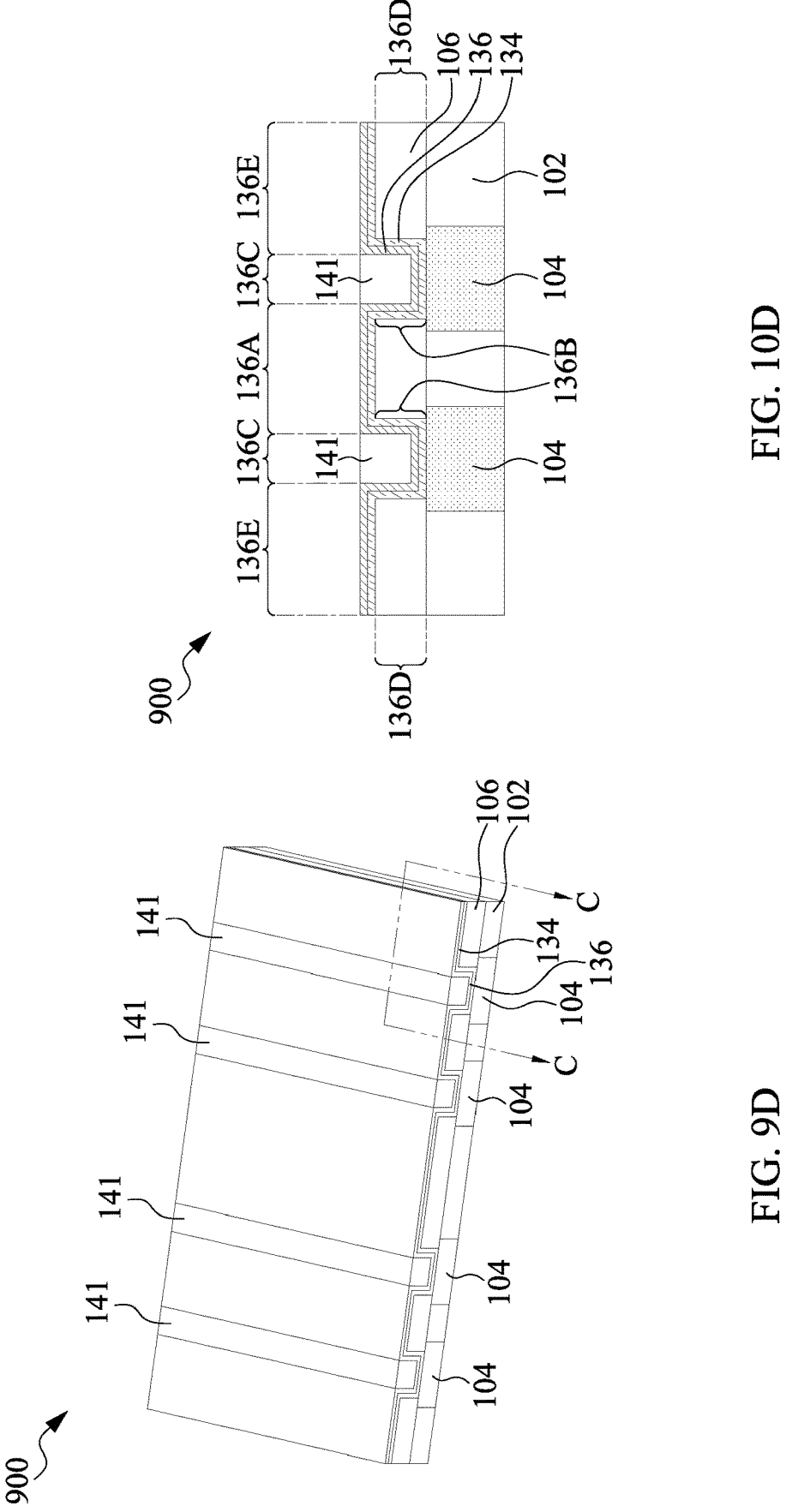

Referring to FIGS. 9D and 10D, a conductive layer 132, a gate dielectric layer 134, and an isolation region 141 are successively formed in the trenches T3. The materials, configuration and method of forming of the conductive layer 132, the gate dielectric layer 134, and the isolation region 141 are similar to the conductive layer 132, the gate dielectric layer 134, and the isolation region 142 described with reference to FIGS. 2B and 3B.

Figures 9E, 10E:
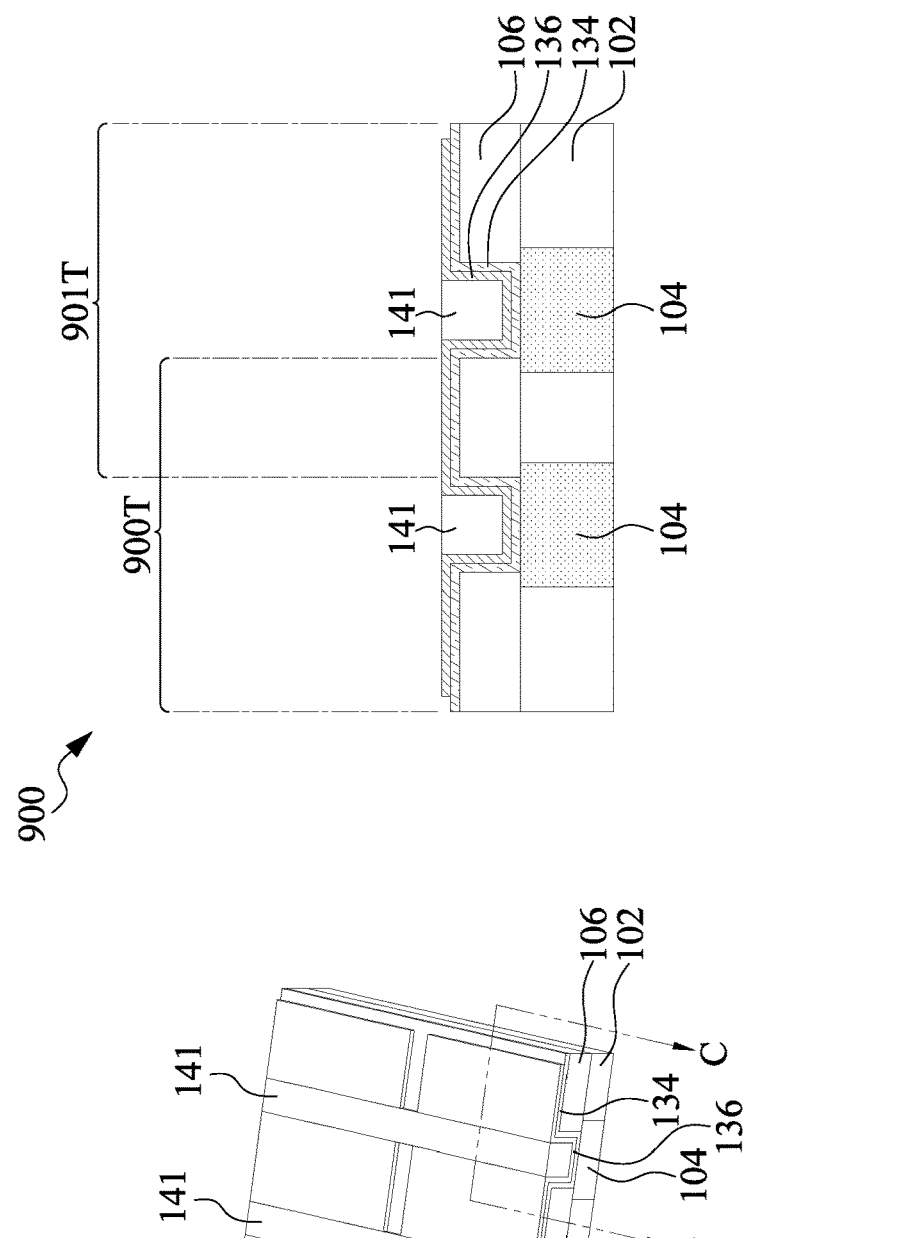

Referring to FIGS. 9E and 10E, a patterning operation is performed on the channel layer 136 to separate the memory device 900 into different memory groups, in which each memory group includes one or more memory units sharing the same channel layer 136. For example, FIG. 9E illustrates the partition of the channel layer of the memory device 900 into four groups with grooves exposing the underlying gate dielectric layer 134, and each group corresponds to two word lines 104. The patterning operation may be performed using lithography and etching operations. In some embodiments, a memory group as shown in FIG. 10E include two memory units having word lines 104 for respective control transistors 900T and 901T.

Figures 9F, 10F:
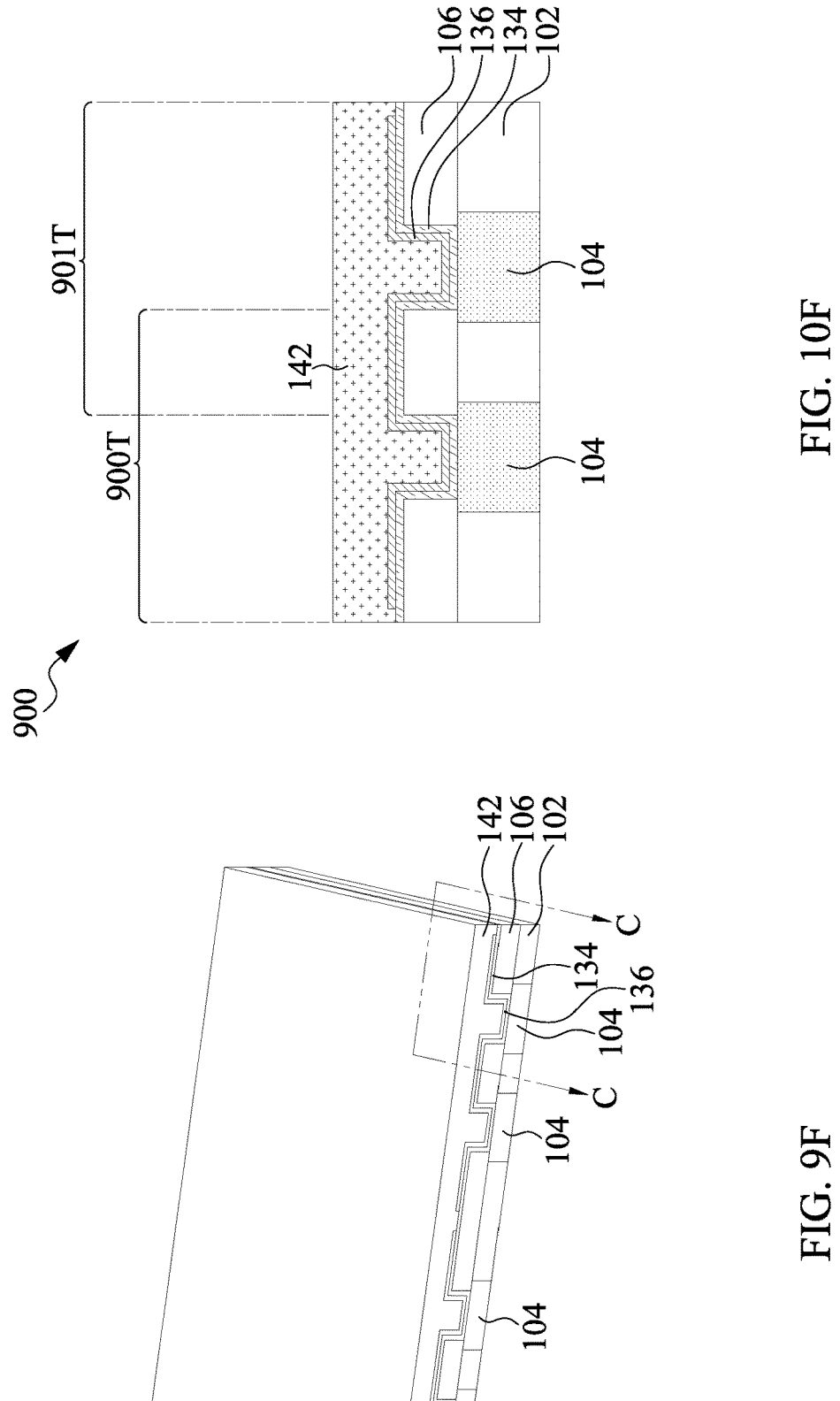

Referring to FIGS. 9F and 10F, an isolation material is deposited over the channel layer 136 and the isolation layer 141 to form an isolation layer 142. The isolation layer 142 may include a similar material to the isolation layer 141. In some embodiments, the isolation layer 142 fills the grooves and covers the gate dielectric layer 134.

Figures 9G, 10G:
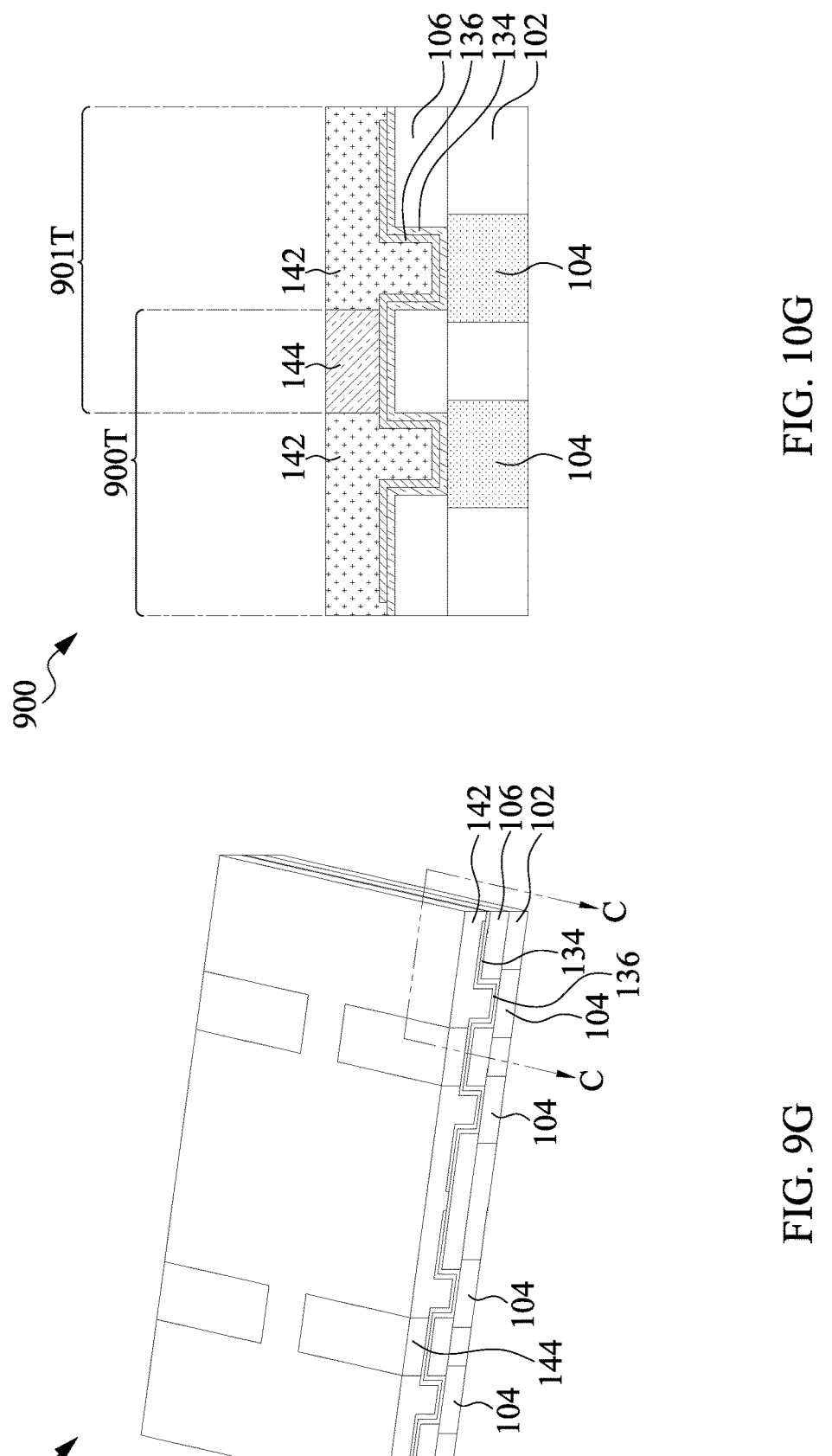

FIGS. 9G and 10G illustrate the formation of the source line 144 in the isolation region 142. The source line 144 is formed over the channel layer 136 between the pair of word lines 104. The material, configuration and method of forming of the source line 144 are similar to those described with reference to FIGS. 2C and 3C.

FIGS. 9H and 10H illustrate the formation of data storage units 900M and 901M associated with the control transistors 900T and 901T in the isolation region 142. Each of the data storage units 900M and 901M is formed on two sides of the source line 144, and are formed on outer sides of the two word lines 104. The data storage unit 900M or 901M may include a conductive layer 242, a data storage layer 244 and a bit lines 146 (e.g., bit line 146A or 146B) formed over the channel layer 136. The material, configuration and method of forming of the data storage unit 900M or 901M are similar to the data storage unit 200M or 500M.

FIGS. 9I and 10I illustrate the formation of the conductive vias and conductive lines to electrically connect to the source line 144 and the bit lines 146. For example, a conductive via 152 and a conductive line 154 is electrically connected to the bit line 146A. Although obscured by other features of FIG. 9I, persons with ordinary skill in the art would appreciate that the memory device 900 includes additional two conductive vias electrically connect the conductive lines 158, 254 to the source line 144 and the bit line 146B, respectively. The materials, configurations, and method of forming of the aforesaid conductive vias and conductive lines are similar to those described with reference to FIGS. 2D to 2E and 3D to 3E. The control transistors 900T and 901T share the source line 144, and therefore the device area of the memory device 900 can be further saved.

Referring to FIG. 10D, the channel layer 136 is formed in the trench T3 in a conformal manner in the isolation layer 106. In some embodiments, the channel layer 136 has a stepped shape or is formed of multiple segments connected to each other and extending in different directions. For example, the channel layer 136 may include a first segment 136A horizontally extending over the gate dielectric layer 134, two second segments 136B connected to the first segment 136A and vertically extending in the isolation layer 106, two third segments 136C connected to the corresponding second segments 136B and horizontally extending in the isolation layer 122, two fourth segments 136D connected to the corresponding third segments 136C and vertically extending in the isolation layer 106, and two fifth segments 136E connected to the corresponding fourth segments 136D and vertically horizontally over the isolation layer 106.

In some embodiments, the horizontally extending segments, e.g., the first segment 136A, the third segments 136C and fifth segments 136E are parallel to each other, while the vertically extending segments, e.g., the second segments 136B and the fourth segments 136D are parallel to each other.

Since the conductive layer 132 and the gate dielectric layer 134/data storage layer 184 are formed in a conformal manner similar to the channel layer 136, the conductive layer 132 and the gate dielectric layer 134/data storage layer 184 may also have stepped shapes and are formed of connected segments in a configuration similar to that of the channel layer 136.

As discussed previously, the channel layer 136 is increased in length in the horizontal and vertical directions due to the design of extended segments 136B to 136E, and thus the short channel effect can be eliminated with only minor increase in the device area. The channel control performance of the control transistor 900T or 901T can be improved without increasing the coupling capacitance between the word line 104 and the source line 144 or the bit line 146. The device speed can be enhanced accordingly.

Figures 11A, 11B:
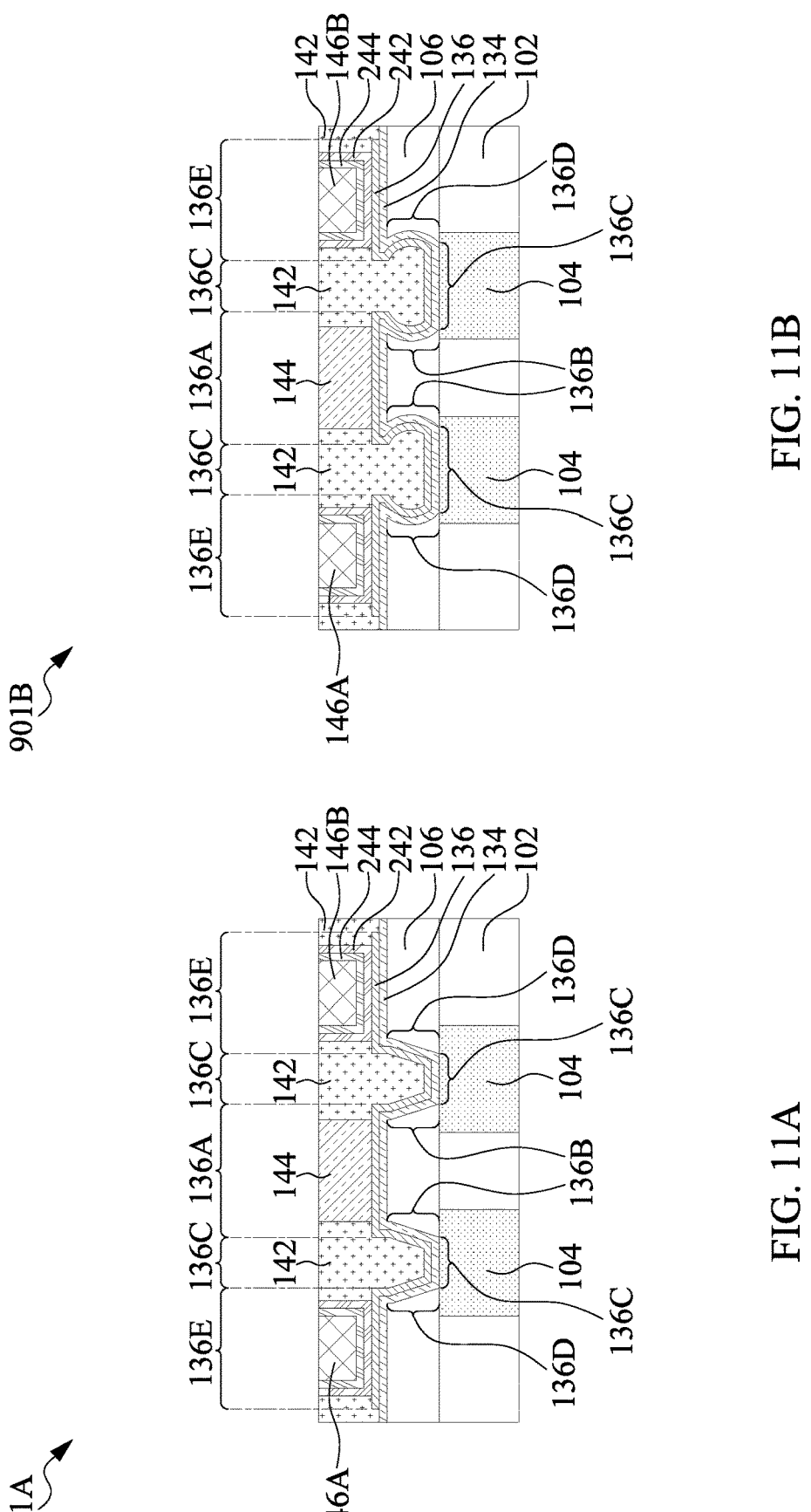
FIGS. 11A to 11C are cross-sectional views of various memory devices, in accordance with some embodiments of the present disclosure.
Figure 11C:
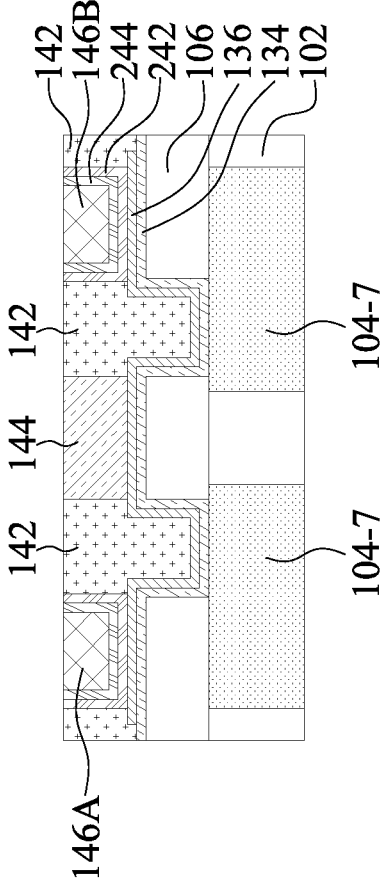
Figure 11C:

FIGS. 11A to 11C are cross-sectional views of various memory devices 901A to 901C, in accordance with some embodiments of the present disclosure. The memory devise 901A to 901C are similar to the memory device 900, and these similar features are omitted herein for brevity. The memory devices 901A and 901B differ from the memory device 900 mainly in the configuration and shape of the trench T3 from a cross-sectional view. As a result, the subsequently-formed conductive layer 132, the gate dielectric layer 134 and the channel layer 136 are formed with different shapes according to the trench T3. Referring to FIG. 8A, in the memory device 901A, the segments 136B or 136D include two or more sub-segments connected to each other, in which the sub-segments extend in different directions. For example, each of the segments 136B or 136D have an upper sub-segment extending vertically and a lower sub-segment tapered toward the word lines 104. Referring to FIG. 8B, the segments 136B or 136D are curved instead of being straight. The different shapes of the segments 136B or 136D may aid in the deposition performance or the effective length of the channel layer 136.

The memory device 901C differs from the memory device 900 mainly in the configuration and shape of the word line 104 from a cross-sectional view. Referring to FIG. 11C, the word lines 104-7 of the memory device 901C have at least a portion extending beyond the width of the bottom surface of the respective segments 136C and overlapping the channel layer 136 in a vertical direction. The variant shown in the word lines 104-7 may seek better balance between the control capability on the channel layer 136 and low coupling capacitance induced by the word lines 104-7. The performance of the memory device 900 may be improved.

FIGS. 12A to 12F are perspective views of intermediate stages of a method of forming a memory device 1200, in accordance with some embodiments of the present disclosure. FIGS. 13A to 13F are cross-sectional views taken from the section line DD of the corresponding FIGS. 12A to 12F, in accordance with some embodiments of the present disclosure. The memory device 1200 is similar to the memory device 200, 500 or 900, and these similar features are not repeated herein for brevity.

Figure 13A:
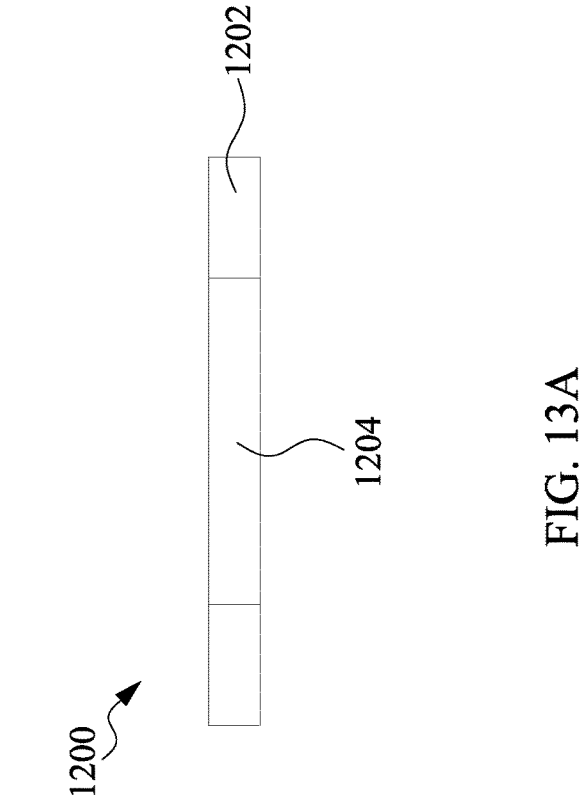
FIGS. 13A to 13F are cross-sectional views taken from the section line DD of the corresponding FIGS. 12A to 12F, in accordance with some embodiments of the present disclosure.
Figure 12A:
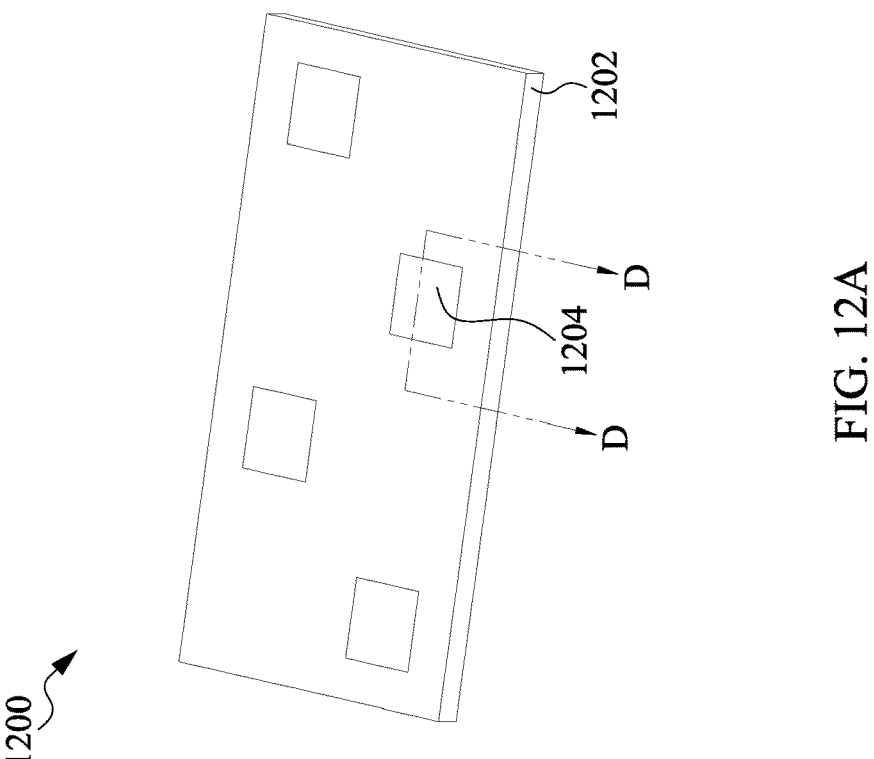
FIGS. 12A to 12F are perspective views of intermediate stages of a method of forming a memory device, in accordance with some embodiments of the present disclosure.

Referring to FIGS. 12A and 13A, an isolation layer 1202 is formed in a bottom metallization layer, e.g., the metallization layer M3 shown in FIG. 1. The isolation layer 1202 is patterned to form openings (not separately shown) using, e.g., lithography and etching operations. The openings are filled with a conductive material to form conductive vias 1204. The materials, configurations and method of forming of the isolation layer 1202 and conductive vias 1204 are similar to those of the substrate 102 and the conductive vias 152, respectively.

Figure 13B:
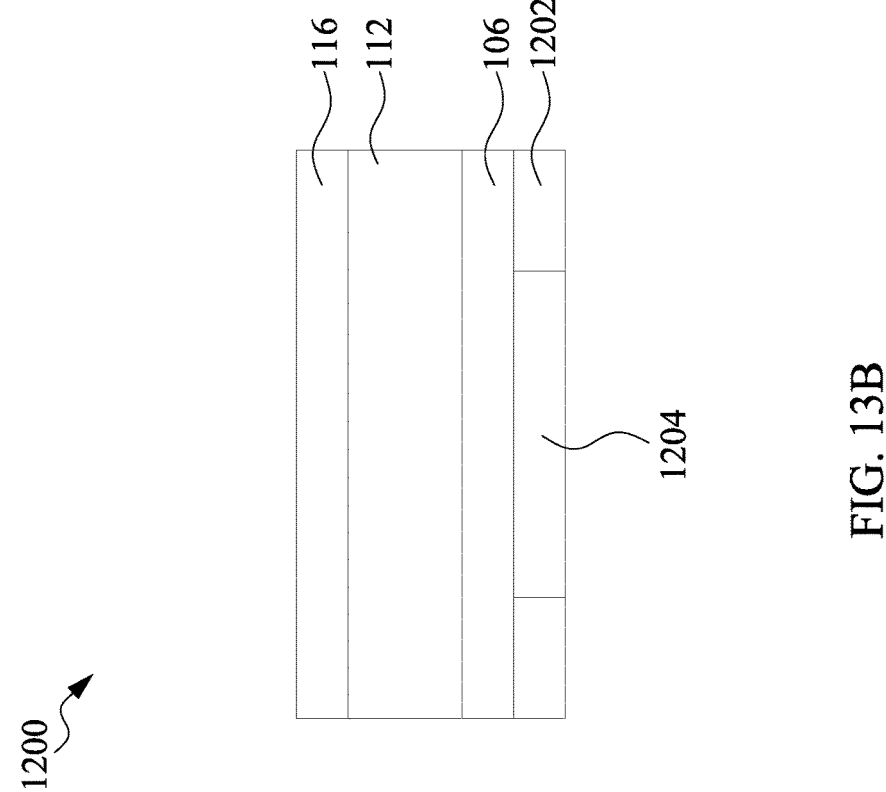
Figure 12B:
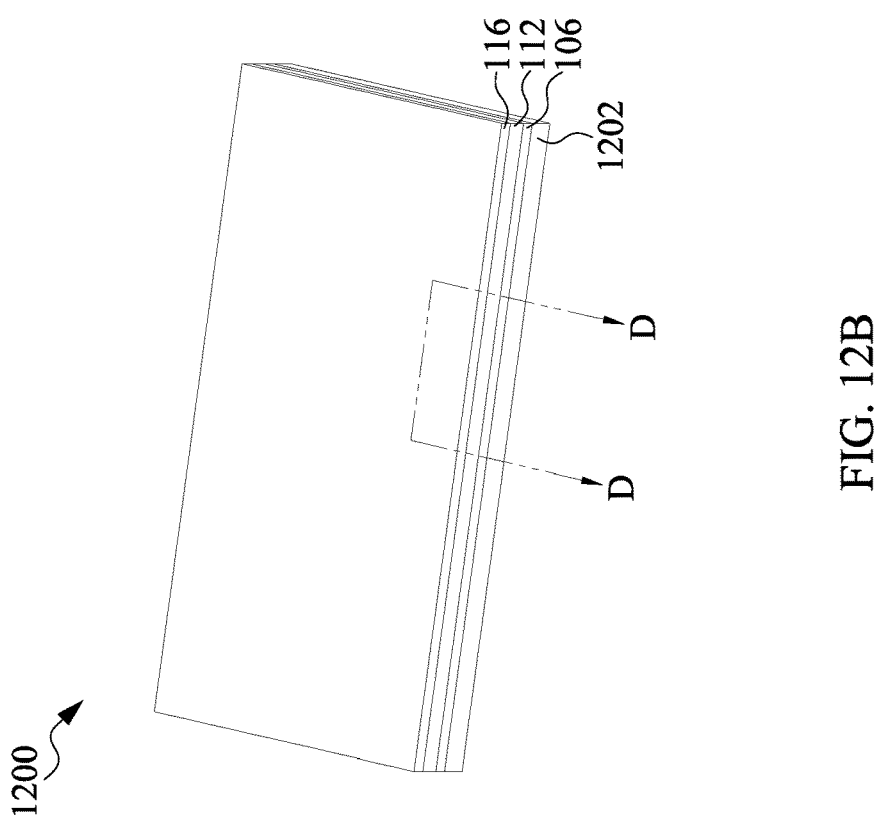
Figure 13C:
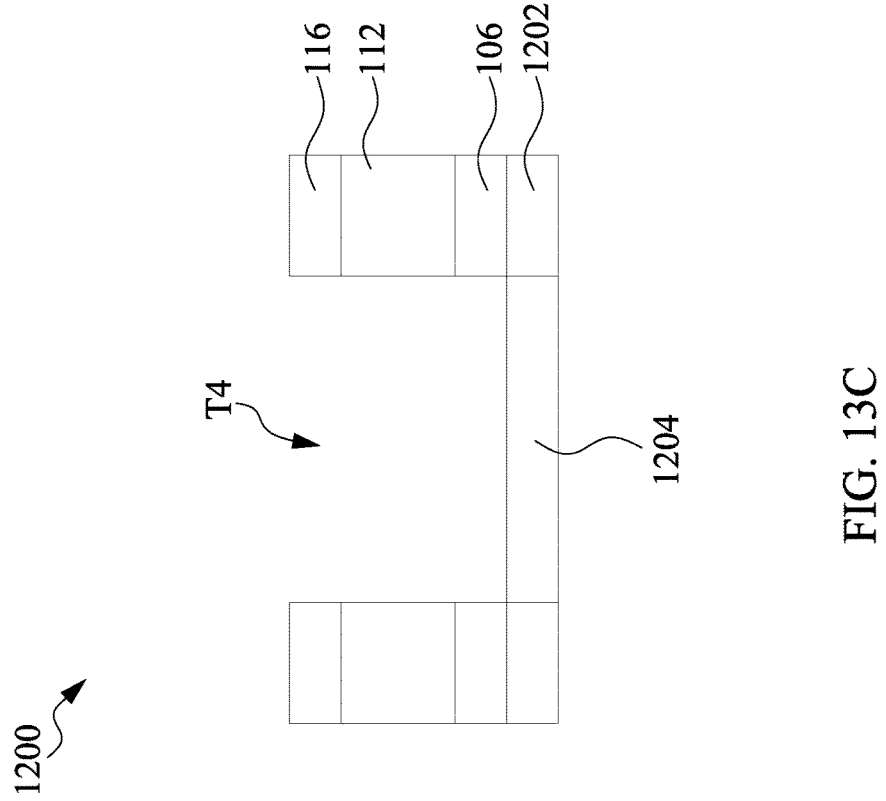
Figure 12C:
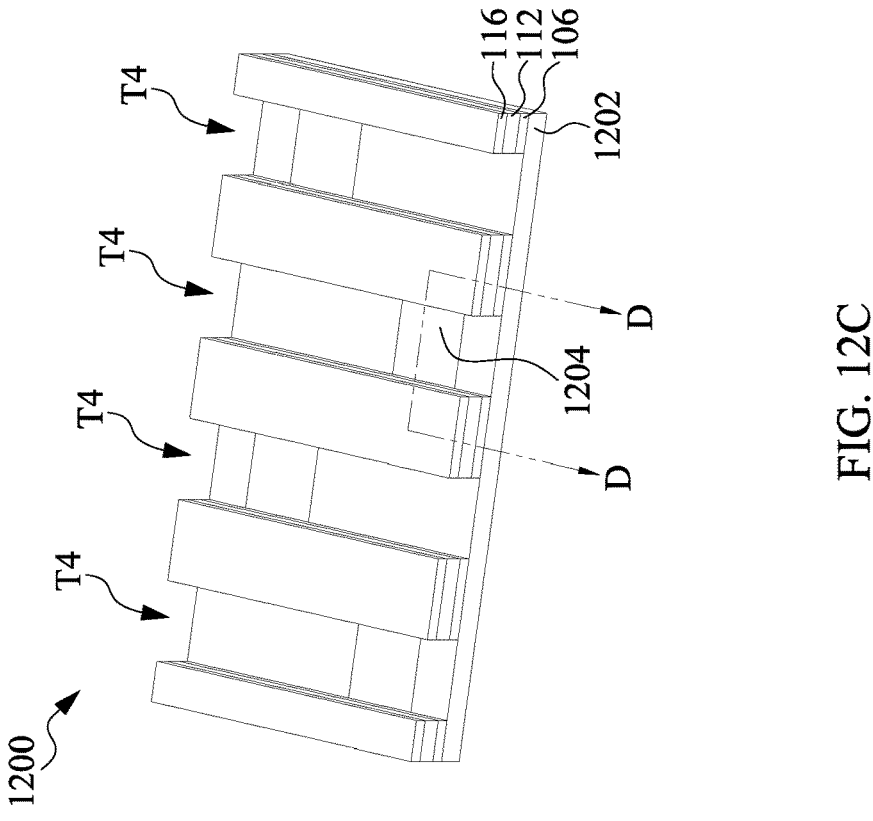

Referring to FIGS. 12B and 13B, a middle metallization layer is formed over the bottom metallization layer. In some embodiments, isolation layers 106, 112 and 116 are deposited over the isolation layer 1202 and the conductive vias 1204. Referring to FIGS. 12C and 13C, a patterning operation including an etching operation is performed through the isolation layers 116, 112 and 106 to form trenches T4. The conductive vias 1204 are exposed during the patterning operation. The trenches T4 may have a width greater than or substantially equal to a width of the conductive via 1204.

Figure 13D:
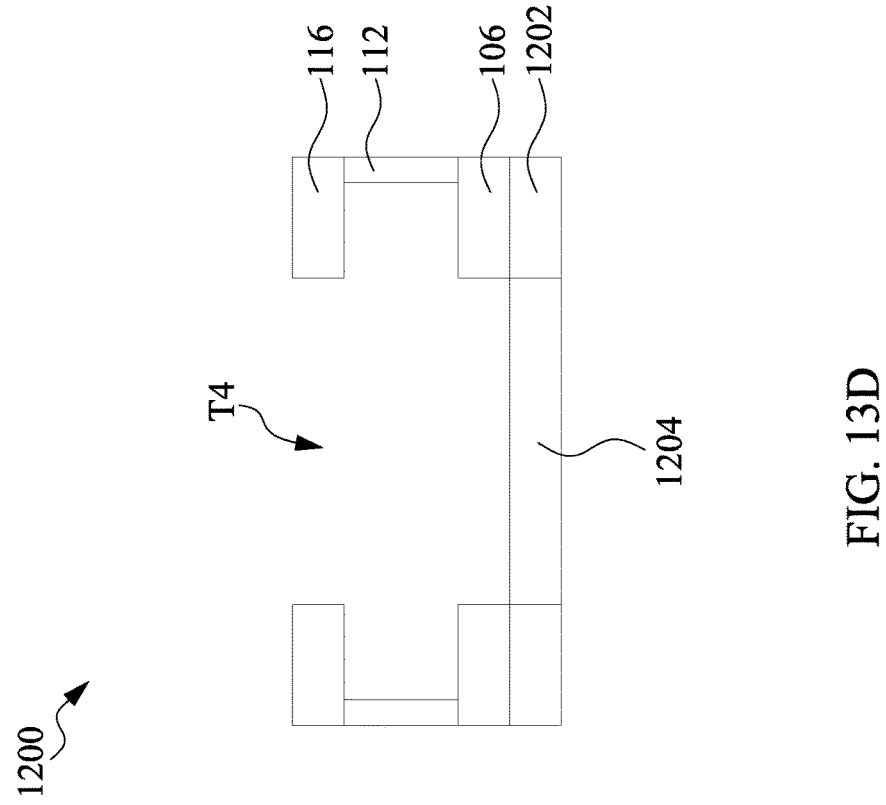
Figure 12D:
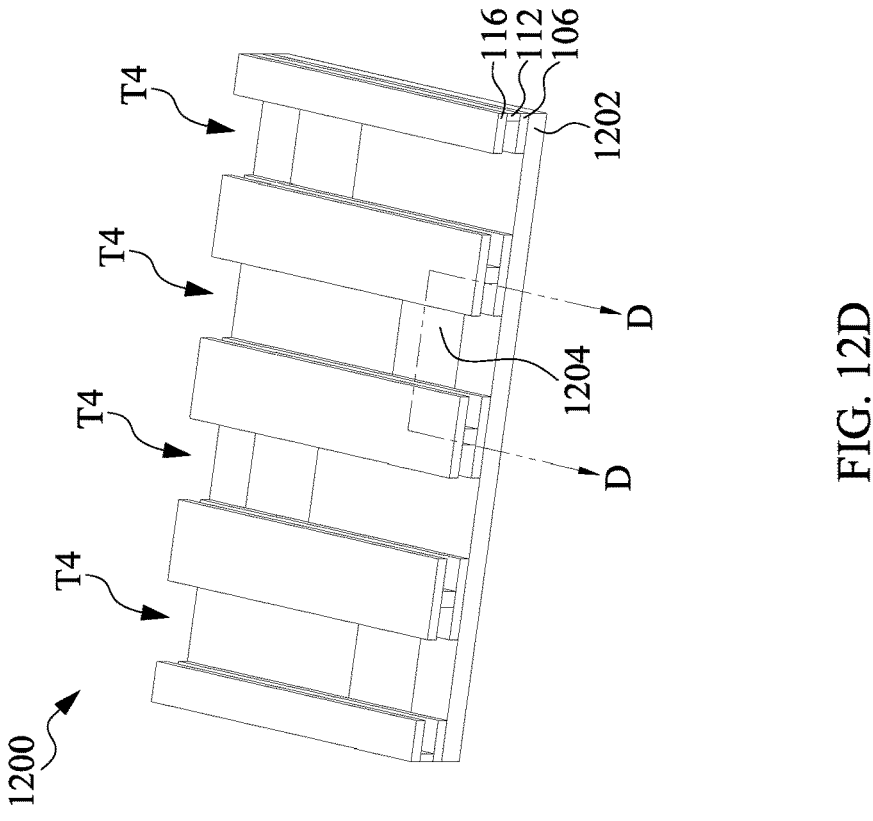

FIGS. 12D and 13D, illustrate another etching operation on the isolation layer 112 through the trenches T4. The isolation layers 106 and 116 are kept substantially intact during the etching operation due to sufficient etching selectivity of the isolation layer 112 with respect to the isolation layer 105 and 116. The etching operation may be performed by a wet etch. As a result, each of the trenches T4 includes a top portion, a bottom portion and a middle portion at the isolation layers 116, 106 and 112, respectively. The middle portion is greater than the top portion and the middle portion.

Figure 13E:
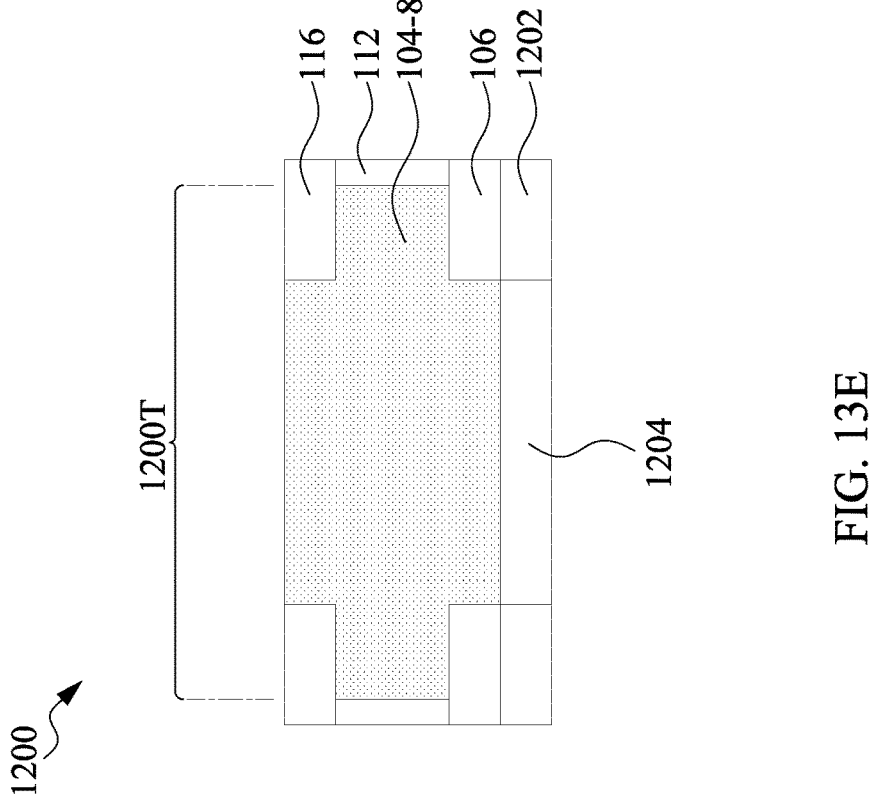
Figure 12E:
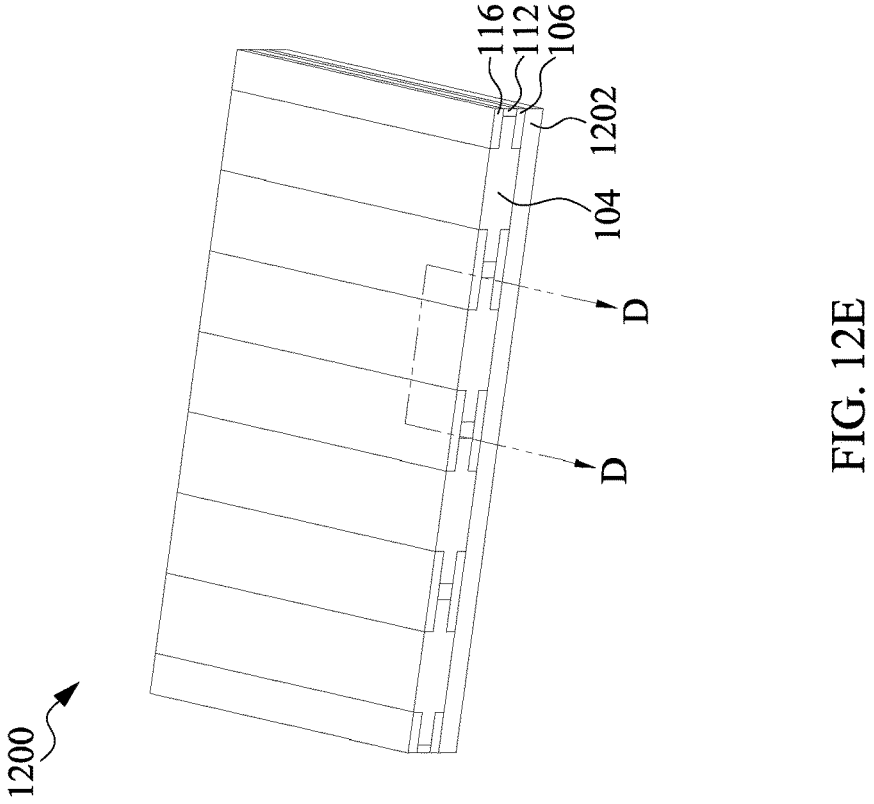

Referring to FIGS. 12E and 13E, word lines 104-8 are deposited in the trenches T4 over the conductive vias 1204. The word lines 104-8 may have an upper surface level with the upper surface of the isolation layer 116. The word lines 104-8 are therefore have a cross shape. Each of the word lines 104-8 may serve as a gate region of the respective control transistor 1200T of a memory unit in the memory device 1200.

Figure 13F:
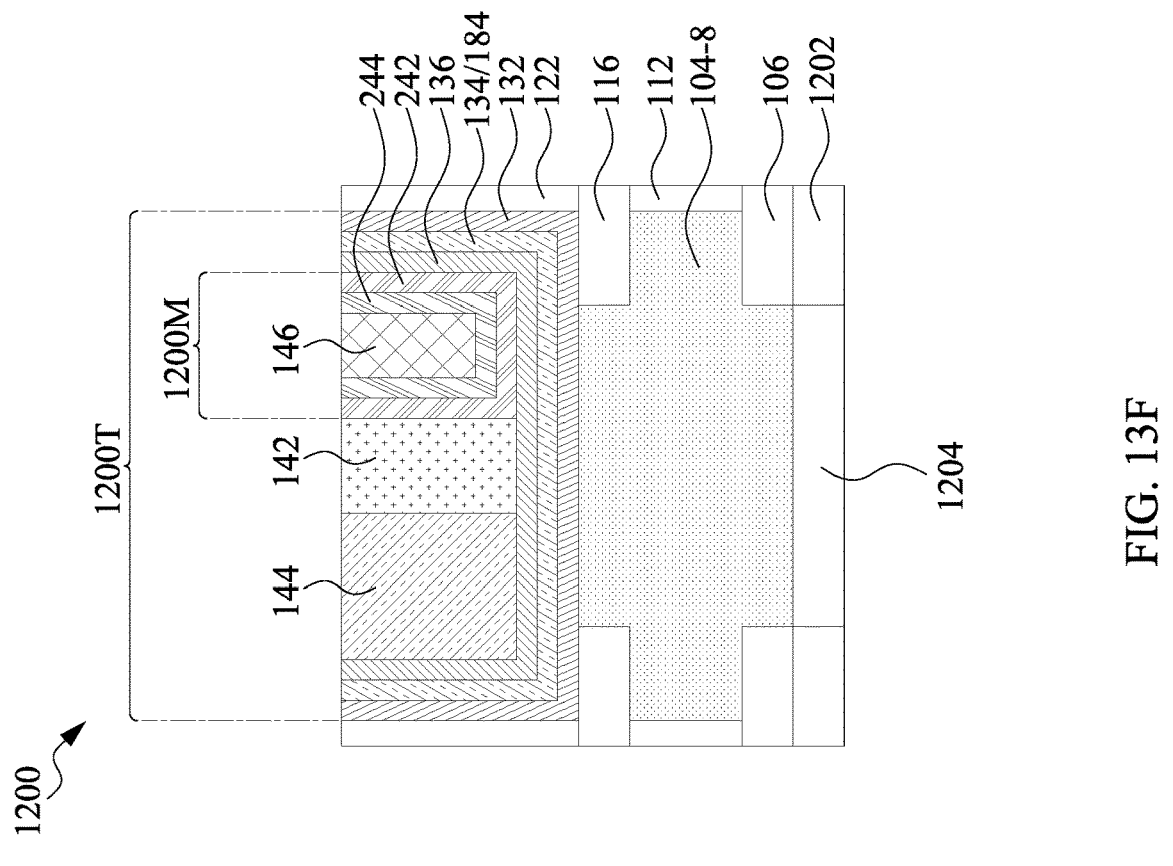
Figure 12F:
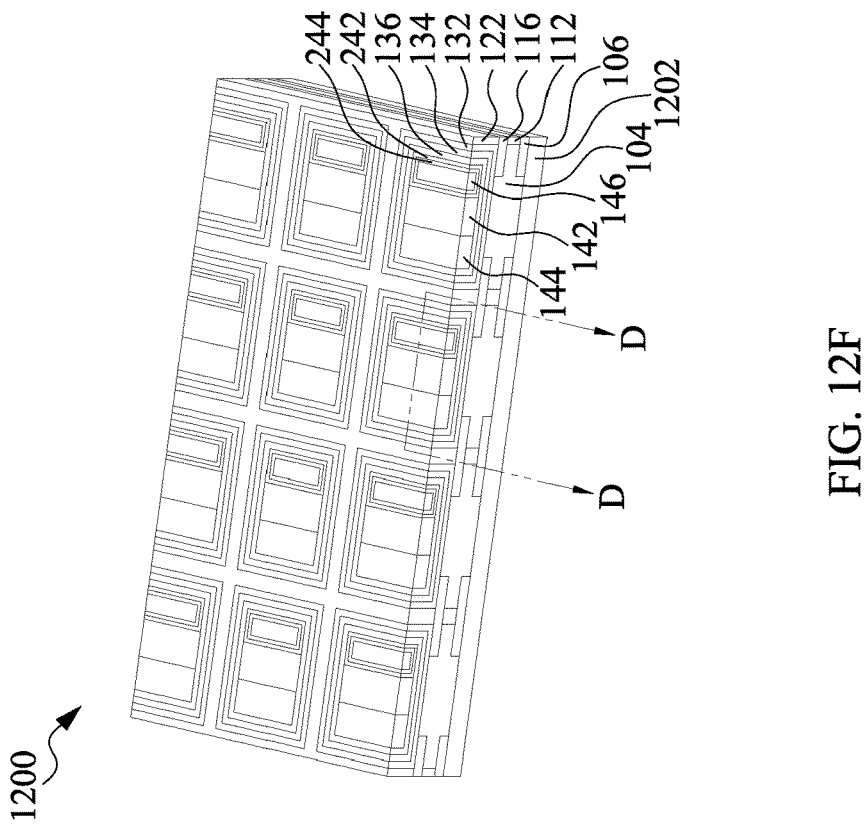

Referring to FIGS. 12F and 13F, the remaining part of the control transistor 1200T, e.g., a conductive layer 132, a gate dielectric layer 134, an isolation region 142, and a source line 144, and a memory unit 1200M, which may include the conductive layer 242, the data storage layer 244, and the bit lines 146, are successively formed over the word lines 104-8. The materials, configuration and method of forming of the aforesaid layers are similar to those described with reference to FIGS. 2A to 4A and 2B to 4B.

Figures 14A, 14B:
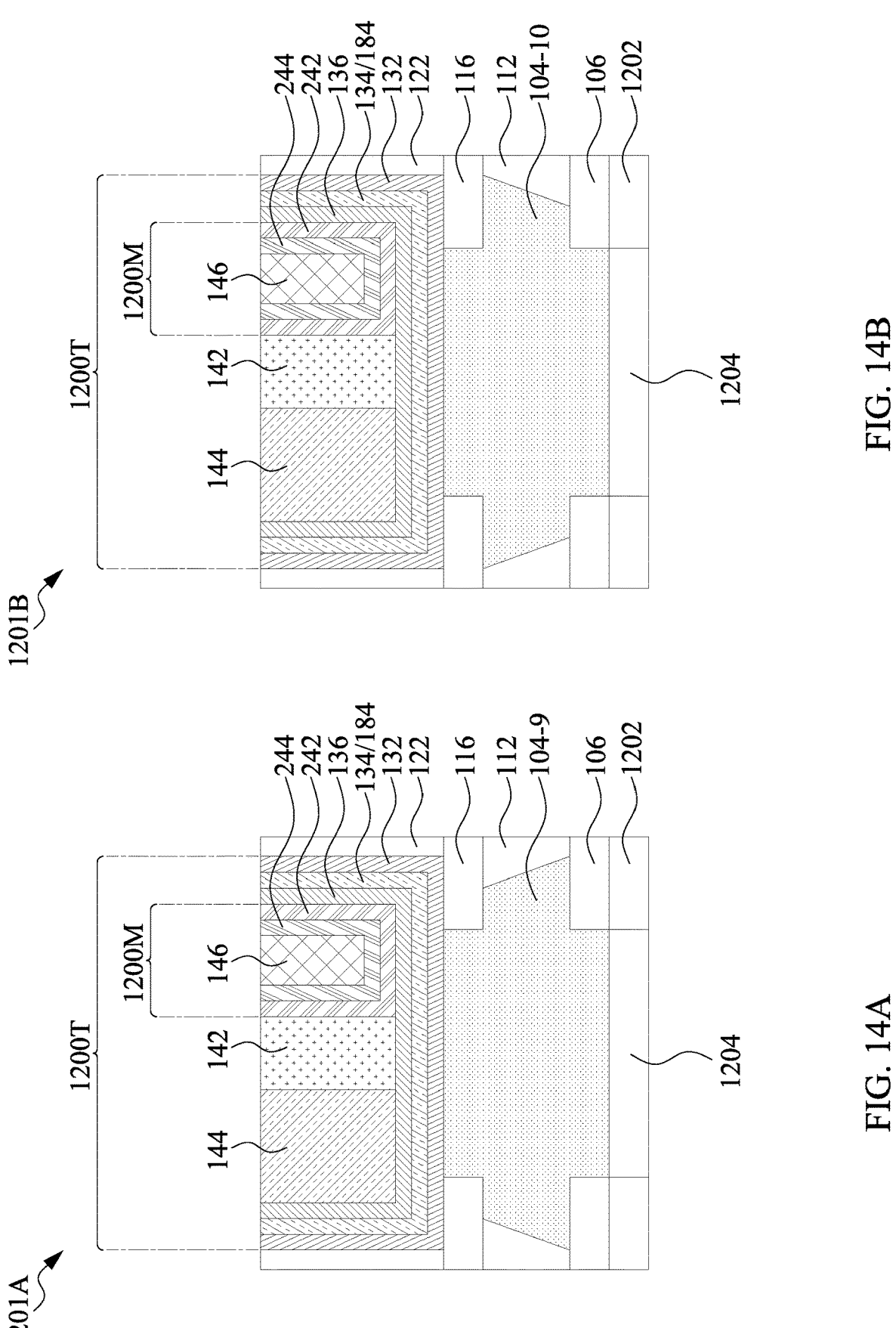
FIGS. 14A to 14E are cross-sectional views of various memory devices, in accordance with some embodiments of the present disclosure.

FIGS. 14A to 14E are cross-sectional views of various memory devices 1201A to 1201E, in accordance with some embodiments of the present disclosure. The memory devise 1201A to 1201E are similar to the memory device 1200, and these similar features are omitted herein for brevity. The memory devices 1201A to 1201E differ from the memory device 1200 mainly in the configuration and shape of the trench T4 from a cross-sectional view. As a result, the word lines 104-8 are formed with different shapes according to the trench T4. Referring to FIGS. 14A and 14B, the hands of word lines 104-9 and 104-10 have slated sidewalls, in which the slated sidewalls may be tapered from the bottom surface to the upper surface of the word lines 104-9 (FIG. 14A), or tapered from the upper surface to the bottom surface of the word lines 104-10 (FIG. 14B).

Figures 14C, 14D:
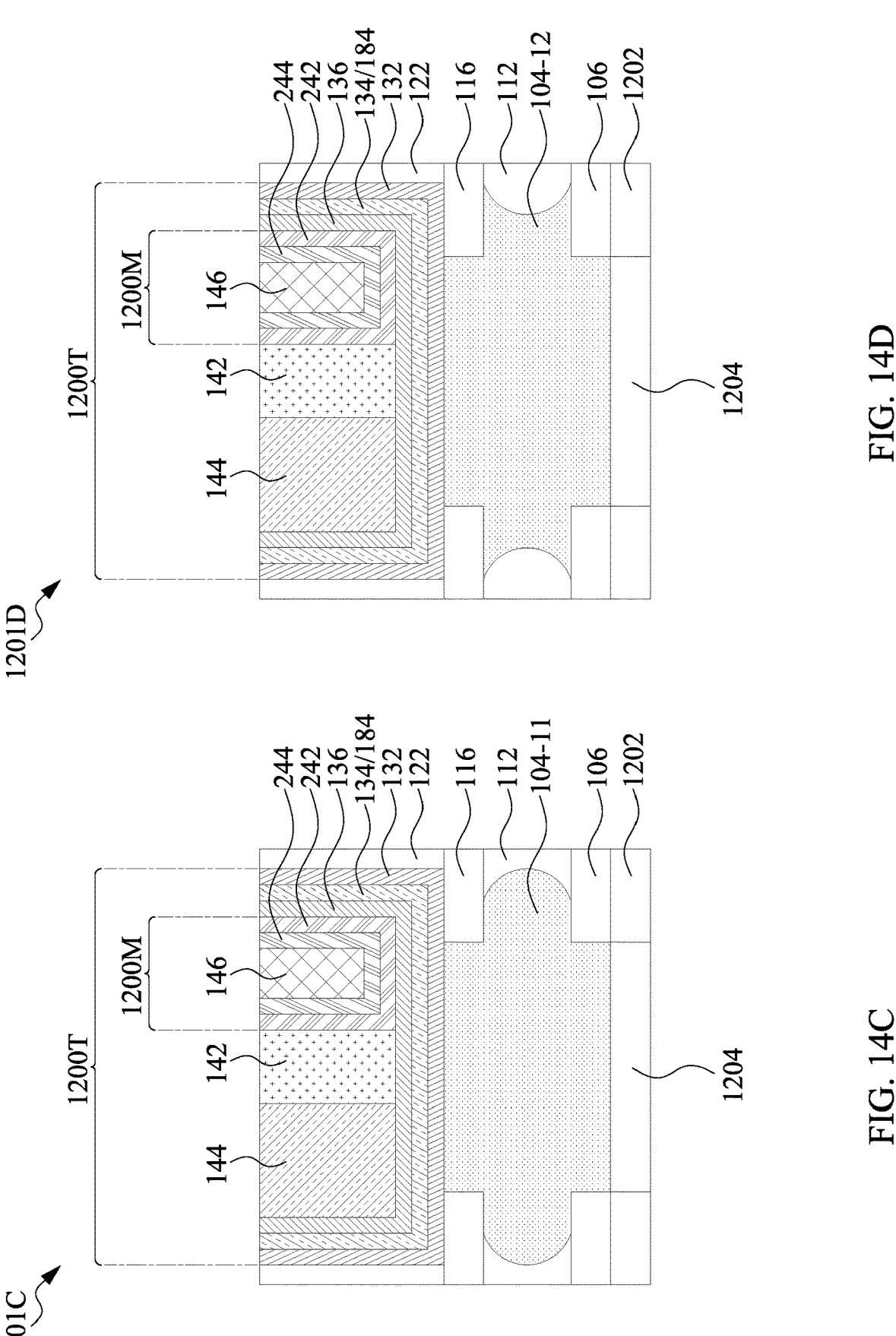
Figure 14E:
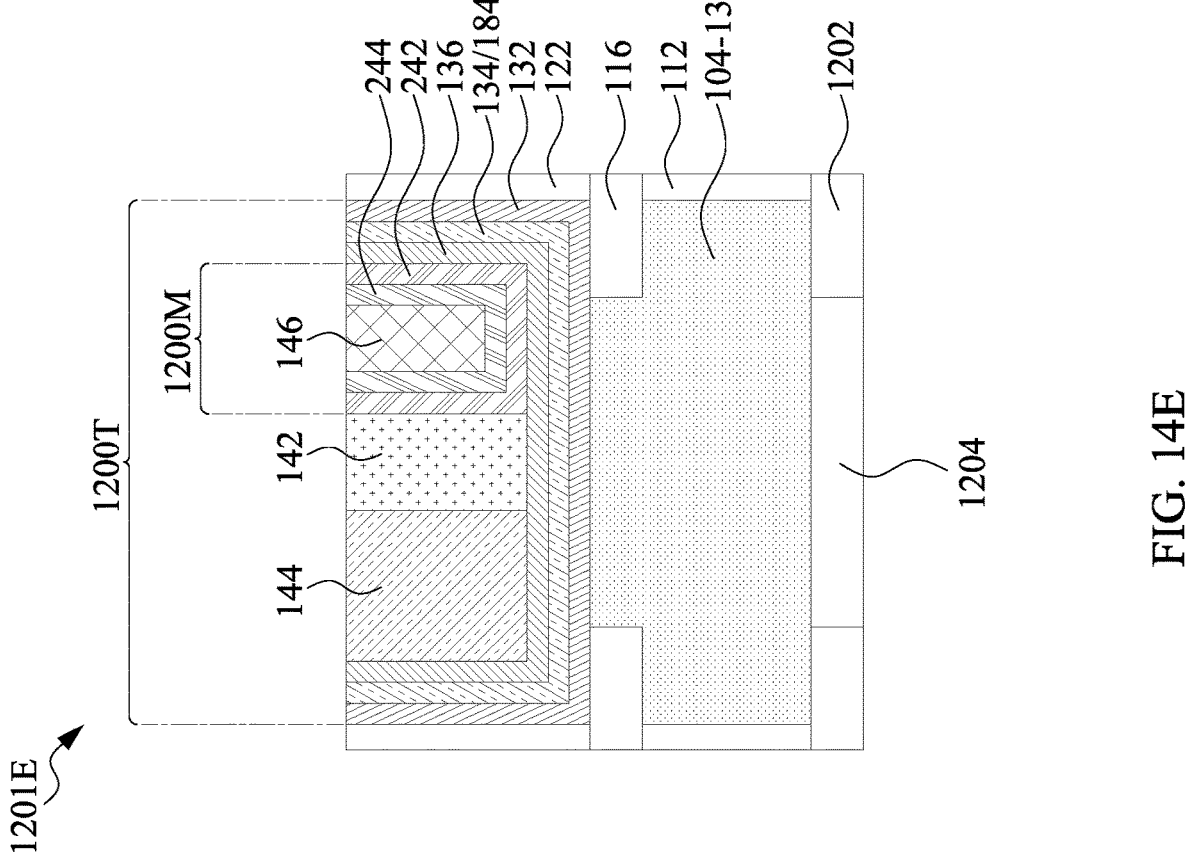

Referring to FIGS. 14C and 14D, the hands of word lines 104-11 and 104-12 have curved sidewalk, in which the curved sidewalls may be convex (FIG. 14C) or concave (FIG. 14D). Referring to FIG. 14E, the word line 104-13 has an inverted T-shape.

Each of the word lines 104-8 to 104-13 has at least a middle portion wider than the upper portion, in which the middle portion overlaps the channel layer 136 in a vertical direction. The variants shown in the word lines 104-8 to 104-13 may seek better balance between the control capability on the channel layer 136 and low coupling capacitance induced by the word lines 104. The performance of the memory device 1200 may be improved.

FIGS. 15A to 15E are cross-sectional views of intermediate stages of a method of forming a memory device 1500, in accordance with some embodiments of the present disclosure. The memory device 1500 is similar to the memory device 200, 500, 900 or 1200, and these similar features are not repeated herein for brevity.

Figure 15B:
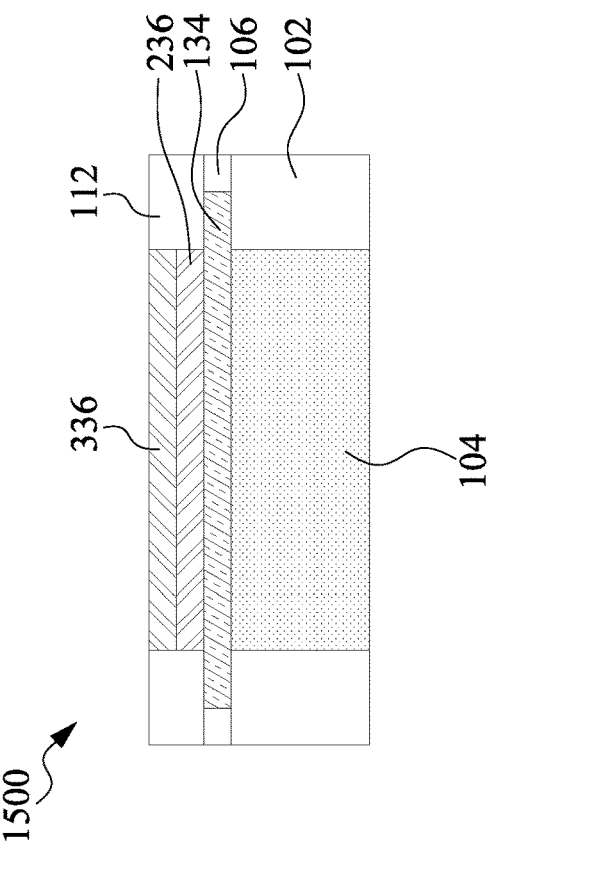
FIGS. 15A to 15E are cross-sectional views of intermediate stages of a method of forming a memory device, in accordance with some embodiments of the present disclosure.
Figure 15B:
Figure 15A:
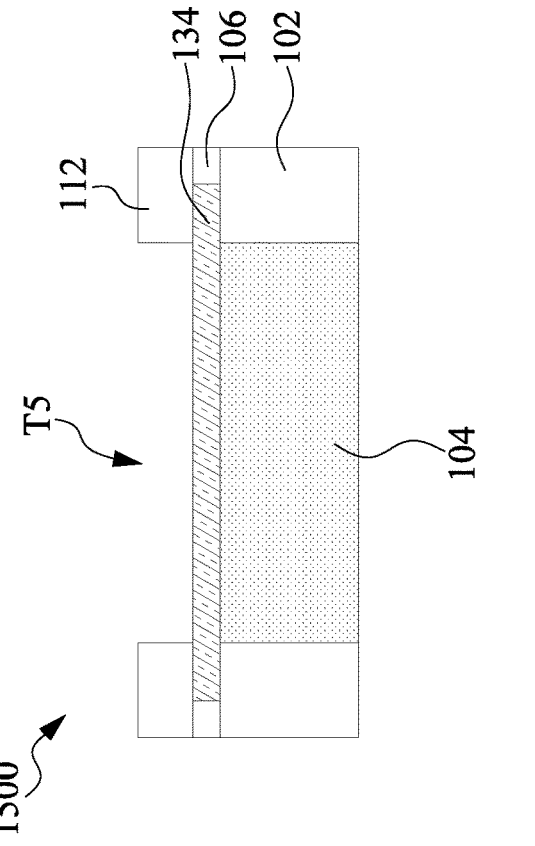

Referring to FIG. 15A, a substrate 102 is formed in a bottom metallization layer, e.g., the metallization layer M3 shown in FIG. 1. The substrate 102 is patterned to form a trench (not separately shown) using, e.g., lithography and etching operations. The trench are filled with a conductive material to form a word line 104.

A middle metallization layer is formed over the bottom metallization layer where the substrate 102 resides. In some embodiments, an isolation layer 106 is formed over the substrate 102 and the word lines 104. A patterning operation including an etching operation is performed to form an opening the isolation layer 106. The word lines 104 are exposed during the patterning operation. The opening may have a width greater than or substantially equal to a width of the word line 104. A gate dielectric layer 134 is formed in the opening of the isolation layer 106. The materials, configuration and method of forming of the gate dielectric layer 134 are similar to the gate dielectric layer 134 described with reference to FIGS. 2B and 3B. Another isolation layer 112 is formed over the isolation layer 106 and the gate dielectric layer 134. The isolation layer 112 is patterned to form a trench T5 to expose the gate dielectric layer 134.

Referring to FIG. 15B, a first channel portion 236 and a second channel portion 336 are deposited in the trench T5 over the gate dielectric layer. In some embodiments, the first channel portion 236 and the second channel portion 336 are doped with the same conductivity type, e.g., P-type or N-type. In some embodiments, the first channel portion 236 and the second channel portion 336 have substantially equal or different doping concentrations. For example, the second channel portion 336 has a doping concentration greater than the doping concentration of the first channel portion 236.

Figures 15C, 15D:
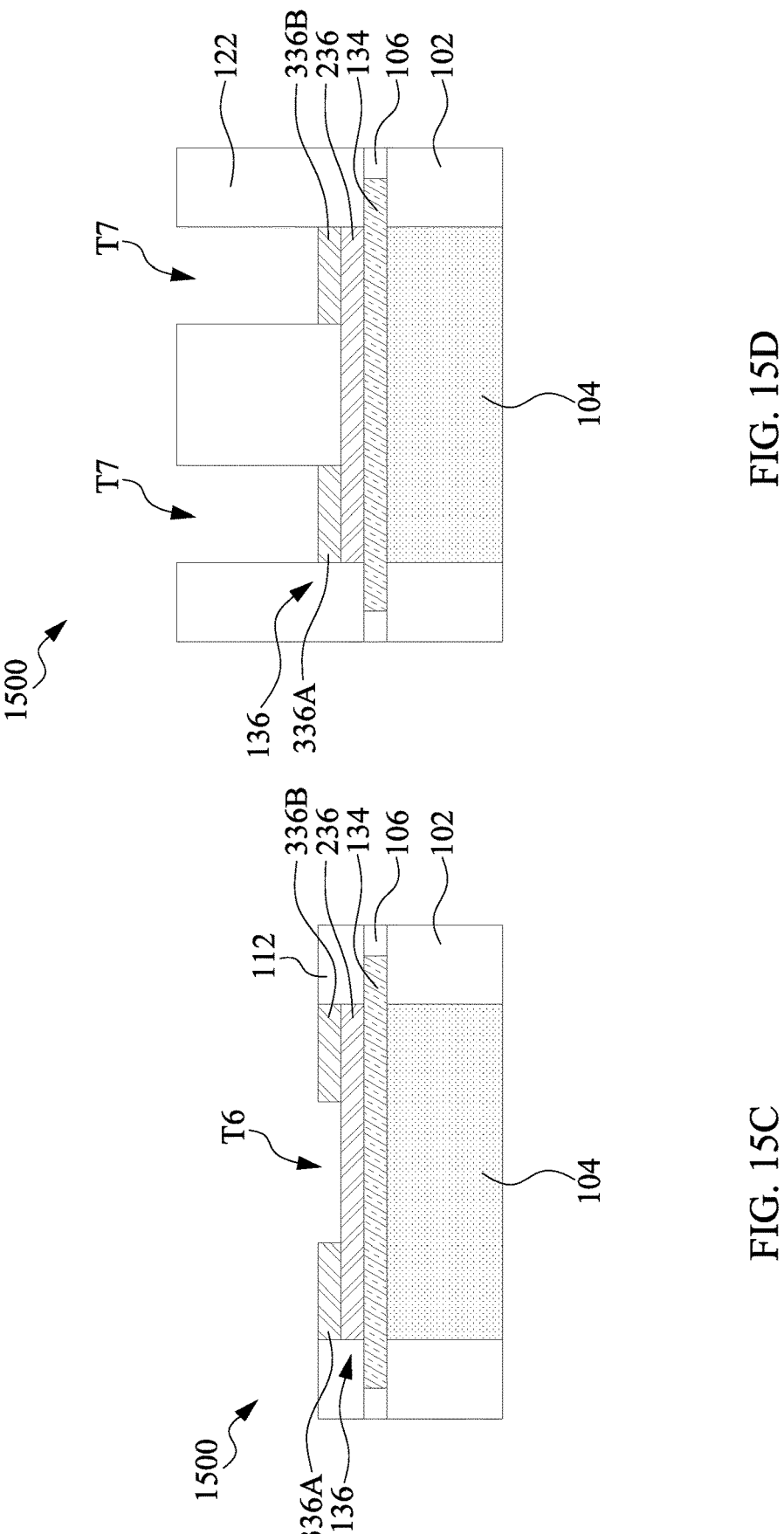

Referring to FIG. 15C, a patterning operation is performed on the second channel portion 336 to etch a trench T6 in the second channel portion 336. As a result, the second channel portions 336A and 336B are left over the first channel portion 236. In some embodiments, the patterning operation includes lithography and etching operations. The etching operation may include a dry etch, a wet etch, an RIE, or the like. The first channel portion 236 and the etched second channel portions 336A, 336B are connected to form a U-shaped channel layer 136, in which the first channel portion 236 is regarded a horizontal segment of the channel layer 136, while the second channel portions 336A, 336B are regarded as vertical segments of the channel layer 136.

Figure 15E:
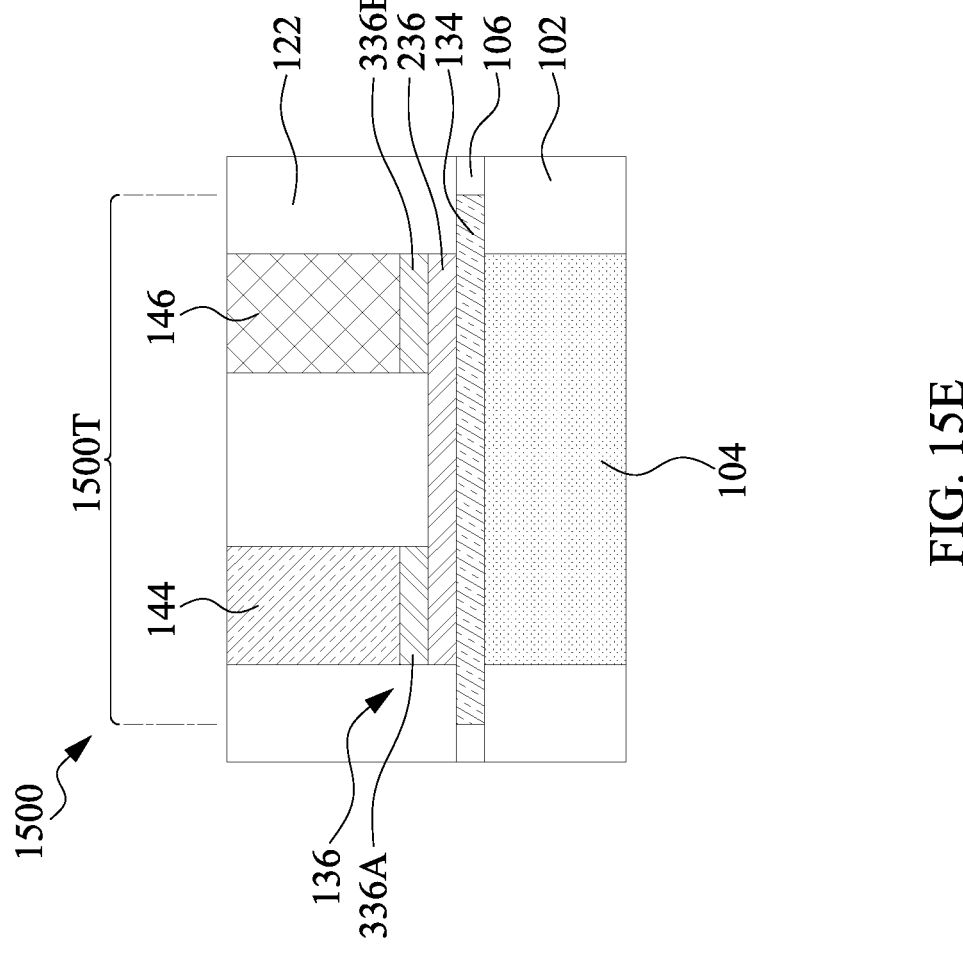

Referring to FIG. 15D, a dielectric material is formed over the second channel portions 336A, 336B and the trench T6 to form an isolation layer 122. The material and forming method of the isolation layer 122 may be similar to those of the isolation layers 106 and 112. Subsequently, a patterning operation is performed on the isolation layer 122 to etch trenches T7 that expose the second channel portions 336A, 336B. Referring to FIG. 15E, a source line 144 and a bit line 146 are deposited in the trenches T7 over the second channel portions 336A, 336B. A control transistor 1500T of the memory device 1500 is thus formed. As shown in FIG. 15E, the second channel portions 336A, 336B are directly below the source line 144 and the bit line 146, respectively. In some embodiments, the sidewalls of the second channel portions 336A, 336B are aligned with the sidewalls of the source line 144 and the bit line 146, respectively.

The memory device 1500 provide advantages. The channel layer 136 of the control transistor 1500T is formed of the first channel portion 236 and the second channel portions 336A, 336B, in which the second channel portions 336A and 336B effectively extend the channel length of the first channel portion 236. The short channel effect can be eliminated accordingly without increasing the device area. In some embodiments, the sidewalls of the word line 104 are aligned with the outer sidewalk of the second channel portions 236A and 236B to enhance the control capability of the word line 104 on the channel layer 136.

Figures 16A, 16B:
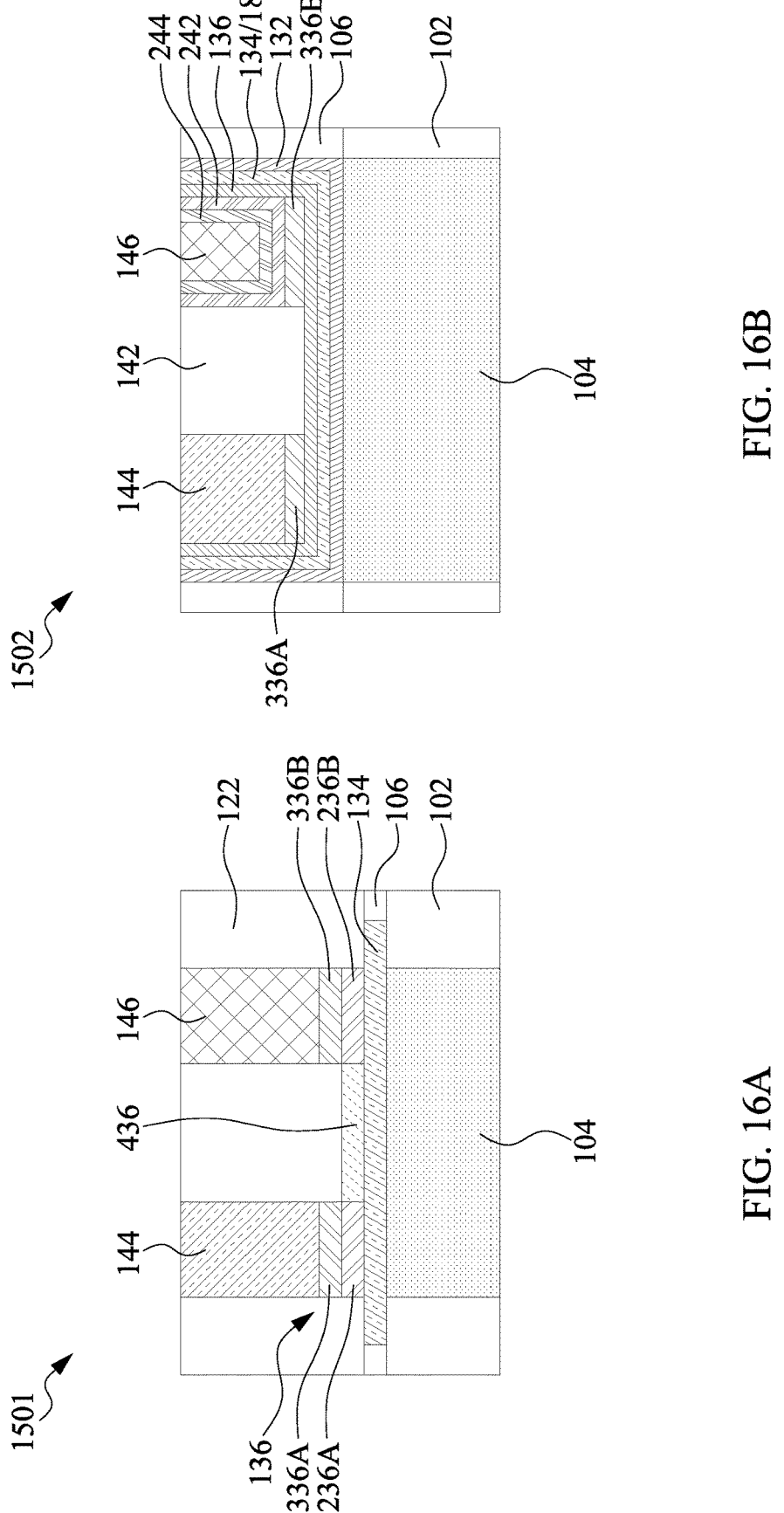
FIGS. 16A and 16B are cross-sectional views of various memory devices, in accordance with some embodiments of the present disclosure.

FIGS. 16A and 16B are cross-sectional view of memory devices 1501 and 1502, in accordance with some embodiments of the present disclosure. The memory devices 1501 and 1502 are similar to the memory device 1500, and these similar features are not repeated herein for brevity. Referring to FIG. 16A, the first channel portion 236 further includes different portions 236A, 236B and 436, in which the channel portion 436 has a doping concentration less than the doping concentration of the channel portions 236A, 236B. In some embodiments, the doping concentration gradient formed by the channel portion 436, 236A/236B, and 336A/336B further reduces the short channel effect of the channel layer 136.

Referring to FIGS. 3B, 4F, 8D, and 10H, the channel layer 136 can be modified by taking the U-shaped channel layer 136 shown in FIG. 15E into consideration, e.g., the channel layer 136 may include two vertical segments 336A and 336B. In some embodiments, the channel layer 136 includes two types of vertical segments, i.e., first type vertical segments on the sidewalls of the source line 144 or the bit line 146, and second type vertical segments (e.g., portions 336A and 336B) directly below and covered by the source line 144 or the bit line 146.

Figure 17A:
FIGS. 17A to 17J are perspective views of intermediate stages of a method of forming a memory device, in accordance with some embodiments of the present disclosure.

FIGS. 17A to 17J are perspective views of intermediate stages of a method of forming a memory device 1700, in accordance with some embodiments of the present disclosure. Referring to FIG. 17A, a substrate 302 is formed in a bottom metallization layer, e.g., the metallization layer M3 shown in FIG. 1. The material and method of forming of the substrate 302 is similar to those of the substrate 102 discussed previously. The substrate 302 is patterned to form a trench (not separately shown) using, e.g., lithography and etching operations. The trench are filled with a conductive material to form conductive vias or conductive lines (not separately shown). An isolation layer stack is formed over the substrate 302. A plurality of isolation layers 102 and are deposited alternatingly with a plurality of isolation layers 106. In some embodiments, the isolation layer 102 has a dielectric material different from the isolation layer 106.

Figure 17B:
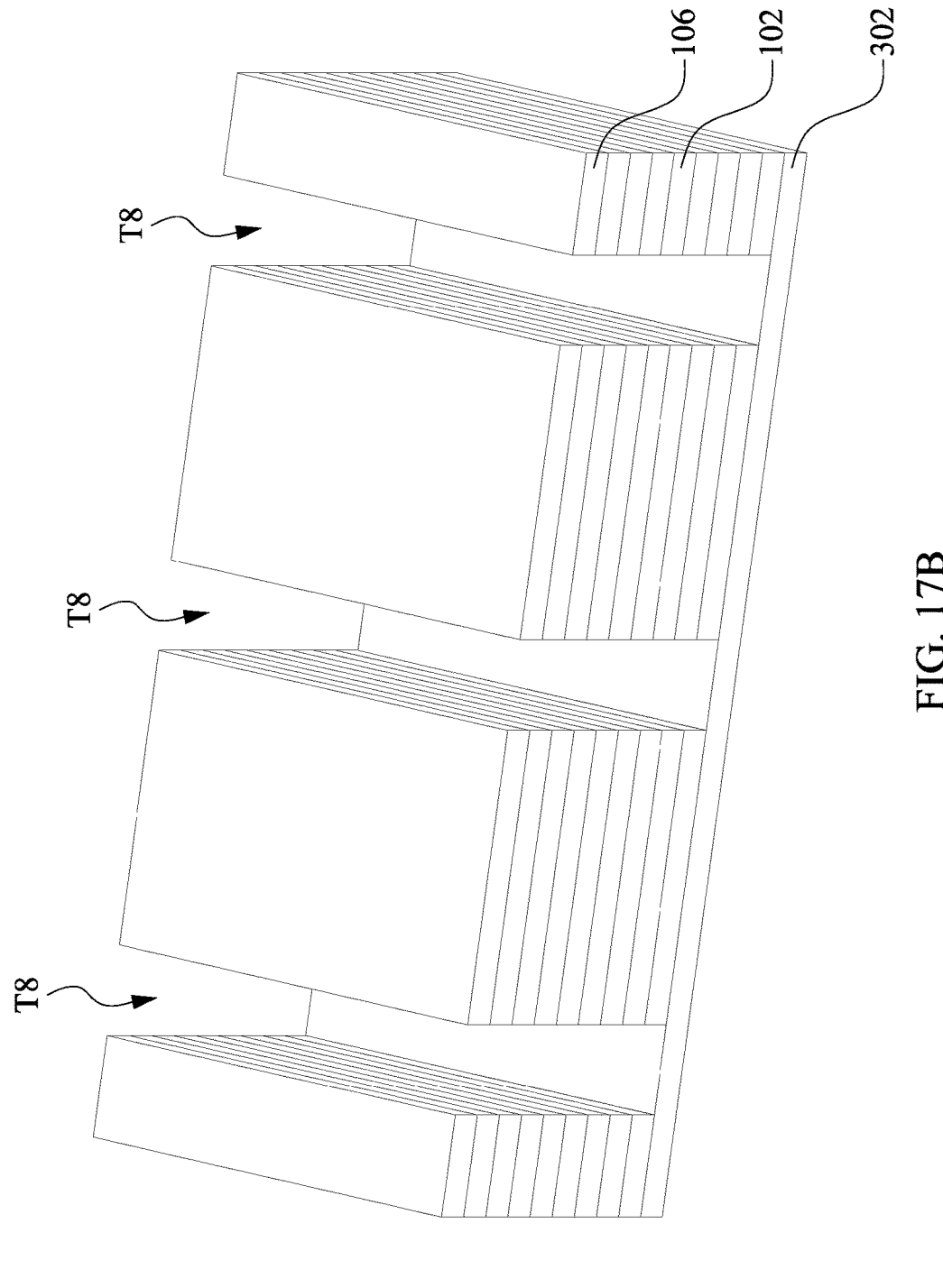

Referring to FIG. 17B, a patterning operation is performed on the isolation layer stack to form a plurality of trenches T8. The substrate 302 is exposed through the trenches T8 accordingly. The etching operation may include a dry etch, a wet etch, an RIE or the like. Through the patterning operation, the sidewalls of the isolation layers 102 and 106 are aligned with each other in the trenches T8.

Figure 17C:
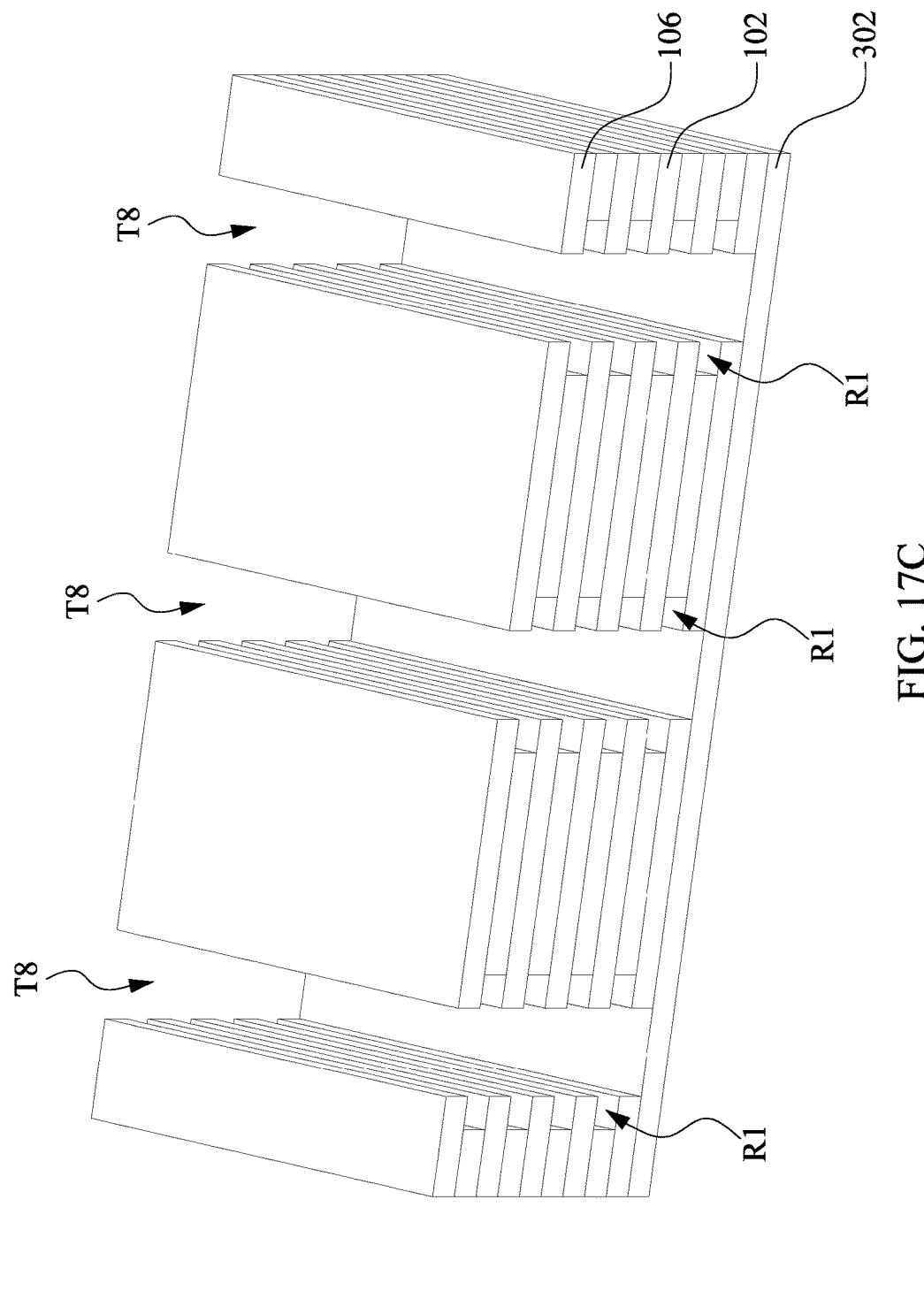

Referring to FIG. 17C, another etching operation is performed to etch portions of the isolation layers 106 through the trenches T8. As a result, the sidewalls of the isolation layers 106 are indented from the sidewalls of the isolation layers 102. In some embodiments, the etching of the indented isolation layers 106 include a wet etch.

Figure 17D:
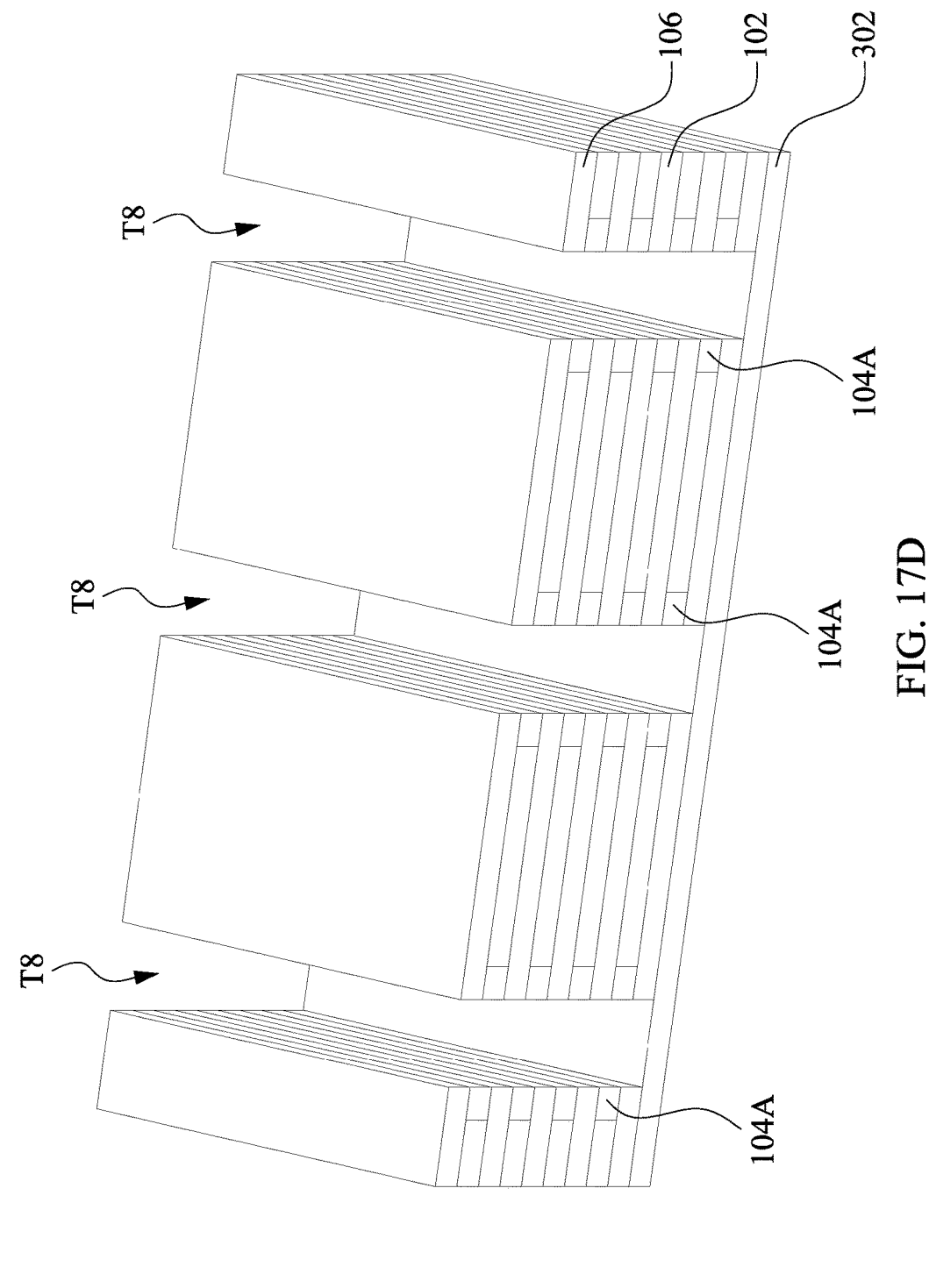

FIG. 17D illustrates the formation of a first plurality of word lines 104, e.g., word lines 104A, on the indented sidewalls of the isolation layers 106 between the isolation layers 102. The word lines 104A may fill the etched portions of the isolation layer 106 such that the sidewalk of the word lines 104A facing the trenches T8 are aligned with the sidewalls of the isolation layers 102.

Figure 17E:
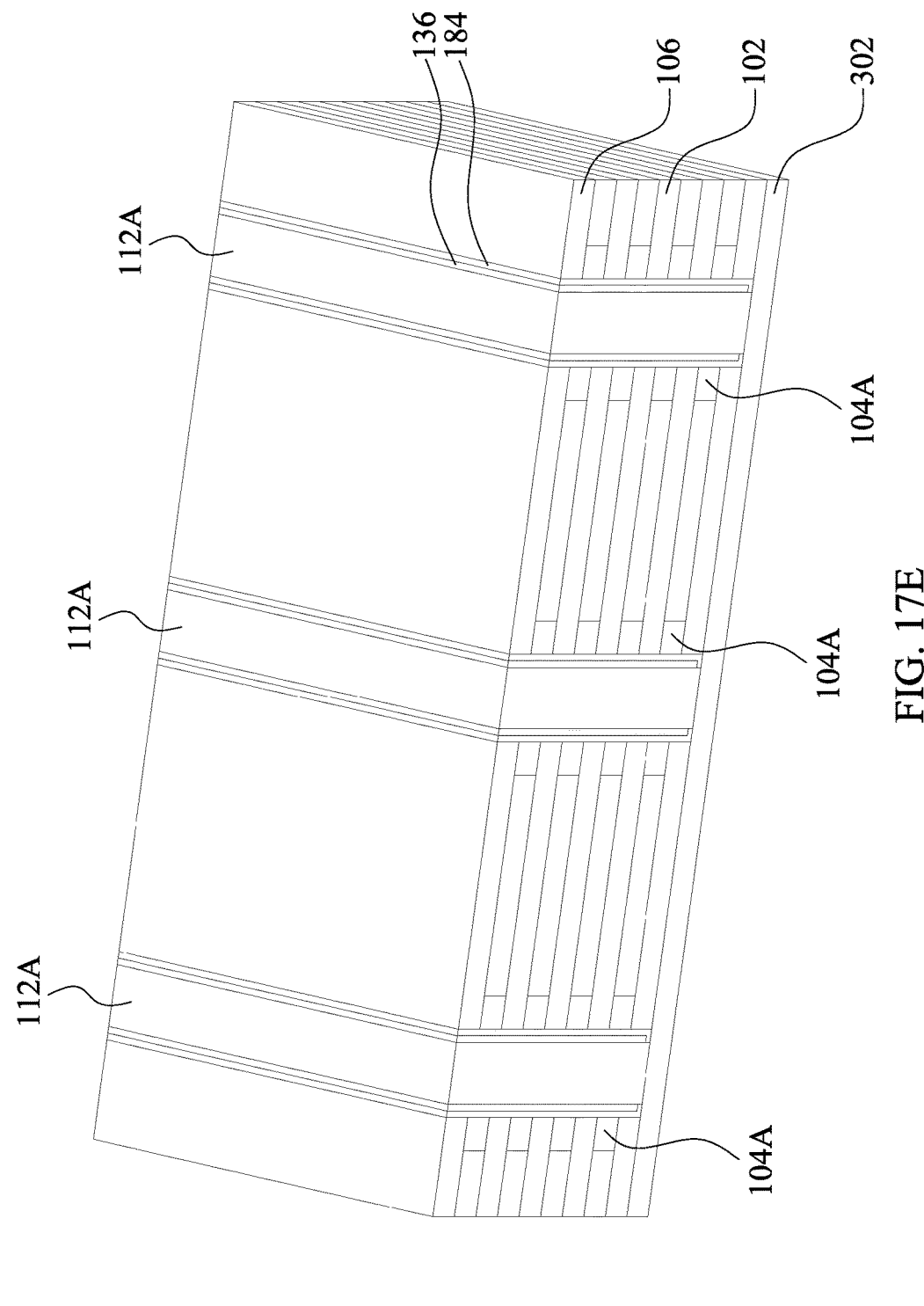

Referring to FIG. 17E, a data storage layer 184, a channel layer 136 and an isolation region 142 are successively formed in the trenches T8. The materials, configuration and method of forming of the data storage layer 184, the channel layer 136 and the isolation region 142 are similar to those described with reference to FIGS. 2B and 3B. In some embodiments, a planarization operation, e.g., CMP, is performed to remove the excess materials of the isolation region 142, and level the surface of the isolation region 142 with the data storage layer 184 and channel layer 136.

Figure 17F:
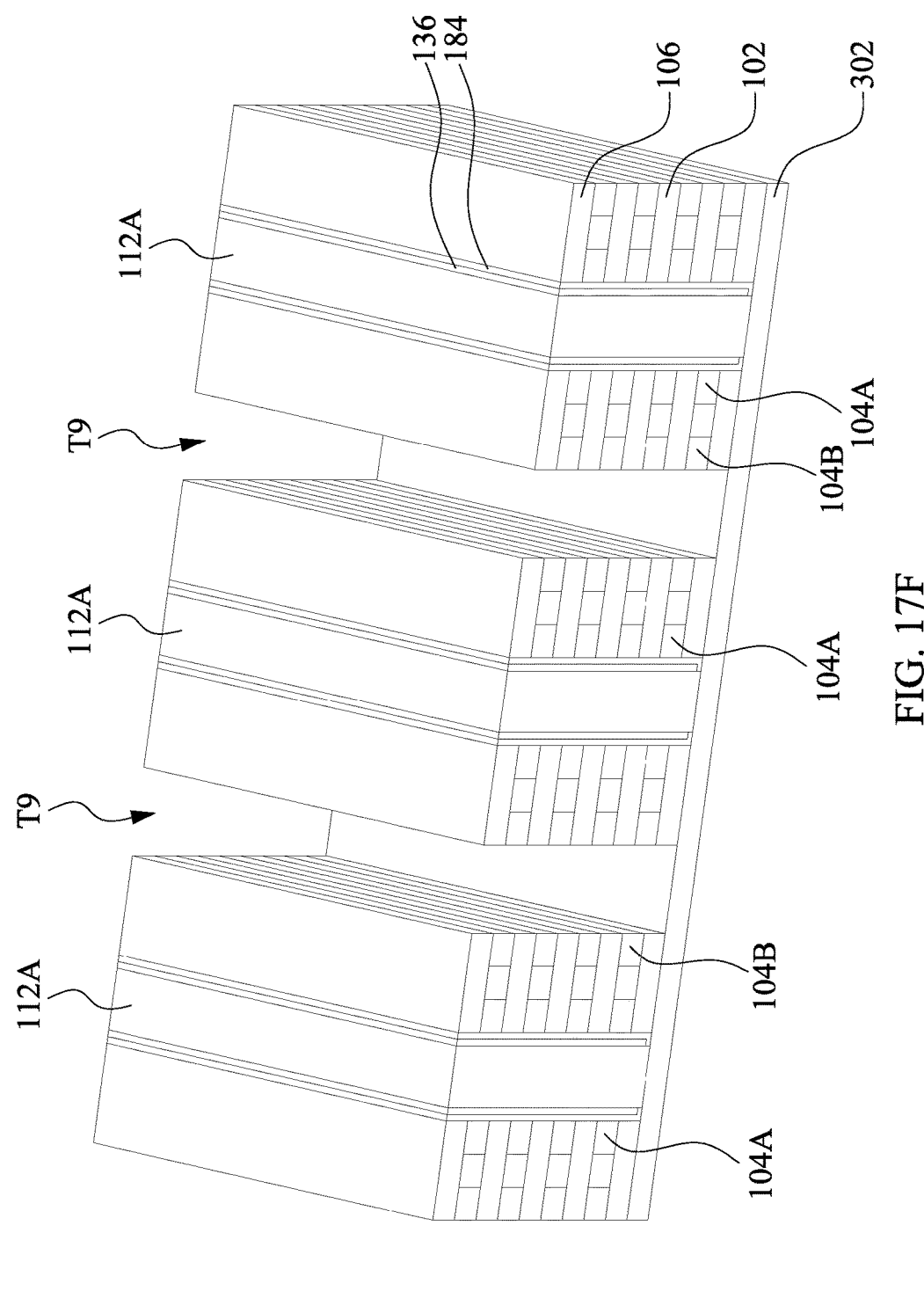

Referring to FIG. 17F, a patterning operation is performed on the isolation layer stack to form a plurality of trenches T9 between the trenches T8. The substrate 302 is exposed through the trenches T9 accordingly. The etching operation may include a dry etch, a wet etch, an RIE or the like. Through the patterning operation, the sidewalls of the isolation layers 102 and 106 are aligned with each other in the trenches T9. Another etching operation is performed to etch portions of the isolation layers 106 through the trenches T9. As a result, the sidewalls of the isolation layers 106 are indented from the sidewalls of the isolation layers 102 in the trenches T9. Subsequently, a second plurality of word lines 104, e.g., word lines 104B, are formed on the indented sidewalls of the isolation layers 106 between the word lines 104A. The word lines 104B may fill the etched portions of the isolation layer 106 such that the sidewalls of the word lines 104B facing the trenches T9 are aligned with the sidewalls of the isolation layers 102.

Figure 17G:
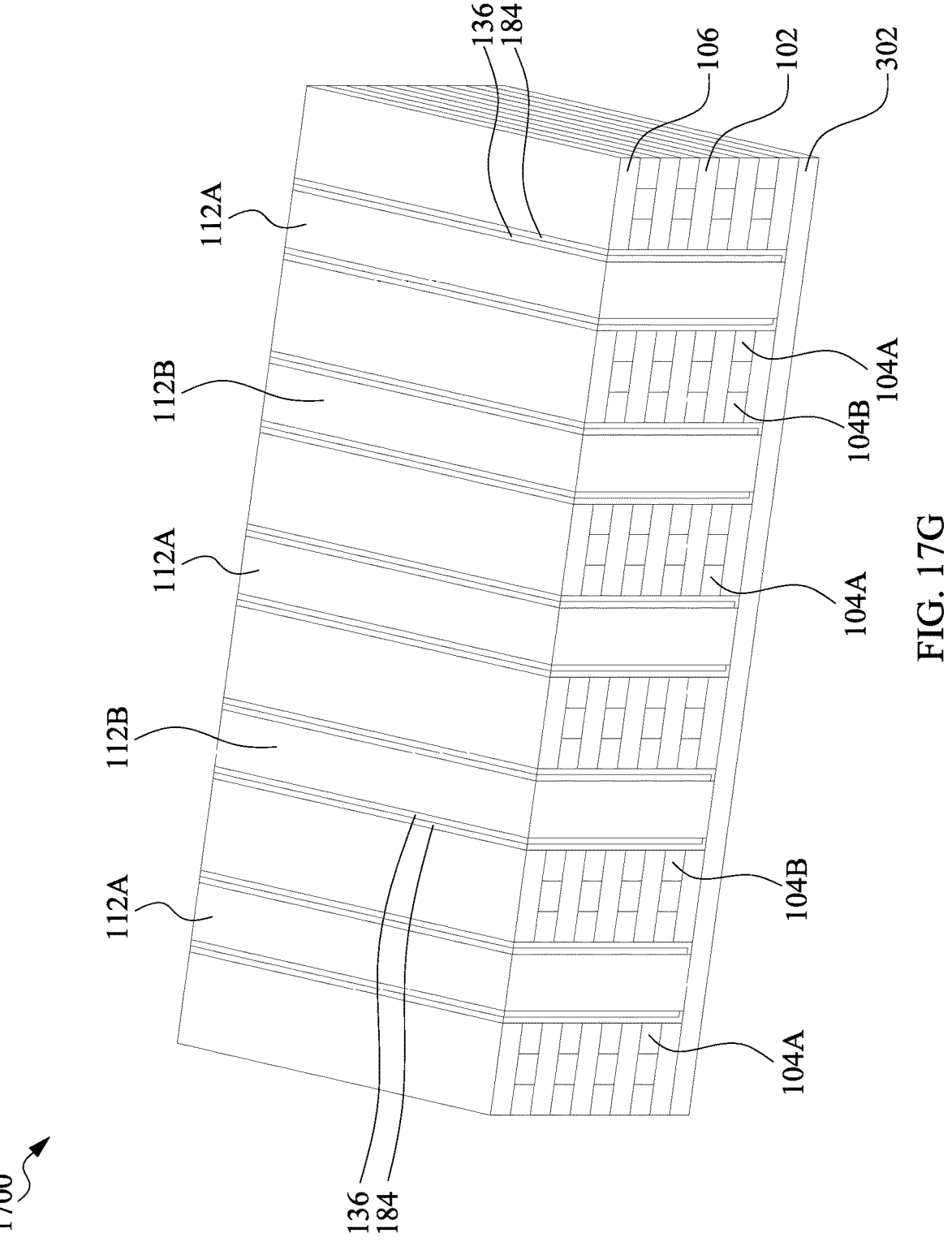

Referring to FIG. 17G, a data storage layer 184, a channel layer 136 and an isolation region 142 are successively formed in the trenches T9. The materials, configuration and method of forming of the data storage layer 184, the channel layer 136 and the isolation region 142 are similar to those described with reference to FIGS. 2B, 3B and 4E.

Figure 17H:
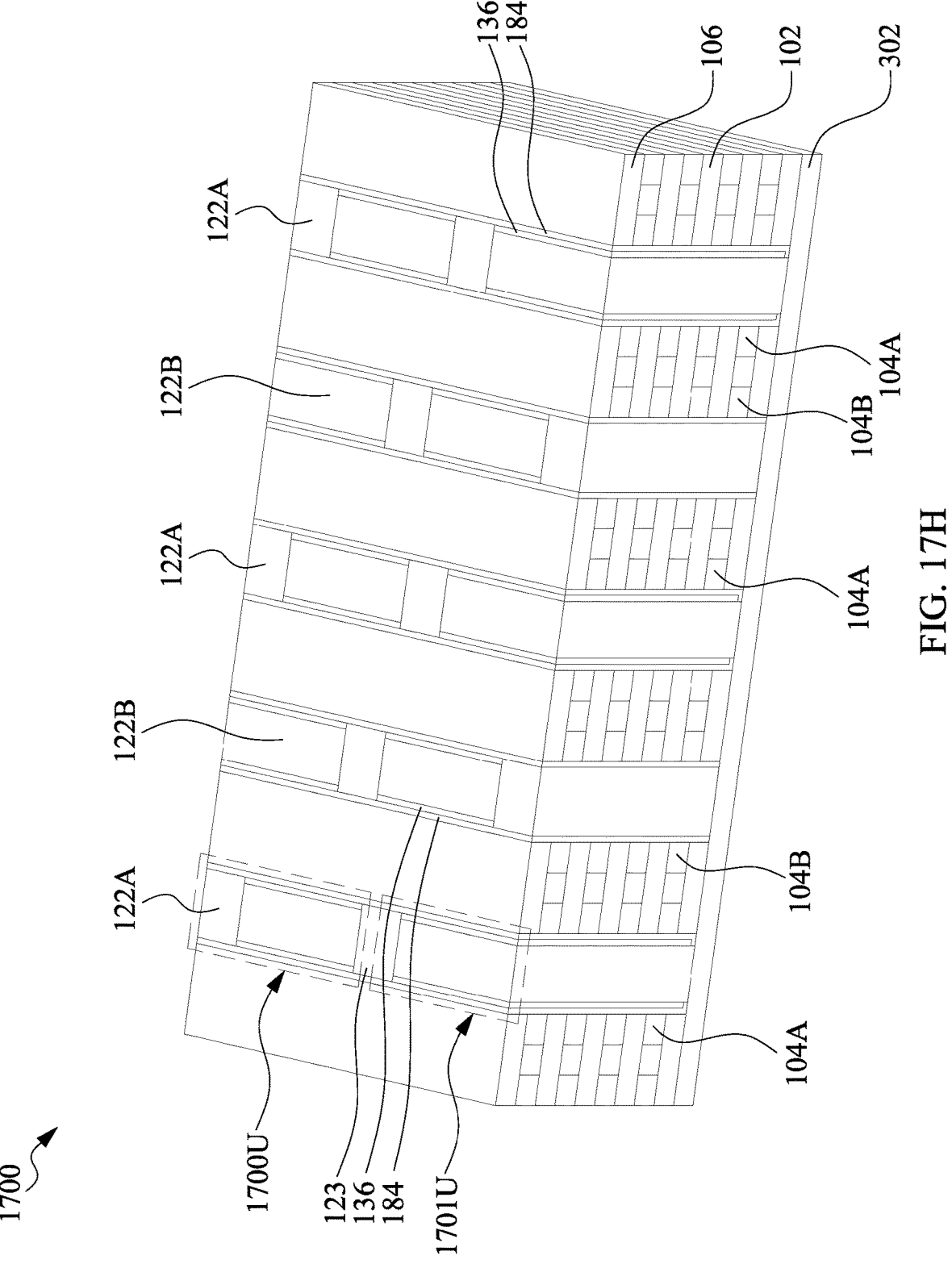

Referring to FIG. 17H, a patterning operation is performed to partition the channel layer 136 into individual channel layers 136. Each of the memory units, e.g., memory units 1700U and 1701U, in the memory device 1700 has a respective channel layer 136 separate from adjacent channel layers 136. Portions of the channel layer 136 are removed and replaced by isolation regions 123. As illustrated in FIG. 17H, the isolation regions 123 serve as the insulating region between adjacent memory units 1700U and 1701U.

Figure 17I:
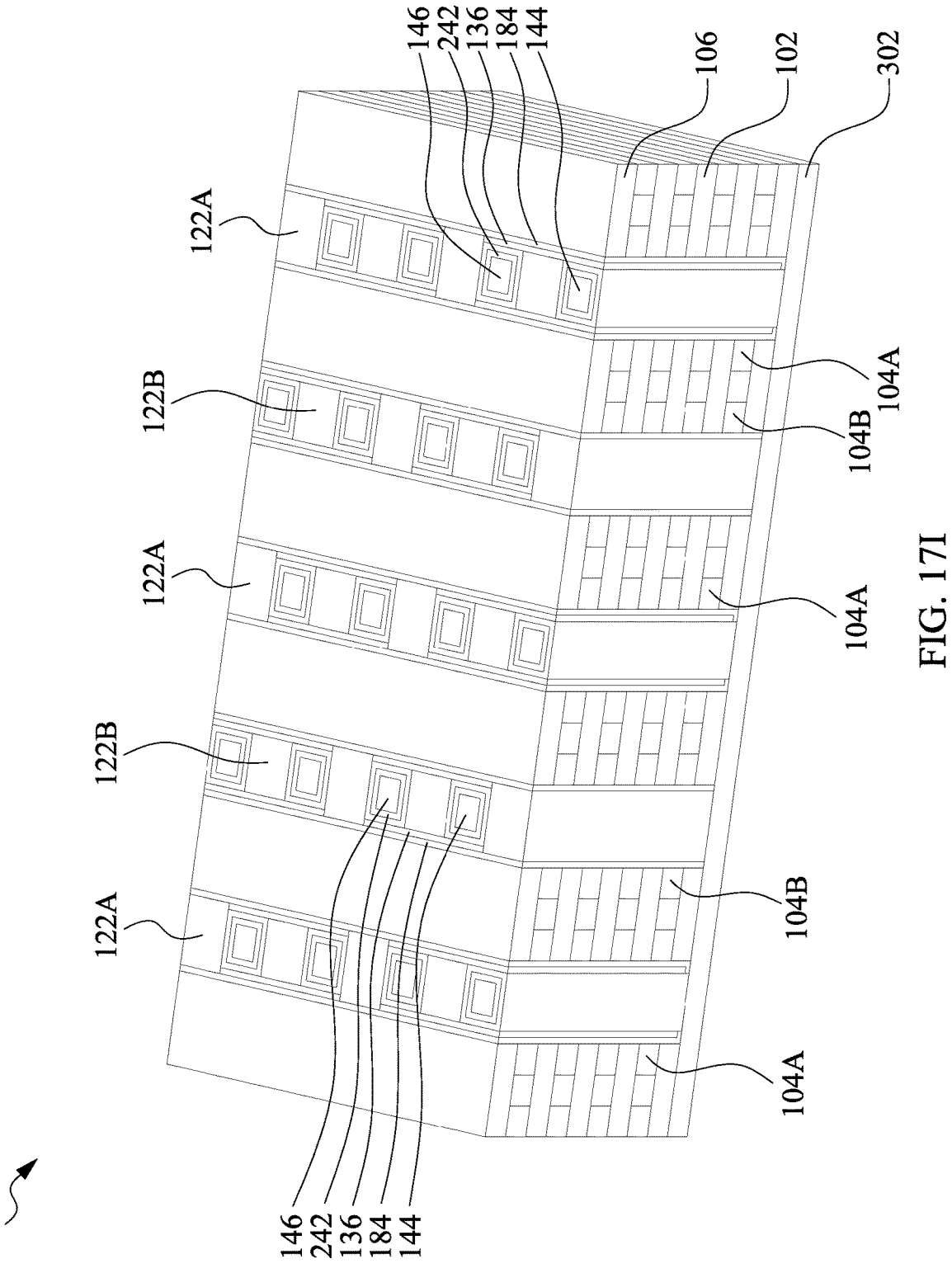
Figure 17J:
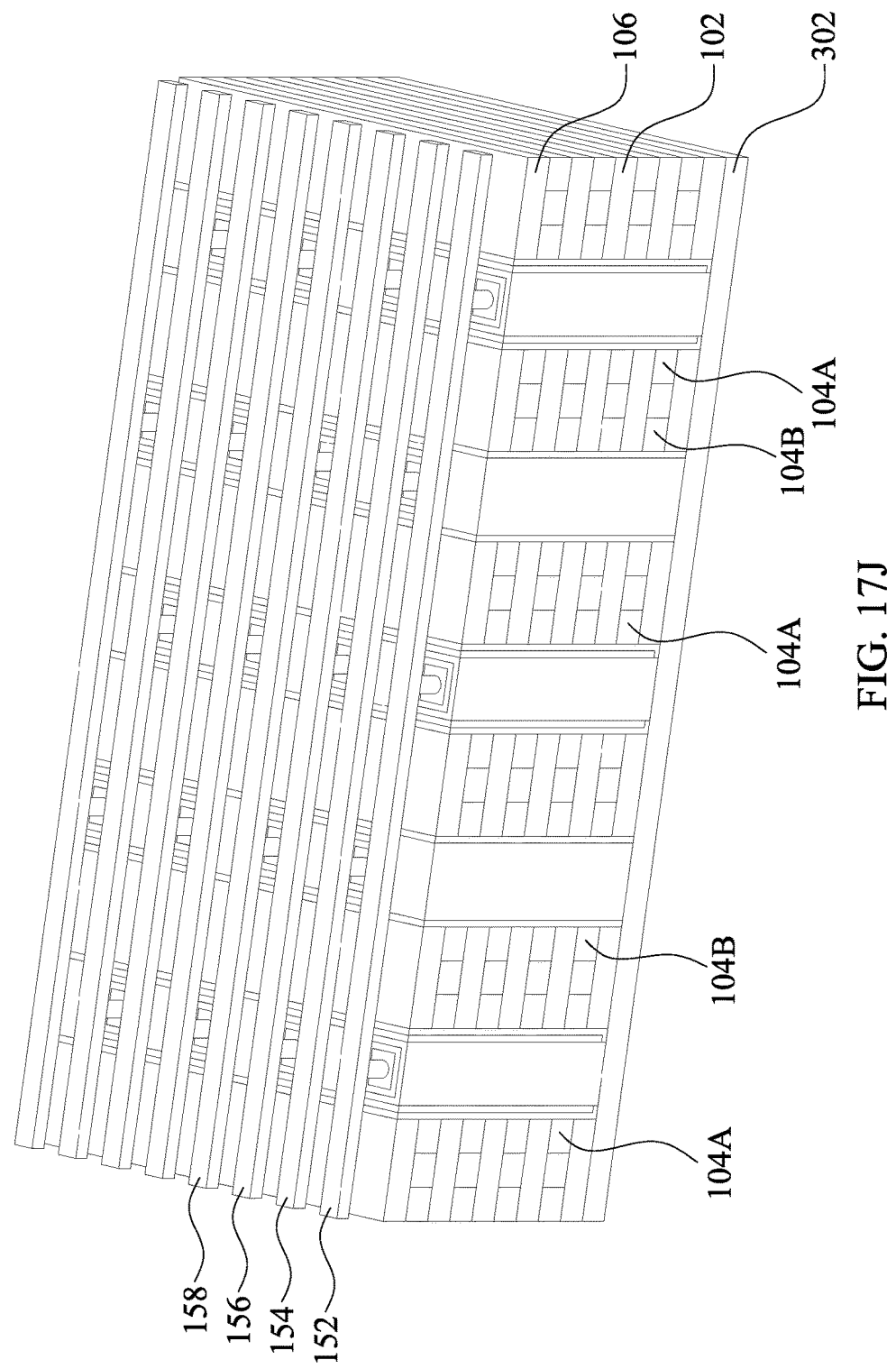

Referring to FIG. 17I, the source line 144, the bit line 146 and interfacial layers 364, 366 are formed in each of the memory unit, e.g., memory unit 1700U. The details of forming the semiconductor structure shown in FIG. 17I are described later with reference to FIGS. 18A to 18D. FIG. 17J illustrates the formation of the conductive vias 152, 156 and conductive lines 154, 158 over the memory device 1700. The materials, configurations, and method of forming of the aforesaid source line 144, bit line 146, conductive vias 152, 156 and conductive lines 154, 158 are similar to those described with reference to FIGS. 2D to 2E and 3D to 3E.

Figure 18B:
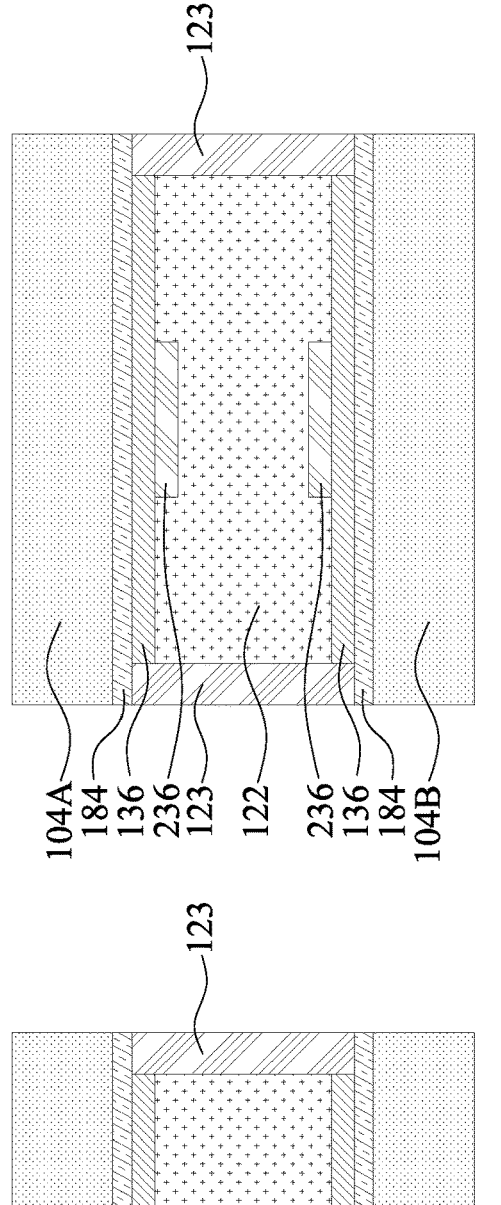
FIGS. 18A to 18D are plan views of intermediate stages of a method of forming the semiconductor structure shown in FIG. 17I, in accordance with some embodiments of the present disclosure.
Figure 18A:
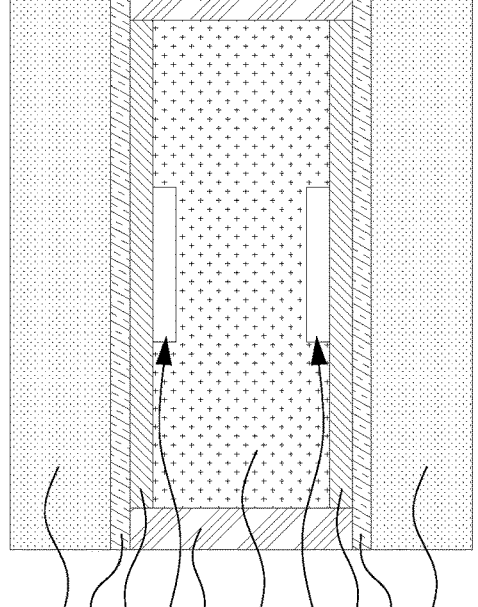

FIGS. 18A to 18D are plan views of intermediate stages of forming the semiconductor structure shown in FIG. 17I, in accordance with some embodiments of the present disclosure Referring to FIG. 18A, the isolation layer 122 is patterned to form trenches T10 along a side of each of the channel layers 136. The length of the trench T10 is less than the length of the channel layer 136 so that the isolation layer 122 includes portions covering the channel layer 136.

Referring to FIG. 18B, buffer regions 326 are formed in the trenches T10. The buffer regions 326 are formed of dielectric materials, such as silicon oxide, silicon nitride, silicon oxynitride, or high-k dielectric materials. In some embodiments, the material of the buffer region 326 is different from the isolation layer 122.

Figures 18C, 18D:
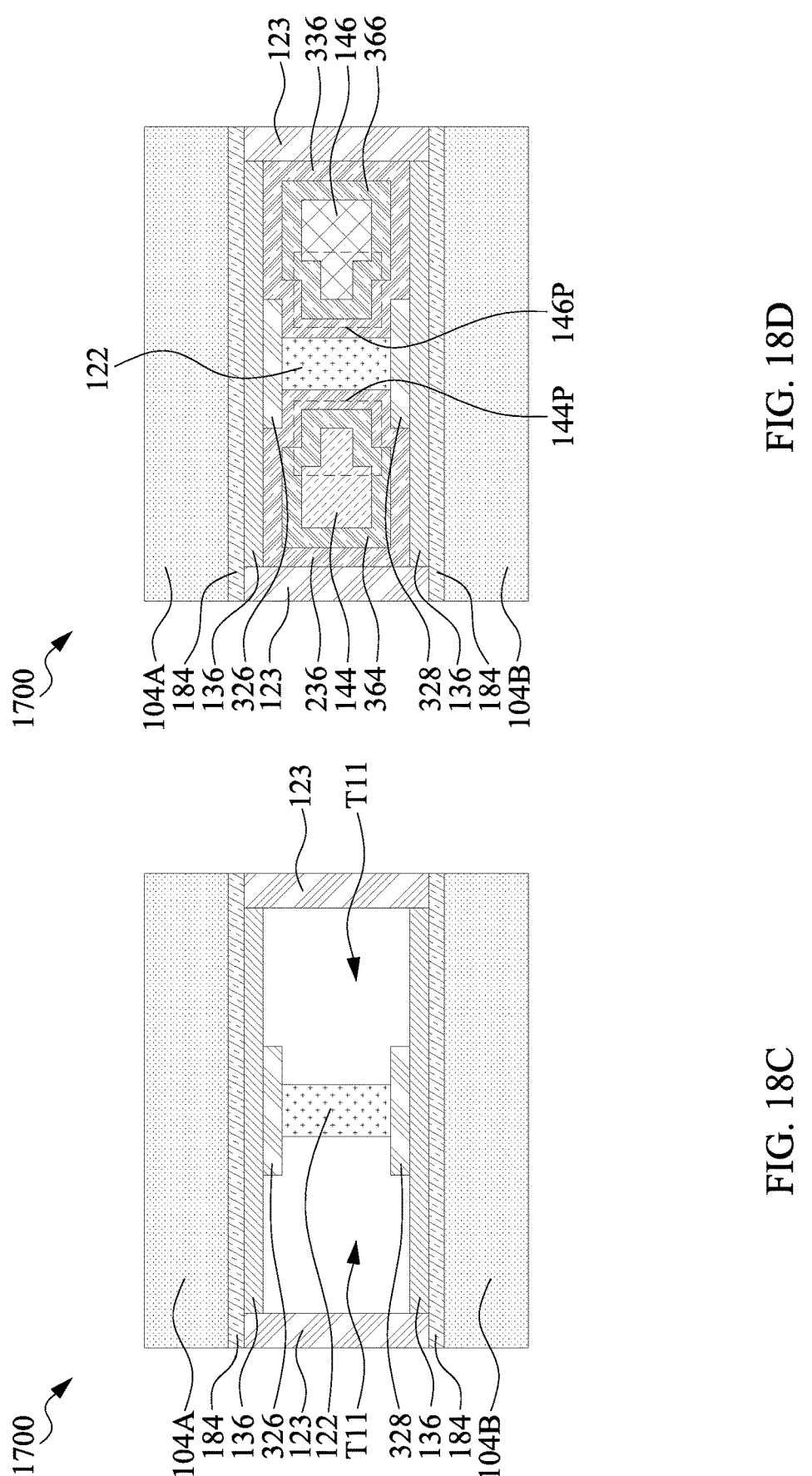

Referring to FIG. 18C, the isolation layer 122 is further patterned to form trenches T11. Through the patterning operation, each of the memory units includes two trenches T11 separated by the remaining isolation layer 122 and corresponding to the subsequently formed source line 144 and bit line 146.

Referring to FIG. 18D, another channel layer 236 or 336 is deposited on the side-walls of the trenches T11. The channel layers 236 and 336 are deposited in a conformal manner on the sidewalk of the trenches T11 and connected to the channel layer 136 to form an extended channel later. The materials and method of forming of the channel layers 236, 336 may be similar to those of the channel layer 136. Once the channel layers 236, 336 are deposited, the conductive materials of the source line 146 and the bit line 146 are deposited in the trenches T11 on the sidewalk of the channel layers 236, 336. In some embodiments, interfacial layers 364, 366 are formed between the source line 144 and the channel layer 236 or between the bit line 146 and the channel layer 336. The interfacial layers 364, 366 may be formed of the same materials of the channel layers 236, 336, but include a doping concentration greater than the doping concentration of the channel layers 236, 336. The arrangement of the interfacial layers 364, 366 may aid in reduce the contact resistance at the interface between the source line 144/bit line 146 and the channel layers 236, 336. Therefore, the interfacial layers 364, 366 may also be referred to as resistance reduction layers.

The memory device 1700 provides advantages. Through the arrangement of the I-shaped isolation feature formed of the buffer regions 326 and the isolation layer 122, the source line 144 (or the bit line 146) is formed as including a base part and a protrusion 144P (or 146P), where the protrusions 144P and 146P face the isolation layer 122 and face each other. In this way, since the protrusions 144P and 146P have a greater spacing with the word line 104A or 104B than the base parts of the source line 144 or the bit line 146 but are also closer to each other than the base parts of the source line 144 and the bit line 146, the control capability of the memory device 1700 on the channel layers 136, 236 and 336 can be enhanced without significantly increasing the short channel effect. The performance of the memory device 1700 can be improved.

Figures 19A, 19B:
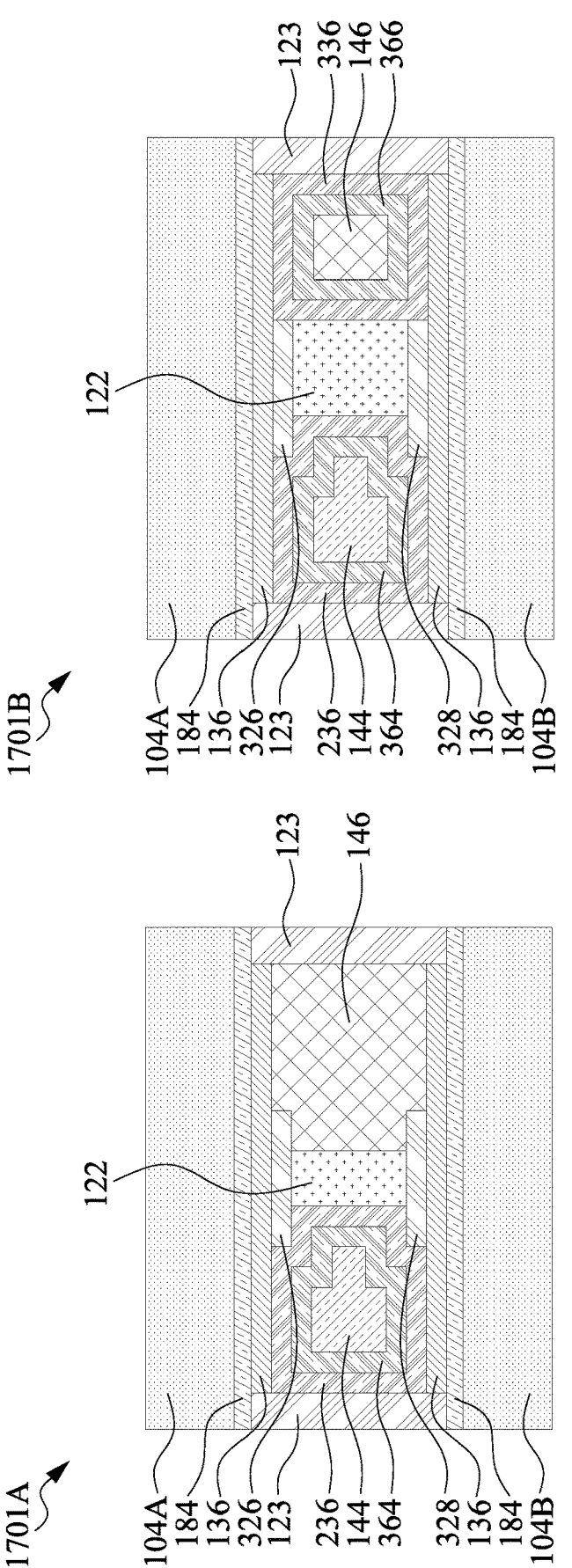
FIGS. 19A to 19D are plan views of various memory devices, in accordance with some embodiments of the present disclosure.
Figures 19C, 19D:
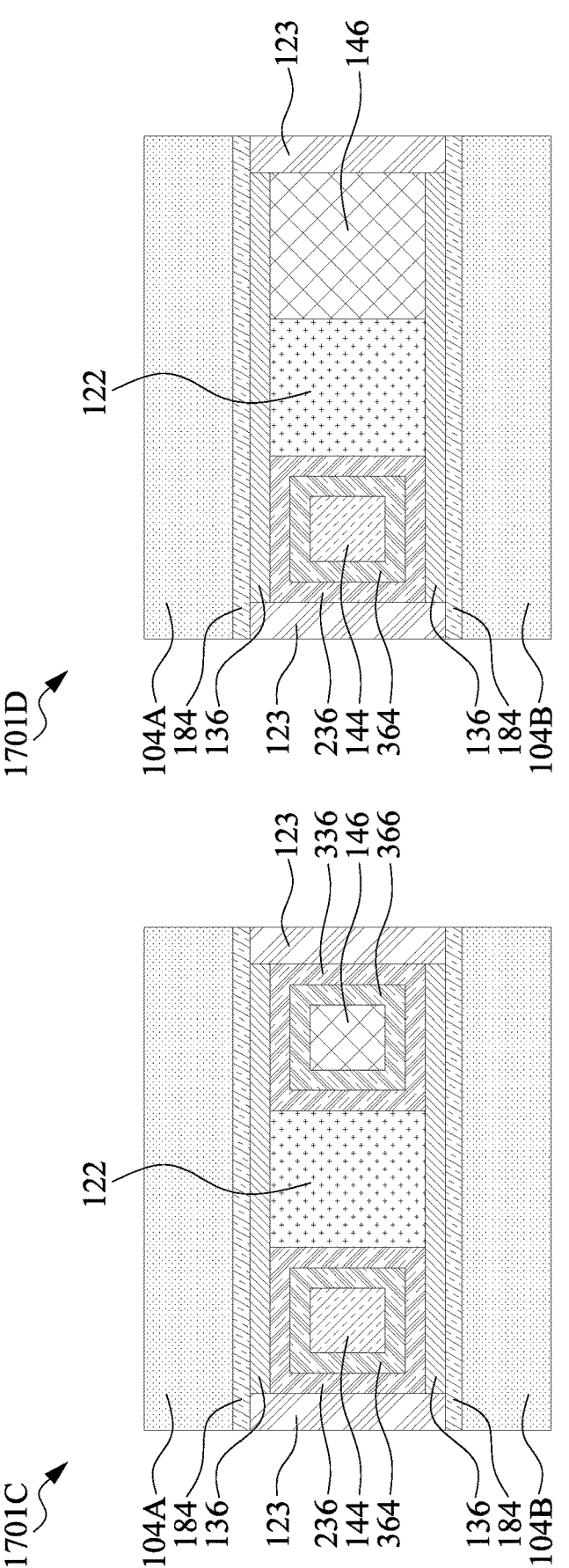

FIGS. 19A to 19D are plan views of various memory devices 1701A to 1701D, in accordance with some embodiments of the present disclosure. In the variants shown in the memory devices 1701A through 1701D, one or more features are absent from the memory device 1700 to provide design flexibility and save cost. For example, referring to FIG. 19A, the channel layer 336 and the interfacial layer 366 are absent from the bit line 146. Referring to FIG. 19B, one end of the buffer region 326 is flush with one side of the isolation layer 122, and therefore only one of the source line 144 and the bit line 146 includes the protrusion 144P or 146P. FIG. 19C illustrates another variant of the memory device 1700 that both of the buffer regions 326 are absent, and thus the protrusions 144P and 146P are removed from the source line 144 and the bit line 146, respectively. Referring to FIG. 19D, the structure of the memory device 1701D can be seen as a combination of memory devices 1901A and 1901C, in which the interfacial layer 366, and the buffer regions 326 are removed. The embodiments shown in FIGS. 19A to 19D are only some examples, and other modifications and variants may be possible, e.g., the interfacial layers 364, 366 are removed from the memory device 1700, while other features are kept unchanged.

According to an embodiment, a method includes: forming an interconnect structure over a substrate, the forming of the interconnect structure includes forming a memory device including a transistor. The forming of the interconnect structure includes: forming a first metallization layer and a second metallization layer over the first metallization layer; forming a gate region of the transistor in at least one of the first metallization layer and the second metallization layer; etching a trench disposed in the second metallization layer and exposing the gate region; depositing a gate dielectric layer in the trench over the gate region; depositing a channel layer in the trench over the gate dielectric layer; and forming two source/drain regions of the transistor over the channel layer on opposite sides of the trench. At least one of the gate region and the channel layer includes two first segments extending in the trench, wherein the first segments are parallel with each other.

According to an embodiment, a method includes: forming an interconnect structure over a substrate, the forming of the interconnect structure including forming a memory device having a transistor. The forming of the memory device includes: forming a gate region of the transistor in a first metallization layer of the interconnect structure; etching a trench in a second metallization layer of the interconnect structure to expose a surface of the gate region; depositing a data storage layer to cover the exposed surface of the gate region; depositing a first channel layer in the trench and on one side of the data storage layer opposite to the gate region; and forming two source/drain regions of the transistor in the trench, the two source/drain regions laterally surrounded by the first channel layer.

According to an embodiment, a semiconductor structure includes: an interconnect structure disposed over a substrate and including a memory device including a transistor. The transistor includes: a gate region in at least one of a first metallization layer and a second metallization layer of the interconnect structure; a control layer including one of a gate dielectric layer or a data storage layer over the gate region; a channel layer over the control layer; and two source/drain regions of the transistor over the channel layer on opposite sides of the gate region. At least one of the gate region and the channel layer has two segments parallel with each other and perpendicular to a bottom surface of the gate region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

forming an interconnect structure over a substrate, the forming of the interconnect structure comprising forming a memory device including a transistor, comprising:

forming a first metallization layer and a second metallization layer over the first metallization layer, wherein the second metallization layer comprises an isolation layer;

forming a gate region of the transistor in at least one of the first metallization layer and the second metallization layer;

etching the isolation layer to form a trench disposed in the second metallization layer and exposing the gate region;

depositing a gate dielectric layer in the trench over the gate region;

depositing a channel layer in the trench over the gate dielectric layer; and forming two source/drain regions of the transistor over the channel layer on opposite sides of the trench, wherein at least one of the gate region and the channel layer comprises two first segments extending in the trench, wherein the first segments are parallel with each other, wherein the two source/drain regions are disposed within the trench and laterally surrounded by the isolation layer, and top surfaces of the two source/drain regions are substantially level with a top surface of the isolation layer.

2. The method according to claim 1, wherein the forming of the interconnect structure further comprises forming a third metallization layer over the second metallization layer, wherein the forming of the memory device further comprises forming a capacitor in the third metallization layer to be electrically coupled to the transistor.

3. The method according to claim 1, wherein the forming of the memory device further comprises depositing a data storage layer between the channel layer and one of two the source/drain regions.

4. The method according to claim 1, wherein the gate region extends in the first metallization layer and the second metallization layer.

5. The method according to claim 4, wherein the gate region further comprises two second segments in the trench over the first segments and parallel with each other.

6. The method according to claim 1, wherein the first segments extend in a direction perpendicular to a bottom surface of the gate region.

7. The method according to claim 1, wherein the gate region comprises a first portion in the first metallization layer and a second portion in the second metallization layer, wherein the second portion comprises a horizontal segment connecting the two first segments.

8. The method according to claim 1, wherein the first segments are included in the gate region and laterally surround the channel layer.

9. The method according to claim 1, wherein the two first segments are included in the channel layer and are arranged on outer sidewalls of the two source/drain regions.

10. The method according to claim 9, wherein the channel layer further comprises a horizontal segment connecting the two first segments, wherein the horizontal segment has a doping concentration less than that of the first segments.

11. The method according to claim 1, wherein the two first segments are included in the channel layer, and are directly below the two source/drain regions.

12. The method according to claim 1, wherein the two first segments are included in the channel layer, wherein the gate dielectric layer further comprises two second segments laterally surround the two first segments.

13. A method, comprising:

forming an interconnect structure over a substrate, the forming of the interconnect structure comprising forming a memory device including a transistor, the forming of the memory device comprising:

forming a gate region of the transistor in a first metallization layer of the interconnect structure;

forming a second metallization layer comprising a first isolation layer over the first metallization layer;

etching the first isolation layer to form a trench in the second metallization layer of the interconnect structure to expose a surface of the gate region;

depositing a data storage layer to cover the exposed surface of the gate region;

depositing a first channel layer in the trench and on one side of the data storage layer opposite to the gate region; and forming two source/drain regions of the transistor within the trench, wherein the two source/drain regions are laterally surrounded by the first isolation layer, and top surfaces of the two source/drain regions are substantially level with a top surface of the first isolation layer and a top surface of the first channel layer.

14. The method according to claim 13, wherein the forming of the interconnect structure comprises depositing a second isolation layer to fill the trench subsequent to the depositing of the first channel layer, wherein the forming of the memory device further comprises patterning the second isolation layer to form an opening on one side of the first channel layer and depositing a buffer region in the opening.

15. The method according to claim 14, wherein the forming of the memory device further comprises depositing a second channel layer and a third channel layer on the first channel layer, the second channel layer and the third channel layer separated by the second isolation layer.

16. The method according to claim 13, wherein at least one of the source/drain regions comprises a protrusion facing the other of the source/drain regions.

17. A method, comprising:

forming an interconnect structure over a substrate, the forming of the interconnect structure comprising forming a memory device including a transistor, the forming of the memory device comprising:

forming a gate region in at least one of a first metallization layer and a second metallization layer over the first metallization layer, wherein the second metallization layer comprises a first isolation layer;

etching the first isolation layer to form a trench in the second metallization layer and exposing the gate region;

forming a control layer comprising one of a gate dielectric layer or a data storage layer over the gate region in the trench;

forming a channel layer in the trench and over the control layer;

forming an isolation region over the channel layer;

partially removing the isolation region to form a patterned isolation region;

forming two source/drain regions of the transistor over the channel layer on opposite sides of the gate region and separated from each other by the patterned isolation region after partially removing the isolation region; and performing a planarization operation to level top surfaces of the two source/drain regions with a top surface of the patterned isolation region, wherein at least one of the gate region and the channel layer comprises two segments parallel with each other and perpendicular to a bottom surface of the gate region, wherein the two source/drain regions are disposed within the trench and laterally surrounded by the first isolation layer.

18. The method of claim 17, wherein the two segments are included in the channel layer and laterally surround outer sidewalls of the source/drain regions.

19. The method of claim 17, further comprising forming a third source/drain regions between the two source/drain regions, wherein the memory device comprises two memory units sharing the third source/drain region and the channel layer.

* * * * *